United States Patent
van der Meulen

(10) Patent No.: US 8,029,225 B2
(45) Date of Patent: Oct. 4, 2011

(54) STACKED PROCESS MODULES FOR A SEMICONDUCTOR HANDLING SYSTEM

(75) Inventor: Peter van der Meulen, Newburyport, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 5 days.

(21) Appl. No.: 12/206,382

(22) Filed: Sep. 8, 2008

(65) Prior Publication Data

US 2009/0067958 A1 Mar. 12, 2009

Related U.S. Application Data

(63) Continuation of application No. 10/985,839, filed on Nov. 10, 2004, now Pat. No. 7,422,406.

(60) Provisional application No. 60/518,823, filed on Nov. 10, 2003, provisional application No. 60/607,649, filed on Sep. 7, 2004.

(51) Int. Cl.
*B65G 49/07* (2006.01)

(52) U.S. Cl. .................................. 414/217; 414/935

(58) Field of Classification Search ............... 414/217, 414/935
See application file for complete search history.

(56) References Cited

U.S. PATENT DOCUMENTS

| | | | |
|---|---|---|---|
| 5,344,365 A * | 9/1994 | Scott et al. | 454/187 |
| 6,261,048 B1 * | 7/2001 | Muka | 414/416.03 |
| 6,382,895 B1 * | 5/2002 | Konishi et al. | 414/217 |
| 6,391,114 B1 * | 5/2002 | Kirimura | 118/719 |
| 6,471,422 B1 * | 10/2002 | Ueda et al. | 396/611 |
| 6,814,573 B2 * | 11/2004 | Hiramoto | 432/239 |
| 7,351,291 B2 * | 4/2008 | Murakami | 118/719 |
| 2001/0038783 A1 * | 11/2001 | Nakashima et al. | 414/217 |
| 2002/0114690 A1 * | 8/2002 | Ishigame | 414/744.5 |
| 2002/0159864 A1 * | 10/2002 | Lowrance | 414/217 |
| 2008/0206036 A1 * | 8/2008 | Smith et al. | 414/788 |

* cited by examiner

*Primary Examiner* — Charles A Fox
(74) *Attorney, Agent, or Firm* — Perman & Green, LLP; Richard Pickreign

(57) ABSTRACT

Methods and systems are provided for a vacuum-based semiconductor handling system. The system may be a linear system with a four-link robotic SCARA arm for moving materials in the system. The system may include one or more vertically stacked load locks or vertically stacked process modules.

18 Claims, 66 Drawing Sheets

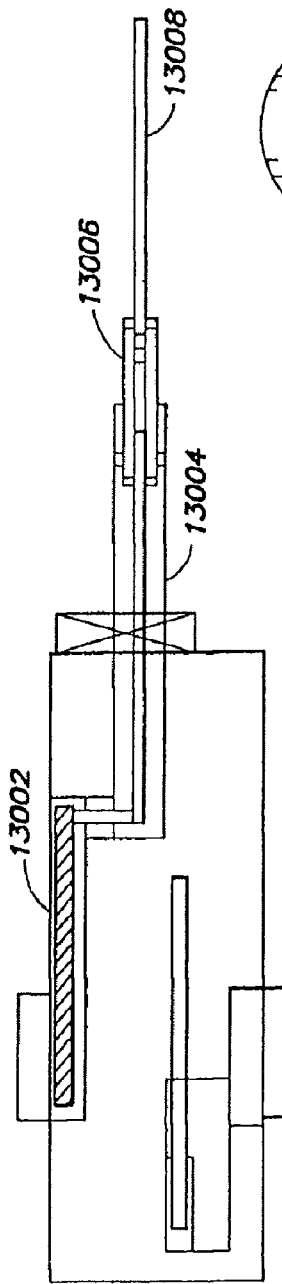
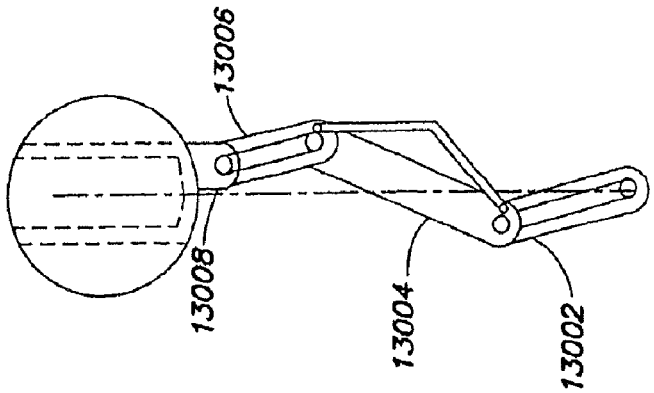
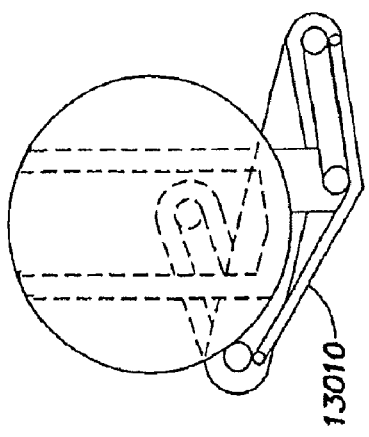
FIG. 13A
FIG. 13B
FIG. 13C

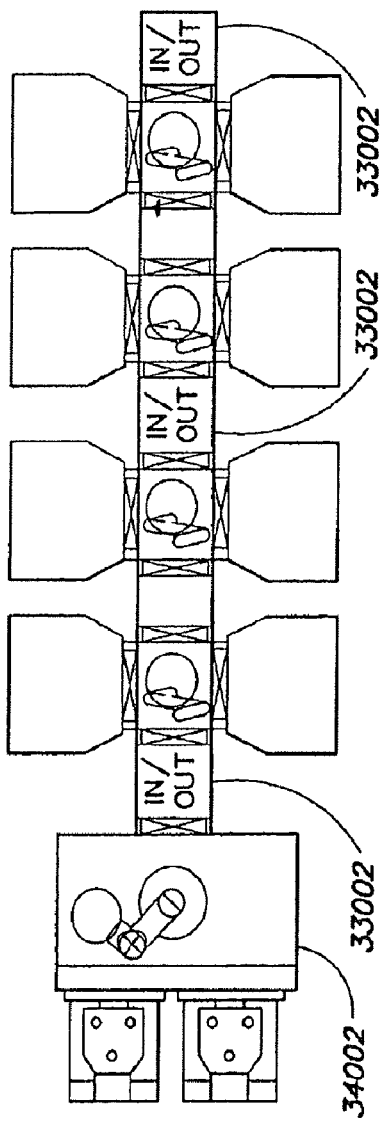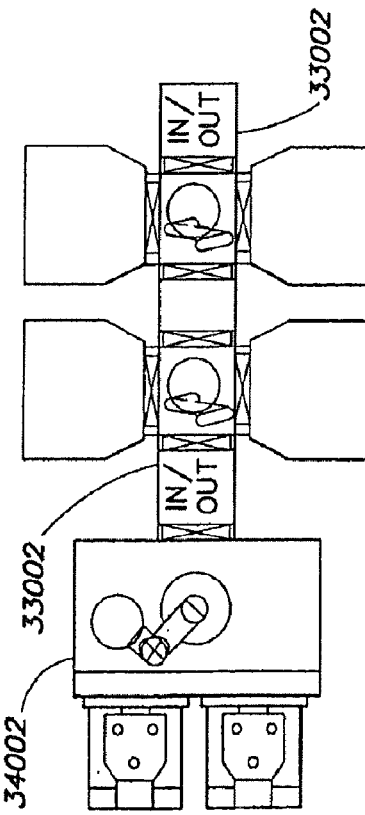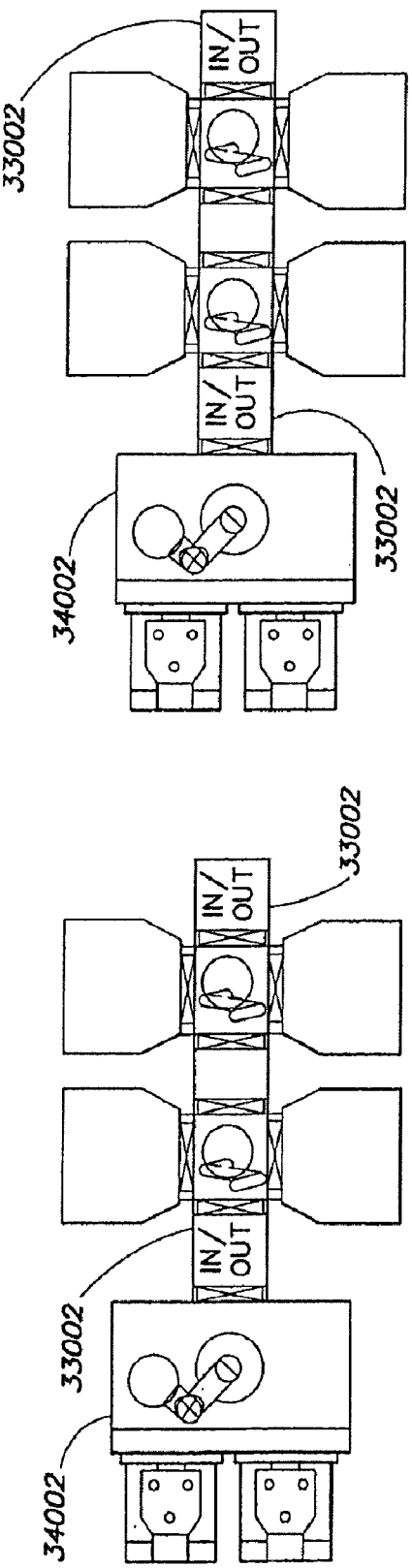
FIG. 34A
FIG. 34B
FIG. 34C

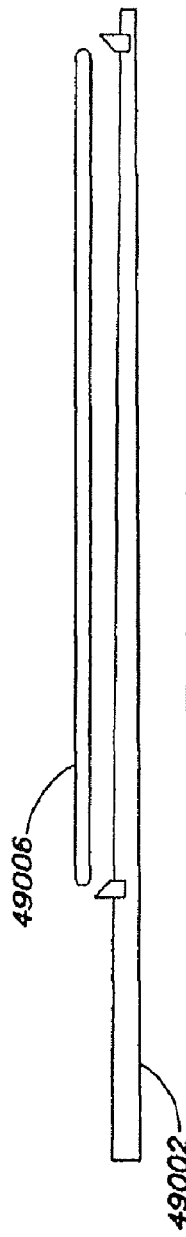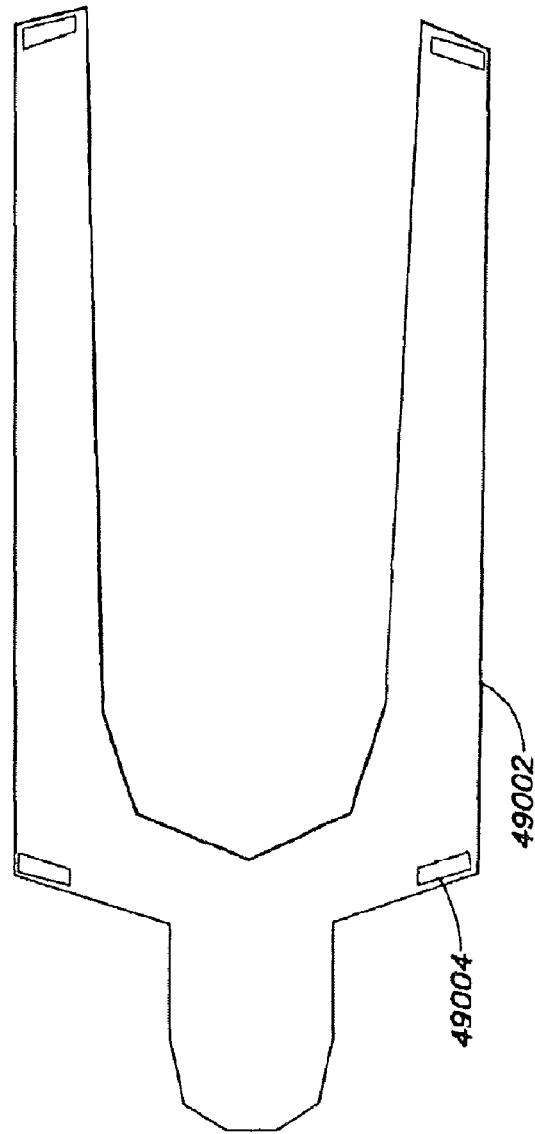
FIG. 49A
FIG. 49B

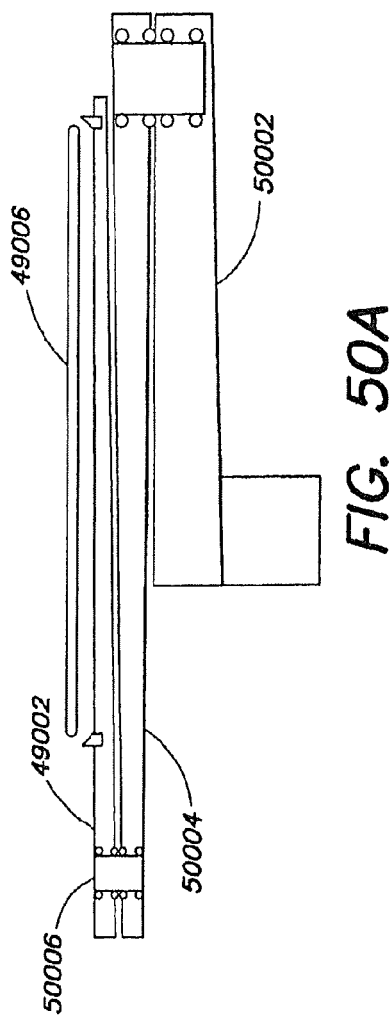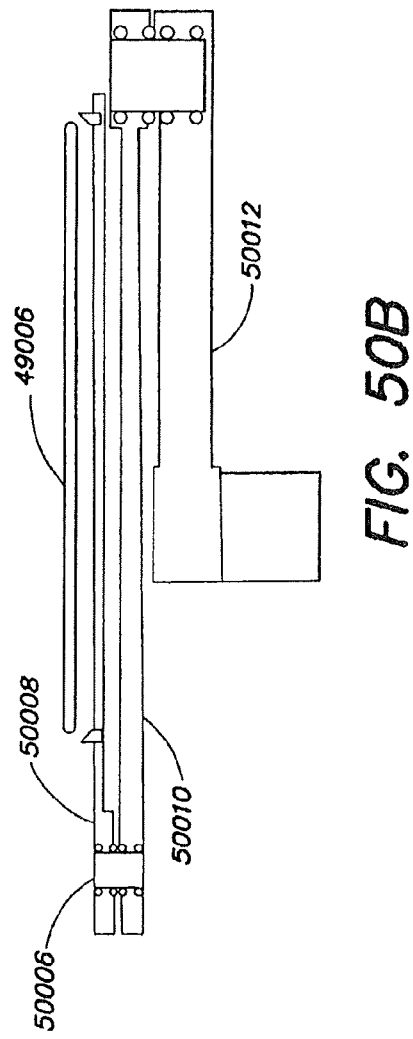

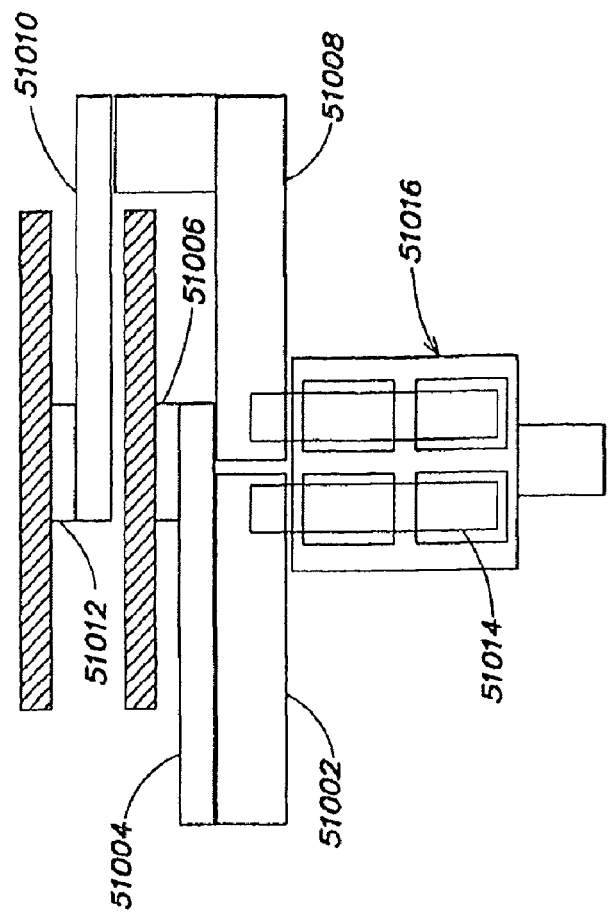
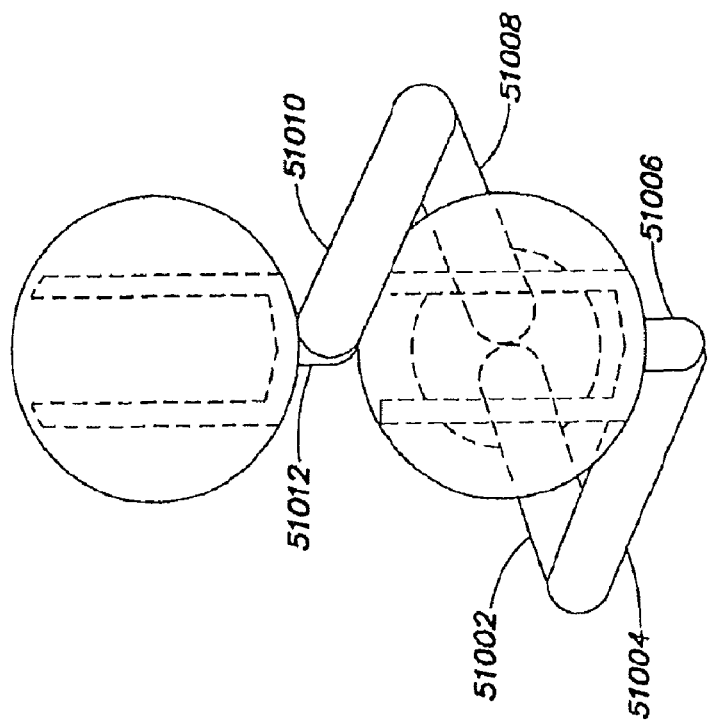
FIG. 51B
FIG. 51A

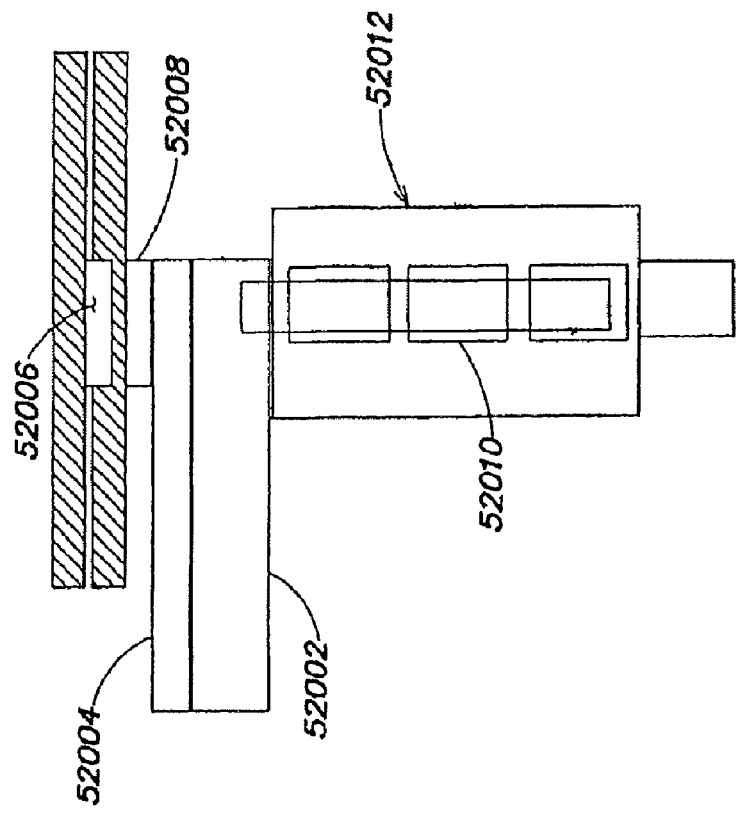
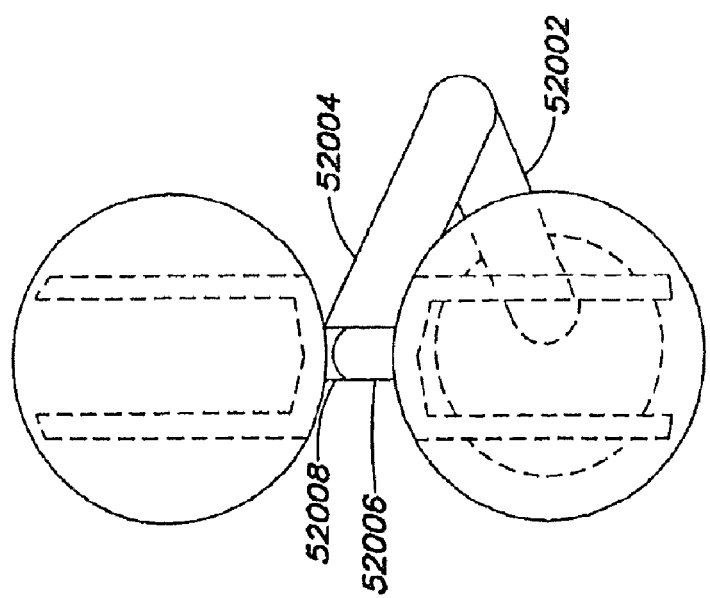
FIG. 52B
FIG. 52A

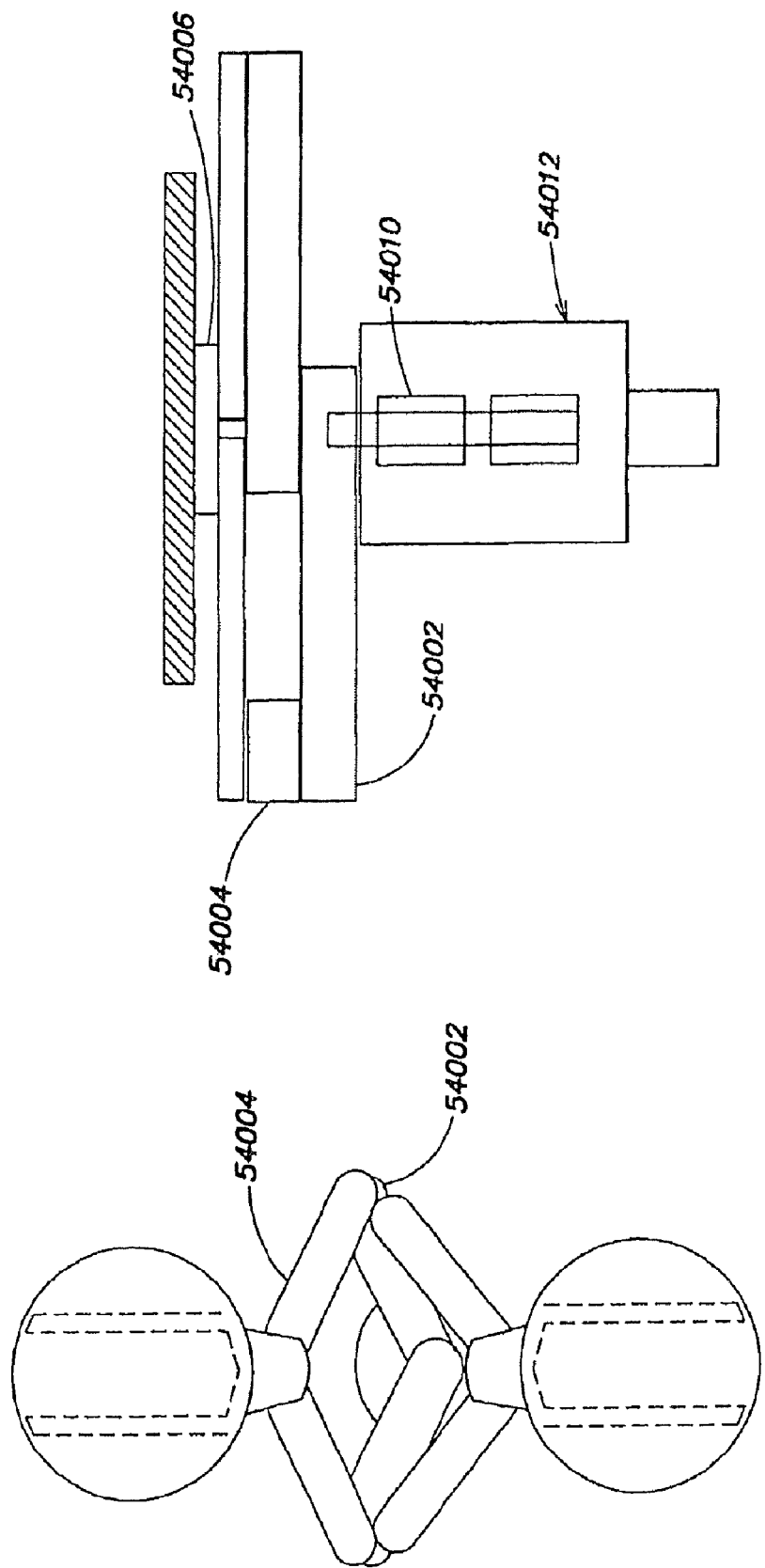

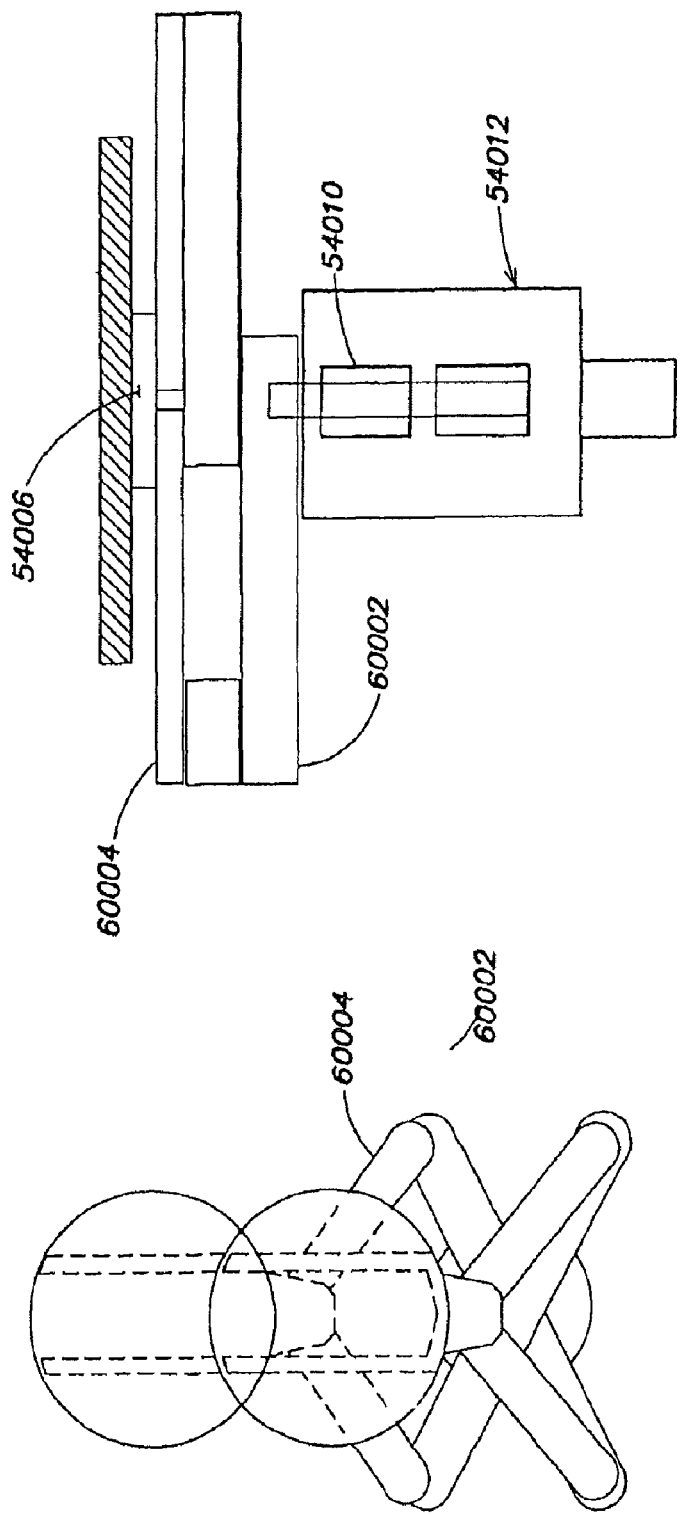

STACKED PROCESS MODULES FOR A SEMICONDUCTOR HANDLING SYSTEM

CROSS-REFERENCE TO RELATED APPLICATIONS

This application is a continuation of the following U.S. patent application:

Ser. No. 10/985,839, filed Nov. 10, 2004, entitled "Stacked Process Modules for a Semiconductor Handling System," which claims the benefit under 35 U.S.C. §119(e) of the following U.S. Provisional Applications:

Ser. No. 60/518,823, filed Nov. 10, 2003, entitled "Methods and Systems for Semiconductor Manufacturing;" and Ser. No. 60/607,649, filed Sep. 7, 2004, entitled "Methods and Systems for Semiconductor Manufacturing."

Each of the foregoing applications is incorporated herein by reference.

BACKGROUND

1. Field of the Invention

This invention relates to the field of semiconductor manufacturing, and more particularly to machines used for material transport in a vacuum handling system.

2. Description of the Related Art

Current semiconductor manufacturing equipment takes several different forms, each of which has significant drawbacks. Cluster tools, machines that arrange a group of semiconductor processing modules radially about a central robotic arm, take up a large amount of space, are relatively slow, and, by virtue of their architecture, are limited to a small number of semiconductor process modules, typically a maximum of about five or six. Linear tools, while offering much greater flexibility and the potential for greater speed than cluster tools, do not fit well with the current infrastructure of most current semiconductor fabrication facilities; moreover, linear motion of equipment components within the typical vacuum environment of semiconductor manufacturing leads to problems in current linear systems, such as unacceptable levels of particles that are generated by friction among components. Several hybrid architectures exist that use a combination of a radial process module arrangement and a linear arrangement.

One form of linear system uses a rail or track, with a moving cart that can hold an item that is handled by the manufacturing equipment. The cart may or may not hold the material on a moveable arm that is mounted to it. Among other problems with rail-type linear systems is the difficulty of including in-vacuum buffers, which may require sidewall mounting or other configurations that use more space. Also, in a rail-type system it is necessary to have a large number of cars on a rail to maintain throughput, which can be complicated, expensive and high-risk in terms of the reliability of the system and the security of the handled materials. Furthermore, in order to move the material from the cart into a process module, it may be necessary to mount one or two arms on the cart, which further complicates the system. With a rail system it is difficult to isolate sections of the vacuum system without breaking the linear motor or rail, which can be technically very complicated and expensive. The arm mounted to the cart on a rail system can have significant deflection issues if the cart is floated magnetically, since the arm creates a cantilever that is difficult to compensate for. The cart can have particle problems if it is mounted/riding with wheels on a physical rail.

A need exists for semiconductor manufacturing equipment that can overcome the inherent constraints of cluster tools while avoiding the problems of linear tools.

SUMMARY

Provided herein are methods and systems used for material transport, in particular a handling system, such as a vacuum handling system, that can move wafers or other substrates in a very compact footprint. While the methods and systems can be used for semiconductor manufacturing, it should be understood that the methods and systems described herein could be used in any processes or industries where it is advantageous to handle materials in a vacuum. As used herein, except where the context dictates otherwise, the terms manufacturing equipment, handling system, robotic handling system, vacuum handling system, semiconductor handling system, semiconductor manufacturing equipment, wafer handling system, manufacturing system, and the like are intended to encompass all types of systems, processes and equipment for handling and manufacturing items such as semiconductor wafers or other items.

In one aspect, a semiconductor manufacturing system adapted to handle a wafer that is disclosed herein includes a plurality of vertically stacked loading stations; a shared vacuum environment coupled to the loading stations; and a plurality of process modules arranged in a linear system and sharing the shared vacuum environment, wherein the process modules have a loading end and an exit end at opposite ends of the linear system, and include a plurality of vertically stacked process modules that are arranged in a 2-level configuration having a top level and a bottom level, the top level rotated substantially 45-degrees relative to the bottom level.

Methods and systems are provided for handling an item in a manufacturing process, including a plurality of process modules, each for executing a process on the item, and at least one 4-link robotic SCARA arm for moving the item between process modules. In embodiments, the methods and systems are used in connection with a vacuum handling system.

The methods and systems include a plurality of process modules, each for executing a process on the item and a dual robotic arm facility, wherein the dual robotic arm facility includes a top arm and a bottom arm for handling items between process modules. In embodiments the dual robotic arm facility comprises two opposed 4-link SCARA arms.

Methods and systems include a plurality of process modules disposed along an axis in a substantially linear arrangement and at least one handling facility for moving the item from one process module to another process module, wherein the handling facility comprises a robotic arm. In embodiments the methods and systems include a vacuum manufacturing facility. In embodiments, the robotic arm is a single or dual SCARA arm. In embodiments, the SCARA arm is a 4-link SCARA arm. In embodiments the arm is a single, -dual, or Leap-Frog-leg style arm. In embodiments, the SCARA arm has more or fewer than four links.

Methods and systems include a substantially linear arrangement of manufacturing equipment, having an input end and an output end, wherein the manufacturing equipment includes a vacuum facility and a return facility for returning the item to the input end after an item arrives at the output end during the manufacturing process. In embodiments the manufacturing equipment includes a plurality of process modules, wherein an item is moved between process modules by a robotic arm facility. In embodiments the robotic arm facility is a SCARA arm facility. In embodiments the SCARA arm facility includes a 4-link SCARA arm. In embodiments the SCARA arm facility includes dual opposed 4-link SCARA arms. In embodiments the return facility is an air return while the process modules are in a vacuum.

In embodiments there could be multiple input and output facilities along the linear system. In embodiments an air-based gripper can take a carrier with wafers and put it into the linear system at a point other than the initial entry point, such as half way down the line. In embodiments a gripper can remove material at a location other than the end exit point, such as at the midpoint of the line.

In embodiments, the methods and systems disclosed herein are curvilinear; that is, the linear systems do not have to be in a straight-line configuration.

In one aspect, a system disclosed herein includes a plurality of processing modules, also referred to as process modules, each process module performing one or more fabrication processes on a workpiece, the process modules arranged for sequential processing of the workpiece in a sequence from a first process module to a last process module; and a mid-entry point between the first process module and the last process module configured to add a workpiece to the sequence or remove a workpiece from the sequence at the mid-entry point.

The workpiece may enter the sequence at the mid-entry point. The workpiece may exit the sequence at the mid-entry point. The system may further include a plurality of mid-entry points, each mid-entry point positioned between two of the plurality of processing modules. The system may further include a return mechanism that moves the workpiece to a first one of the plurality of mid-entry points and retrieves the workpiece from a second one of the plurality of mid-entry points. The workpiece may be processed in a selected, sequential subset of the plurality of processing modules. The processing modules may be arranged to perform a plurality of different fabrication processes depending upon at least one of a mid-entry point where a workpiece is added to the sequence or a mid-entry point where the workpiece is removed from the sequence. The mid-entry point may connect a plurality of different manufacturing facilities. The manufacturing facilities may be arranged to conserve space. Two manufacturing facilities may be more space economical when connected by a mid-entry point than when separated. The processing modules may operate on the workpiece in a controlled environment. The controlled environment may include at least one of a vacuum, a controlled pressure, a controlled temperature, a controlled air purity, or a controlled gas mixture.

In another aspect, a method for processing a workpiece as described herein may include arranging a plurality of processing modules in a sequence to sequentially operate on a workpiece; connecting two of the processing modules through a mid-entry point; and adding a workpiece to the sequence at the mid-entry point. In another aspect, a method may include arranging a plurality of processing modules in a sequence to sequentially operate on a workpiece; connecting two of the processing modules through a mid-entry point; and removing a workpiece from the sequence at the mid-entry point.

A method disclosed herein may include providing a plurality of vacuum-based processing modules about a substantially linear axis between a loading end and an exit end; and providing an intermediate load lock facility for depositing items to or removing items from the vacuum-based processing modules between the loading end and the exit end.

The method may further include providing an air-based delivery system for delivering items to and from the intermediate load-lock facility. The method may include introducing an item at the intermediate load lock point. The method may further include removing an item at the intermediate load lock point. The method may include providing a plurality of intermediate load lock points along a sequential process, each one of the intermediate load lock points position between two adjacent vacuum-based processing modules. The method may include providing a return mechanism for moving an item to or from one of the plurality of intermediate load lock points. The workpiece may be processed by a selected, sequential subset of the plurality of processing modules between two of the intermediate load lock points. The vacuum-based processing modules may be arranged to perform a plurality of different fabrication processes depending upon at least one of the plurality of intermediate load lock points where a workpiece is added to the sequence or one of the plurality of intermediate load lock points where the workpiece is removed from the sequence. The load lock point may connect a plurality of different manufacturing facilities. The manufacturing facilities may be arranged to conserve space. Two of the plurality of manufacturing facilities may be more space economical when connected by a load lock point than when separated. The vacuum-based processing modules may operate on a workpiece in a controlled environment. The controlled environment may include at least one of a vacuum, a controlled pressure, a controlled temperature, a controlled air purity, or a controlled gas mixture.

A system described herein may include a plurality of processing modules arranged in a sequence to sequentially operate on a workpiece; connecting means for connecting two of the processing modules through a mid-entry point; and adding means for adding a workpiece to the sequence at the mid-entry point.

A system described herein may include a plurality of processing modules arranged in a sequence to sequentially operate on a workpiece; connecting means for connecting two of the processing modules through a mid-entry point; and removing means for removing a workpiece to the sequence at the mid-entry point.

In another aspect, a manufacturing facility described herein may include a series of vacuum-based process modules for processing items; and a pair of load locks for delivering items to and taking items from one or more of the vacuum-based process modules, wherein the load locks are disposed in a vertical stack in proximity to one or more of the vacuum-based process modules.

The system may further include one or more robotic arms for handling items. The one or more robotic arms may include a SCARA arm. The one or more robotic arms may include a four-link SCARA arm. The one or more robotic arms may include a three-link SCARA arm. The one or more robotic arms may include a pair of vertically stacked four-link SCARA arms. In embodiments the arm is a single, -dual, or Leap-Frog-leg style arm. The system may include multiple pairs of vertically stacked load locks at different points in the handling system. The different points may include an entry point and an exit point of the semiconductor handling system. The different points may include an intermediate point of the semiconductor handling system.

A manufacturing facility described herein may include a robotic component; a workpiece; and a sensor for monitoring a process performed on the workpiece by the robotic component. The sensor may include at least one of a light sensor, a contact sensor, a proximity sensor, a sonic sensor, a capacitive sensor, and a magnetic sensor. The sensor may include a vertical proximity sensor. The sensor may include a horizontal proximity sensor. The system may include a plurality of sensors diagonally arranged. The system may include a plurality of proximity sensors in a plurality of locations. The sensor may include a sensor for detecting movement of one or more of the workpiece, the robotic component, or an effector arm. The system may include a plurality of sensors used to determine a position of the robotic component. The system may include a plurality of sensors positioned to detect a final position of the robotic component. The final position may be an extended position or a retracted position or an interim position between an extended position and a retracted position. The sensor may provide a signal used to verify a path of the workpiece. The sensor may detect the workpiece shifting out of location. The fabrication process may be stopped in response to a signal from the sensor that the workpiece has shifted out of location. The robotic arm may move the workpiece to a safe location. The robotic arm may move the workpiece automatically. The robotic arm may move the workpiece under user control. The sensor may be used to prevent collision of at least one of the robotic arm or the workpiece with the manufacturing facility.

The sensor may communicate to a transmitter. The transmitter may include a wireless transmitter. The wireless transmitter may communicate a sensor signal from the sensor to a wireless receiver. The wireless receiver may be connected to a processor. The processor may indicate to a user a location of the sensor. The sensor signal may indicate a location of the sensor. The system may include a battery that supplies power to the sensor. The system may include a battery that supplies power to a transmitter coupled to the sensor. The sensors may be used to train the robotic component. The robotic component may be trained in a vacuum. The sensor may be wirelessly coupled to an external receiver, thereby preventing a need to vent the vacuum to atmosphere and the need to bake moisture out of a processing module of the wafer fabrication system after exposure to atmospheric conditions. Sensor feedback may provide a position of the sensor. The sensor may be attached to the workpiece. The sensor may be placed within a processing module of the wafer fabrication system. The sensor may be used in a hazardous environment. A user may control the robotic component based upon sensor feedback. The sensor may be used for non-collision training of the robotic component. The non-collision training prevents collision of at least one of the workpiece or the robotic component. The sensor may provide a location of the robotic component, the robotic component including one or more robotic arms. The sensor may provide a location of the workpiece, the workpiece including a semiconductor wafer. The sensor may provide an orientation of the workpiece, the workpiece including a semiconductor wafer. The sensor may be positioned within a processing module of the wafer fabrication system.

In another aspect, a method for instrumenting a robotic wafer manufacturing system as describe herein may include: providing a robotic component; providing a workpiece; and positioning a sensor on at least one of the robotic component, the workpiece, or a chamber of a processing module surrounding the robotic component and the workpiece, the sensor monitoring a fabrication process performed on the workpiece by the robotic component. Another method may include providing a robotic arm for a semiconductor manufacturing process; and providing a plurality of sensors for detecting a position within a processing module of the manufacturing process, the position including a vertical position and a horizontal position.

The sensors may detect a position of an end effector of the robotic arm. The sensors may detect a position of the robotic arm. The sensors may detect a position of a workpiece held by an end effector of the robotic arm. The workpiece may be a wafer and at least one of the sensors may be positioned to be covered by the wafer when the robotic arm is being retracted. The workpiece may be a wafer and at least one of the sensors may be placed outside a radius of the wafer so that the sensor detects a leading edge of the wafer and a trailing edge of the wafer during a movement of the wafer between an extended and a retracted position of the robotic arm. A detection of the leading edge and the trailing edge is used to determine whether the wafer is centered on an effector of the robotic arm. The sensors may include an optical beam-breaking sensor. At least two of the sensors may be positioned across a vacuum chamber from each other. The sensors may be arranged along a diagonal of a vacuum chamber. The method may further include providing a mirror to direct a beam from at least one of the sensors within a vacuum chamber. The method may further include detecting a position of the robotic arm to train the robotic arm to perform a semiconductor handling action.

In one aspect, a handling method disclosed herein may include providing a workpiece with a sensor for detecting a condition in proximity to the workpiece; disposing the workpiece in a handling system; and receiving data from the sensor in order to detect a condition related to handling of the workpiece by the handling system.

The workpiece may be a semiconductor wafer. The workpiece may be configured in the shape of a semiconductor wafer. The sensor may be at least one of a proximity sensor, a capacitive sensor, an optical sensor, a thermometer, a pressure sensor, a chemical sensor, a radiation detector, and a magnetic sensor. The method may include transmitting radio frequency data from the sensor. The method may include communicating data from the sensor to the handling system. The method may include detecting a proximity of the workpiece to a feature of the handling system. The method may include training the robotic arm in a semiconductor handling process using data from the sensor. The handling system may be a semiconductor handling system.

In another aspect, a system described herein may include a handling system; a workpiece disposed within the handling system; and a sensor connected to the workpiece, the sensor detecting a condition in proximity to the workpiece, the sensor providing a signal related to the condition.

The workpiece may be a semiconductor wafer. The workpiece may be configured in the shape of a semiconductor wafer. The sensor may be at least one of a proximity sensor, a capacitive sensor, an optical sensor, a thermometer, a pressure sensor, a chemical sensor, a radiation detector, and a magnetic sensor. The system may include a transmitter for transmitting radio frequency data from the sensor. The workpiece may have a data connection to the handling system. The sensor may detect a proximity of the workpiece to a feature of the handling system. The robotic arm may be trained to perform a semiconductor handling process using data from the sensor. The handling system may be a semiconductor handling system.

In one aspect, a system described herein may include a robotic component positioned in a vacuum maintained in a chamber of a vacuum manufacturing process; and one or more drives for actuating movement of the robotic component, the one or more drives including motor drive hardware external to the vacuum.

The motor drive hardware may include one or more electrical wires. The motor drive hardware may include one or more encoders. The motor drive hardware may include one or more signal LEDs. The motor drive hardware may include one or more pick-ups. The motor drive hardware may include one or more bearings. The motor drive hardware may include one or more magnets. The motor drive hardware may be sealed from the vacuum, such as using lip-seals or ferrofluidic seals. There may be a minimal outgassing of components. The system may include a vacuum pump that provides quick vacuum pump downs. Serviceability of the motor drive hardware may be improved by permitting access to the motor drive hardware without releasing the vacuum in the processing module. The motor drive hardware may include robot drives. The motor drive hardware may be external to the processing module. The motor drive hardware may be positioned to present minimal surface in the vacuum. Minimal materials may be used to minimize outgassing. Positioning of motor drive hardware outside the vacuum may provide for quicker pump down. The system may include at least one drive cavity for the robotic component. The vacuum may be maintained in the drive cavity. The volume of the drive cavity may be small.

A system for driving a robot in a vacuum-based semiconductor handling system as described herein may include a drive cartridge that provides rotary drive force to a drive shaft for a robot; and a rotary seal unit, wherein the rotary seal unit seals the drive cartridge outside the vacuum while the drive shaft is disposed in the vacuum.

The drive cartridge may include a pair of drive cartridges each having an integral encoder, bearings, and magnets. The rotary seal unit may be a concentric, multiple-shaft rotary seal unit. The rotary seal unit may use a lip seal. The rotary seal unit may use a ferrofluidic seal. The drive cartridge may be coupled to the drive shaft for removability and replaceability.

In one aspect, a method described herein may include positioning a robotic component in a vacuum maintained in a chamber of a vacuum manufacturing process; positioning one or more drives for actuating movement of the robotic component outside the vacuum, the one or more drives including motor drive hardware; and coupling the robotic component to the one or more drives through a vacuum-sealed interface.

The motor drive hardware may include one or more electrical wires, one or more encoders, one or more signal LEDs, one or more pick-ups, one or more bearings, and/or one or more magnets. The motor drive hardware may be sealed from the vacuum, such as using lip-seals or ferrofluidic seals. There may be a minimal outgassing of components. A vacuum pump may provide quick vacuum pump downs. The serviceability of the motor drive hardware may be improved by permitting access to the motor drive hardware without releasing the vacuum in the processing module. The motor drive hardware may include robot drives. The motor drive hardware may be external to the processing module. The motor drive hardware may be positioned to present minimal surface in the vacuum. Minimal materials may be used for to achieve minimal outgassing. The motor drive hardware may be positioned outside the vacuum to provide for quicker pump down. The method may include providing at least one drive cavity for the robotic component. A vacuum may be maintained in the drive cavity. The volume of the cavity may be small.

A system described herein may include a robotic component positioned in a vacuum maintained in a chamber of a vacuum manufacturing process; one or more components of motor drive hardware external to the vacuum; and coupling means for coupling the one or more components of motor drive hardware to the robotic component.

A semiconductor manufacturing system disclosed herein may include a plurality of vertically stacked loading stations; and a plurality of vertically stacked processing modules.

Four or more vertically stacked process load stations may be provided. One of the plurality of vertically stacked loading stations may feed a manufacturing process that includes one or more of the plurality of vertically stacked processing modules. A second one of the plurality of vertically stacked loading stations may be loaded while the one of the plurality of vertically stacked loading stations feeds the manufacturing process. Loading of the plurality of vertically stacked loading modules may be coordinated to minimize wait time. The plurality of vertically stacked processing modules may be arranged to reduce a footprint for the system. At least one robot may be able to access any one of the vertically stacked load stations. The system may include a plurality of vertically stacked exit stations.

At least one robotic component may be able to access any one of the vertically stacked exit stations. At least one robotic component may be able to access more than one vertically stacked process module. At least one robotic component may be able to access more than one horizontally adjacent processing module. The system may include at least one holding station between two horizontally adjacent processing modules. The system may include one or more vertically stacked mid-entry stations. The system may include at least one robotic component that can access more than one vertically stacked mid-entry station. A workpiece may move through a plurality different paths of adjacent processing modules. The plurality of vertically stacked processing modules may include one or more vacuum-based processing modules. The system may include a plurality of vertically stacked load locks disposed in proximity to at least one of an entry point or an exit point of the semiconductor manufacturing process. The plurality of vertically stacked processing modules may be arranged in a substantially linear configuration. The system may include one or more robotic arms that move workpieces among the plurality of vertically stacked processing modules. The system may include at least one of a top robotic arm set and a bottom robotic arm set. At least one of the one or more robotic arms may move vertically to access a top process module of a one of the plurality of vertically stacked process modules and a bottom process module of the one of the plurality of vertically stacked process modules. At least one of the plurality of vertically stacked process modules may include more than two process modules in a vertical stack.

Disclosed herein is a method for arranging processing modules in a semiconductor manufacturing process comprising: providing a plurality of processing modules; arranging at least two of the plurality of processing modules so that they are horizontally adjacent; and arranging at least two of the plurality of processing modules so that they are vertically adjacent.

Four or more vertically stacked loading stations may be provided. One of the plurality of vertically stacked loading stations may feed a manufacturing process that includes one or more of the plurality of vertically stacked processing modules. A second one of the plurality of vertically stacked loading stations may be loaded while the one of the plurality of vertically stacked loading stations feeds the manufacturing process. Loading of the plurality of vertically stacked loading stations is coordinated to minimize wait time. The plurality of vertically stacked processing modules may be arranged to reduce a footprint for the system. At least one robotic component may be capable of accessing any one of the vertically stacked load stations. The method may include providing a plurality of vertically stacked exit stations. At least one robotic component may be capable of accessing any one of the vertically stacked exit stations. At least one robotic component may be capable of accessing more than one vertically stacked process module. At least one robotic component may access more than one horizontally adjacent processing module.

The method may include providing at least one holding station between two horizontally adjacent processing modules. The method may include providing one or more vertically stacked mid-entry stations. At least one robotic component may be capable of accessing more than one vertically stacked mid-entry station. A workpiece may move through a plurality of different paths of adjacent processing modules. The plurality of vertically stacked processing modules may include one or more vacuum-based processing modules. The method may include providing a plurality of vertically stacked load locks disposed in proximity to at least one of an entry point or an exit point of the semiconductor manufacturing process. The plurality of vertically stacked processing modules may be arranged in a substantially linear configuration. The method may include providing one or more robotic arms that move workpieces among the plurality of vertically stacked processing modules. The one or more robotic arms may include at least one of a top robotic arm set and a bottom robotic arm set. At least one of the one or more robotic arms can move vertically to access a top process module of a one of the plurality of vertically stacked process modules and a bottom process module of the one of the plurality of vertically stacked process modules. At least one of the plurality of vertically stacked process modules may include more than two process modules in a vertical stack.

A wafer fabrication method described herein may include providing a processing module having an operating temperature substantially above an ambient temperature; receiving a wafer for introduction into the processing module, the wafer having a temperature near the ambient temperature; and heating the wafer to a temperature that is closer to the operating temperature.

Heating the wafer may include heating the wafer in a preheating station before transfer to the processing module. The method may further include cooling the wafer to a temperature that is closer to the ambient temperature before removing the wafer from a manufacturing process that includes the processing module. Cooling the wafer may include cooling the wafer to a temperature that prevents condensation on the wafer when the wafer is removed from the manufacturing process. The method may include preheating a material handler before handling the wafer with the material handler. Heating the wafer may include heating the wafer to a temperature that prevents condensation on a surface of the wafer when the wafer is introduced into the processing module. Heating the wafer may include heating the wafer during a vacuum pump down of the processing module. Heating the wafer may include heating the wafer to a temperature that prevents condensation on a surface of the wafer during an accelerated vacuum pump down of the processing module. Heating the wafer may include heating the wafer through an application of heat through a preheated material handler. The method may include controlling a cooling of the wafer by controlling a temperature of a material handler that handles the wafer.

A wafer fabrication system described herein may include a processing module having an operating temperature substantially above an ambient temperature; a wafer for introduction into the processing module, the wafer having a temperature near the ambient temperature; and heating means for heating the wafer to a temperature that is closer to the operating temperature.

In another aspect, a wafer fabrication system described herein may include a processing module having an operating temperature substantially above an ambient temperature; and a material handler that heats a wafer to a temperature that is closer to the operating temperature before introducing the wafer into the processing module.

Heating the wafer may include heating the wafer in a preheating station before transfer to the processing module. The system may include a cooling means for cooling the wafer to a temperature that is closer to the ambient temperature before removing the wafer from a manufacturing process that includes the processing module. Cooling the wafer may include cooling the wafer to a temperature that prevents condensation on the wafer when the wafer is removed from the manufacturing process. The material handler may be preheated before handling the wafer. The wafer may be heated to a temperature that prevents condensation on a surface of the wafer when the wafer is introduced into the processing module. The wafer may be heated during a vacuum pump down of the processing module. The wafer may be heated to a temperature that prevents condensation on a surface of the wafer during an accelerated vacuum pump down of the processing module. The wafer may be heated through an application of heat through a preheated material handler. In embodiments, the wafer can be heated by a heater that heats the wafer itself. This heater can be installed or contained in a load lock that is also heated independently from the wafer heater. This way one can independently control the load lock chamber (which primarily affects condensation during pumpdown), and wafer preheating or post cooling. The load lock will have a large thermal mass, and so it may only react slowly to changes in the desired temperature. The wafer heater can be created with a very small thermal mass, so that, for example, one could set the heater to 300 deg C. during a pump down, and to 80 deg C. during a vent. In embodiments the wafer may be cooled by controlling a temperature of a material handler that handles the wafer.

In another aspect, disclosed herein is a semiconductor handling method including providing a load lock for delivering items to or receiving items from a vacuum-based semiconductor handling system; and heating the load lock. The method may include heating the load lock during pumping down of the load lock. The load lock may be heated to about fifty degrees C. to about 100 degrees C. The load lock may be heated to between ten degrees C. and about 200 degrees C.

A semiconductor handling system described herein may include a load lock for delivering items to or receiving items from a vacuum-based semiconductor handling system; and a heating element for heating the load lock. The load lock may be heated during pumping down of the load lock. The load lock may be heated to about fifty degrees C. to about 100 degrees C. The load lock may be heated to between ten degrees C. and about 200 degrees C.

In another aspect, a system described herein may include a component for material handling in a semiconductor manufacturing process, the component having a taper that establishes a non-uniform cross-section that mitigates a propagation of resonant vibrations in the component.

The component may include an end effector. The top surface of the end effector may be flat. The bottom surface of the end effector may be tapered. The end effector may be made of cast material. The taper may be designed into a casting for the cast material used to build the end effector. The component may be a robotic arm. The component may be a link of a robotic arm. The system may include a plurality of tapered links, at least two of the links tapered in a manner to minimize a thickness of the tapered links when the tapered links are overlapped. The component may include an end effector and a robotic arm, each of the end effector and the robotic arm being tapered.

In another aspect, a semiconductor handling method disclosed herein may include providing an end effector for handling a semiconductor wafer; and tapering the end effector to reduce resonant vibrations of the end effector. The method may include constructing the end effector of aluminum silicon carbide.

In another aspect, a semiconductor handling method described herein may include providing a robotic arm facility; and tapering at least one link of the robotic arm facility to dampen vibrations of the robotic arm facility. The method may include constructing at least one link of the robotic arm from aluminum silicon carbide.

A semiconductor handling method disclosed herein may include: positioning a plurality of robotic arms and a plurality of processing modules along an axis; and moving a workpiece among the plurality of processing modules by passing the workpiece from a first one of the plurality of robotic arms to a second one of the plurality of robotic arms.

The axis may be linear. The axis may be curvilinear. The axis may form a substantially U-shaped. The plurality of robotic arms may include a SCARA arm. The plurality of robotic arms may include a four-link SCARA arm. The plurality of robotic arms may include a three-link SCARA arm. The plurality of robotic arms may include linked pairs of robotic arms, each linked pair including two vertically disposed robotic arms.

A semiconductor handling system as disclosed herein may include: a plurality of robotic arms and a plurality of processing modules arranged along an axis; and passing means for moving a workpiece among the plurality of processing modules by passing the workpiece from a first one of the plurality of robotic arms to a second one of the plurality of robotic arms.

A method for semiconductor handling as disclosed herein may include: providing a first robotic arm for handling a workpiece; and disposing a second robotic arm for handling the workpiece in a position substantially vertically with respect to the first robotic arm.

The method may include mechanically coupling the first robotic arm to the second robotic arm. The method may include mechanically decoupling the first robotic arm from the second robotic arm. At least one of the first robotic arm and the second robotic arm may be a SCARA arm. At least one of the first robotic arm and the second robotic arm may be a four-link SCARA arm. At least one of the first robotic arm and the second robotic arm is a three-link SCARA arm.

A semiconductor handling system describe herein may include: a first robotic arm for handling a workpiece, the robotic arm positioned within a processing module; and a second robotic arm for handling the workpiece, the second robotic arm positioned within the processing module in a position substantially vertically with respect to the first robotic arm.

The first robotic arm may be mechanically coupled to the second robotic arm. The first robotic arm may be mechanically decoupled from the second robotic arm. At least one of the first robotic arm and the second robotic arm may be a SCARA arm. At least one of the first robotic arm and the second robotic arm may be a four-link SCARA arm. At least one of the first robotic arm and the second robotic arm may be a three-link SCARA arm.

A system disclosed herein may include: a robotic drive; an end effector for manipulating items; a robotic arm that connects the robotic drive mechanism to the end effector, the robotic arm including four or more links; one or more connectors that mechanically couple the four or more links to each other such that the end effector moves in a substantially linear direction under control of the robotic drive.

Each of the links may have a length selected to optimize a reach-to-containment ratio of the robotic arm. Each of the links may have a length selected to avoid collision with a nearby component of the handling system. The system may include a controller that controls operation of the robotic drive. The controller may be a remote controller. The controller may be integrated with a visualization software program. The controller may control more than one robotic arm. A link of the robotic arm proximal to the end effector may include an offset wrist to allow the arm to fold. The robotic arm may include at least one link having a cutout into which at least one other link can fold. At least two consecutive links of the robotic arm may be stacked with a vertical gap so that at least one other link of the robotic arm can fold in the vertical space between the at least two consecutive links. The system may include at least one bypass spline between links.

A method disclosed herein may include providing a robotic drive, an end effector for manipulating items, and a robotic arm that connects the robotic drive mechanism to the end effector, the robotic arm including four or more links; and interconnecting the four or more links to each other such that the end effector moves in a substantially linear direction under control of the robotic drive.

Each of the links may have a length selected to optimize a reach-to-containment ratio of the robotic arm. Each of the links may have a length selected to avoid collision with a nearby component of the handling system. The method may include controlling operation of the robotic drive with a controller. The controller may be integrated with a visualization software program. The controller may control more than one robotic arm. A link of the robotic arm proximal to the end effector may include an offset wrist to allow the arm to fold. The robotic arm may include at least one link having a cutout into which at least one other link can fold. At least two consecutive links of the robotic arm may be stacked with a vertical gap so that at least one other link of the robotic arm can fold in the vertical space between the at least two consecutive links. At least two consecutive links of the robotic arm may be stacked with a vertical gap so that the robotic arm is able to reach a predefined transfer plane without colliding with components of the handling system. The method may include providing at least one bypass spline between links.

A system disclosed herein may include a plurality of process modules for a semiconductor fabrication process disposed about a substantially linear track; a cart moveably coupled to the linear track and configured to move along the linear track; and a robotic arm disposed on the cart for manipulating workpieces among the plurality of process modules.

The robotic arm may include a SCARA arm. The SCARA arm may include a four-link SCARA arm. The SCARA arm may include a three-link SCARA arm.

A semiconductor handling system described herein may include a vacuum processing system disposed in a substantially linear configuration having a loading end and an exit end; and a non-vacuum return system for returning an item from the exit end to the loading end.

The non-vacuum return system may be disposed above the vacuum processing system. The non-vacuum return system may be disposed below the vacuum processing system. The non-vacuum return system may be disposed beside the vacuum processing system. The non-vacuum return system may be disposed within the vacuum processing system. The non-vacuum return system may include a load lock at the exit end for moving the item from the vacuum processing system to the non-vacuum return system. The non-vacuum return system may include a slide mechanism and a gripper for moving the item from the exit end to the loading end.

The vacuum processing system may include a plurality of processing modules. The vacuum processing system may include one or more robotic arms that move the item among the processing modules. The system may include a plurality of robotic arms that move the item by passing the item from a first one of the plurality of robotic arms to a second one of the plurality of robotic arms. The plurality of robotic arms may include a SCARA arm. The plurality of robotic arms may include a four-link SCARA arm. The plurality of robotic arms may include a three-link SCARA arm. The plurality of robotic arms may include at least one pair of linked robotic arms disposed vertically with respect to each other. The plurality of processing modules may vary in footprint by a factor of two or more. The system may include a semiconductor fabrication facility, the semiconductor fabrication facility including a plurality of linear semiconductor handling systems, the plurality of linear semiconductor handling systems arranged side-by-side so that the loading ends of the plurality of linear semiconductor handling systems face a corridor of the semiconductor fabrication facility.

A semiconductor manufacturing facility described herein may include at least one tumble gripper for receiving a semiconductor wafer, the tumble gripper including a pair of gripping modules, wherein each gripping module is configured to receive one of a pair of parallel edges of the semiconductor wafer, wherein each gripping module rotates upon receiving a semiconductor wafer into a position wherein a horizontal portion of the gripping module supports the semiconductor wafer in a horizontal plane and a vertical portion of the gripping module prevents the semiconductor wafer from moving in the horizontal plane.

A method of handling a semiconductor wafer as described herein may include providing an end effector for holding a semiconductor wafer, wherein the end effector includes a receiving slot configured to support the semiconductor wafer on a horizontal plane while preventing the semiconductor wafer from moving in the horizontal plane and wherein the end effector includes a ramp configured to slide the semiconductor wafer into the receiving slot when the semiconductor wafer is placed onto the end effector.

A semiconductor handling system as described herein may include a plurality of robotic arms, at least two of the plurality of robotic arms sharing a common drive facility. At least of the plurality of robotic arms may be a SCARA arm. At least one of the plurality of robotic arms is a four-link SCARA arm. At least two of the plurality of robotic arms may operate independently, or may operate dependently.

In another aspect, a semiconductor handling system described herein may include a robotic arm having a frog-leg arm configuration, the frog-leg arm configuration including at least two pairs of frog leg arms.

As used herein, "robot" shall include any kind of known robot or similar device or facility that includes a mechanical capability and a control capability, which may include a combination of a controller, processor, computer, or similar facility, a set of motors or similar facilities, one or more resolvers, encoders or similar facilities, one or more mechanical or operational facilities, such as arms, wheels, legs, links, claws, extenders, grips, nozzles, sprayers, effectors, actuators, and the like, as well as any combination of any of the above. One embodiment is a robotic arm.

As used herein "drive" shall include any form of drive mechanism or facility for inducing motion. In embodiments it includes the motor/encoder section of a robot.

As used herein, "axis" shall include a motor or drive connected mechanically through linkages, belts or similar facilities, to a mechanical member, such as arm member. An "N-axis drive" shall include a drive containing N axes; for example a "2-axis drive" is a drive containing two axes.

As used herein, "arm" shall include a passive or active (meaning containing motors/encoders) linkage that may include one or more arm or leg members, bearings, and one or more end effectors for holding or gripping material to be handled.

As used herein, "SCARA arm" shall mean a Selectively Compliant Assembly Robot Arm (SCARA) robotic arm in one or more forms known to those of skill in the art, including an arm consisting of one or more upper links connected to a drive, one or more lower links connected through a belt or mechanism to a motor that is part of the drive, and one or more end units, such as an end effector or actuator.

As used herein, "turn radius" shall mean the radius that an arm fits in when it is fully retracted.

As used herein, "reach" shall include, with respect to a robotic arm, the maximum reach that is obtained when an arm is fully extended. Usually the mechanical limit is a little further out than the actual effective reach, because it is easier to control an arm that is not completely fully extended (in embodiments there is a left/right singularity at full extension that can be hard to control).

As used herein, "containment" shall mean situations when the arm is optimally retracted such that an imaginary circle can be drawn around the arm/end effector/material that is of minimum radius.

As used herein, the "reach-to-containment ratio" shall mean, with respect to a robotic arm, the ratio of maximum reach to minimum containment.

As used herein, "robot-to-robot" distance shall include the horizontal distance between the mechanical central axis of rotation of two different robot drives.

As used herein, "slot valve" shall include a rectangular shaped valve that opens and closes to allow a robot arm to pass through (as opposed to a vacuum (isolation) valve, which controls the pump down of a vacuum chamber). For example, the SEMI E21.1-1296 standard (a published standard for semiconductor manufacturing) the slot valve for 300 mm wafers in certain semiconductor manufacturing process modules has an opening width of 336 mm, a opening height of 50 mm and a total valve thickness of 60 mm with the standard also specifying the mounting bolts and alignment pins.

As used herein, "transfer plane" shall include the plane (elevation) at which material is passed from a robot chamber to a process module chamber through a slot valve. Per the SEMI E21.1-1296 standard for semiconductor manufacturing equipment the transfer plane is 14 mm above the slot valve centerline.

As used herein, "section" shall include a vacuum chamber that has one or more robotic drives in it. This is the smallest repeatable element in a linear system.

As used herein, "link" shall include a mechanical member of a robot arm, connected on both ends to another link, an end effector, or the robot drive.

As used herein, "L1," "L2", "L3" or the like shall include the numbering of the arm links starting from the drive to the end effector.

As used herein, "end effector" shall include an element at an active end of a robotic arm distal from the robotic drive and proximal to an item on which the robotic arm will act. The end effector may be a hand of the robot that passively or actively holds the material to be transported in a semiconductor process or some other actuator disposed on the end of the robotic arm.

As used herein, the term "SCARA arm" refers to a robotic arm that includes one or more links and may include an end effector, where the arm, under control, can move linearly, such as to engage an object. A SCARA arm may have various numbers of links, such as 3, 4, or more. As used herein, "3-link SCARA arm" shall include a SCARA robotic arm that has three members: link one (L1), link two (L2) and an end effector. A drive for a 3-link SCARA arm usually has 3 motors: one connected to L1, one to the belt system, which in turn connects to the end effector through pulleys and a Z (lift) motor. One can connect a fourth motor to the end effector, which allows for some unusual moves not possible with only three motors.

As used herein, "dual SCARA arm" shall include a combination of two SCARA arms (such as two 3 or 4-link SCARA arms (typically designated A and B)) optionally connected to a common drive. In embodiments the two SCARA arms are either completely independent or share a common link member L1. A drive for a dual independent SCARA arm usually has either five motors: one connected to L1-A, one connected to L1-B, one connected to the belt system of arm A, one connected to the belt system of arm B, and a common Z (lift) motor. A drive for a dual dependent SCARA arm usually has a common share L1 link for both arms A and B and contains typically four motors: one connected to the common link L1, one connected to the belt system for arm A, one connected to the belt system for arm B, and a common Z (lift) motor.

As used herein, "4-link SCARA arm" shall include an arm that has four members: L1, L2, L3 and an end effector. A drive for a 4-link SCARA arm can have four motors: one connected to L1, one to the belt systems connected to L2 and L3, one to the end effector and a Z motor. In embodiments only 3 motors are needed: one connected to L1, one connected to the belt system that connects to L2, L3 and the end effector, and a Z motor.

As used herein, "Frog-leg style arm" shall include an arm that has five members: L1A, L1B, L2A, L3B and an end effector. A drive for a frog-leg arm can have three motors, one connected to L1A—which is mechanically by means of gearing or the like connected to L1B-, one connected to a turret that rotates the entire arm assembly, and a Z motor. In embodiments the drive contains three motors, one connected to L1A, one connected to L1B and a Z motor and achieves the desired motion through coordination between the motors.

As used herein, "Dual Frog-leg style arm" shall include an arm that has eight members L1A, L1B, L2A-1, L2A-2, L2B-1, L2B-2 and two end effectors. The second link members L2A-1 and L2B-1 form a single Frog-leg style arm, whereas the second link members L2A-2 and L2B-2 also form a single Frog-leg style arm, however facing in an opposite direction. A drive for a dual frog arm may be the same as for a single frog arm.

As used herein, "Leap Frog-leg style arm" shall include an arm that has eight members L1A, L1B, L2A-1, L2A-2, L2B-1, L2B-2 and two end effectors. The first link members L1A and L1B are each connected to one of the motors substantially by their centers, rather than by their distal ends. The second link members L2A-1 and L2B-1 form a single Frog-leg style arm, whereas the second link members L2A-2 and L2B-2 also form a single Frog-leg style arm, however facing in the same direction. A drive for a dual frog arm may be the same as for a single frog arm.

All patents, patent applications and other documents referenced herein are hereby incorporated by reference.

BRIEF DESCRIPTION OF THE FIGURES

FIG. 13 shows a side view of a dual-arm set of 4-link SCARA arms using a spline link as the transmission mechanism.

FIG. 34 illustrates a fabrication facility including a mid-entry facility from a top view.

FIG. 49 shows an end effector tapered in two dimensions, which reduces active vibration modes in the end effector.

FIG. 50 shows how vertical tapering of robotic arm elements for a robot planar arm can be used to reduce vibration in the arm set, without significantly affecting vertical stacking height.

FIG. 51 illustrates a dual independent SCARA robotic arm.

FIG. 52 illustrates a dual dependent SCARA robotic arm.

FIG. 54 illustrates a dual Frog-leg style robotic arm.

FIG. 60 illustrates a dual Frog-Leg style robotic manipulator with substrates on the same side of the system.

DETAILED DESCRIPTION

Figure 1:
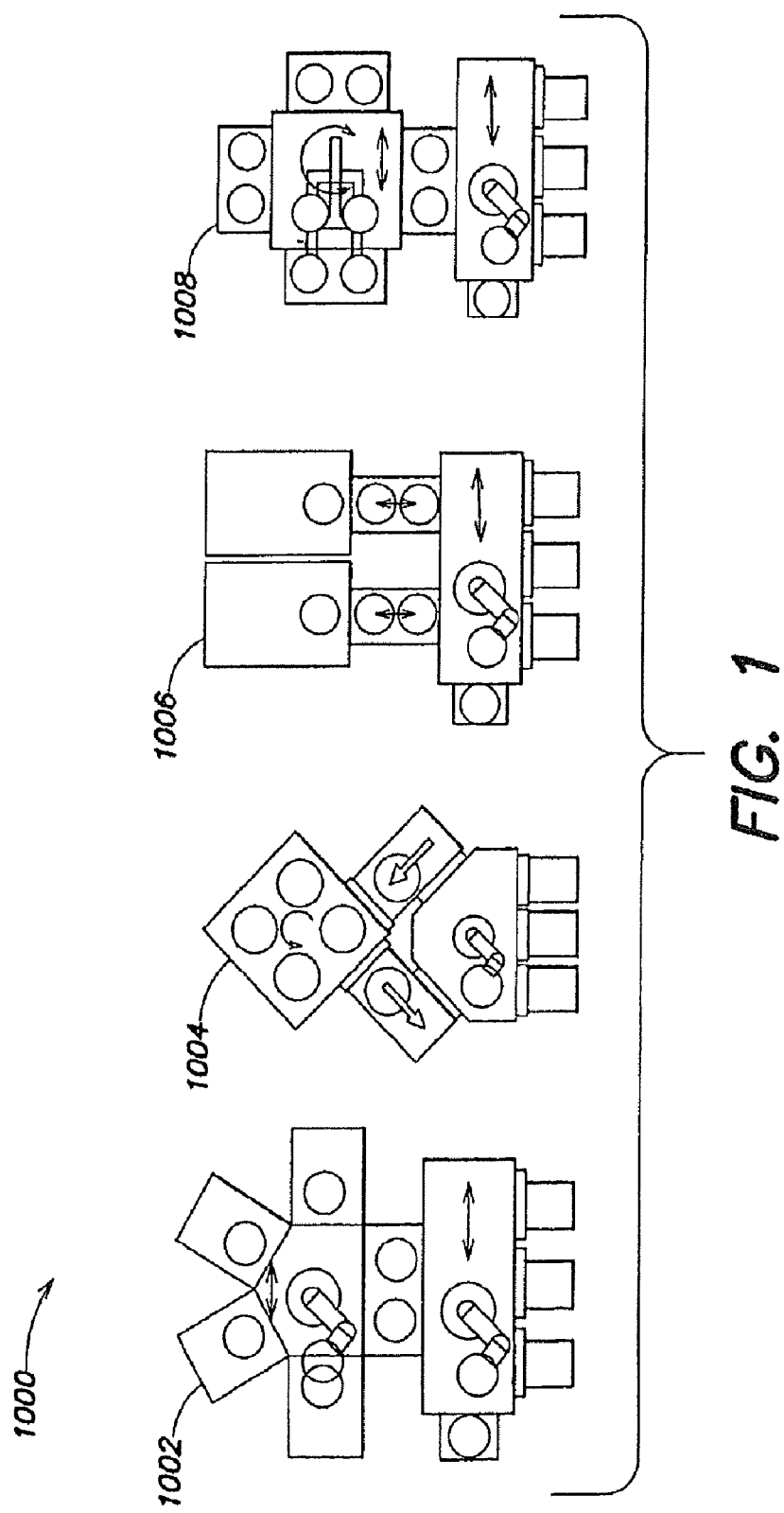
FIG. 1 shows equipment architectures for a variety of manufacturing equipment types.

FIG. 1 shows equipment architectures 1000 for a variety of manufacturing equipment types. Each type of manufacturing equipment handles items, such as semiconductor wafers, between various processes, such as chemical vapor deposition processes, etching processes, and the like. As semiconductor manufacturing processes are typically extremely sensitive to contaminants, such as particulates and volatile organic compounds, the processes typically take place in a vacuum environment, in one or more process modules that are devoted to specific processes. Semiconductor wafers are moved by a handling system among the various processes to produce the end product, such as a chip. Various configurations 1000 exist for handling systems. A prevalent system is a cluster tool 1002, where process modules are positioned radially around a central handling system, such as a robotic arm. In other embodiments, a handling system can rotate items horizontally, such as in the embodiment 1004. An important aspect of each type of tool is the "footprint," or the area that the equipment takes up in the semiconductor manufacturing facility. The larger the footprint, the more space required to accommodate multiple machines in a fabrication facility. Also, larger footprints typically are associated with a need for larger vacuum systems, which increase greatly in cost as they increase in size. The architecture 1004 rotates items in a "lazy susan" facility. The architecture in 1006 moves items in and out of a process module where the process modules are arranged next to each other. The architecture 1008 positions process modules in a cluster similar to 1002, with the difference that the central robot handles two wafers side by side. Each of these systems shares many of the challenges of cluster tools, including significant swap time delays as one wafer is moved in and another out of a given process module, as well as considerable difficulty maintaining the cleanliness of the vacuum environment of a given process module, as more and more wafers are moved through the system.

Figure 2:
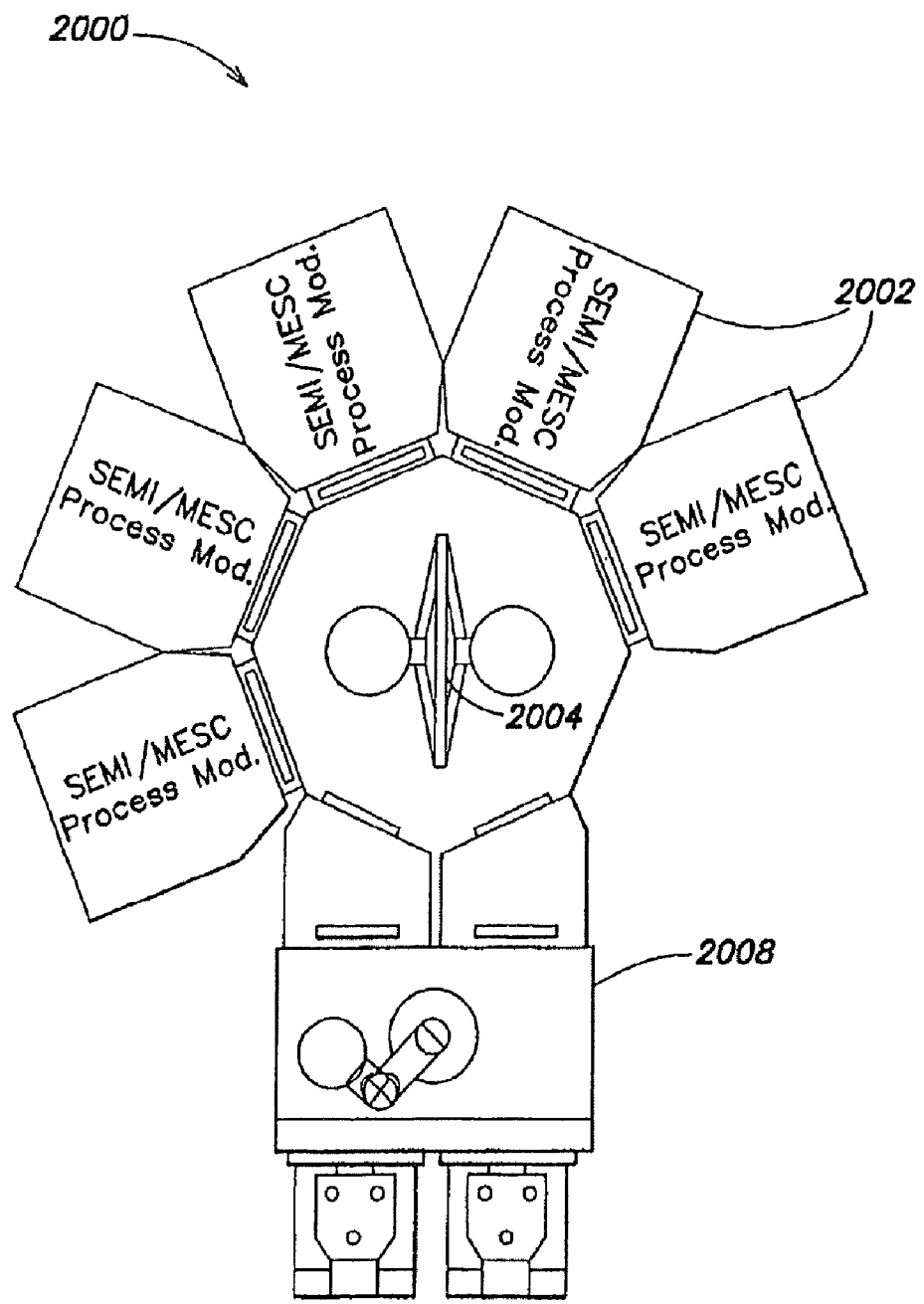
FIG. 2 shows a conventional, cluster-type architecture for handling items in a semiconductor manufacturing process.

FIG. 2 shows a conventional cluster-type architecture 2000 for handling items in a semiconductor manufacturing process. A robotic arm 2004 moves items, such as wafers, among various process modules 2002 that are positioned in a cluster around the robotic arm 2004. An atmospheric substrate handling mini-environment chamber 2008 receives materials for handling by the equipment and holds materials once processing is complete. Note how difficult it would be to add more process modules 2002. While one more module 2002 would potentially fit, the practical configuration is limited to five process modules 2002. Adding a sixth module may significantly impact the serviceability of the equipment, in particular the robotic arm 2004.

Figure 3A:
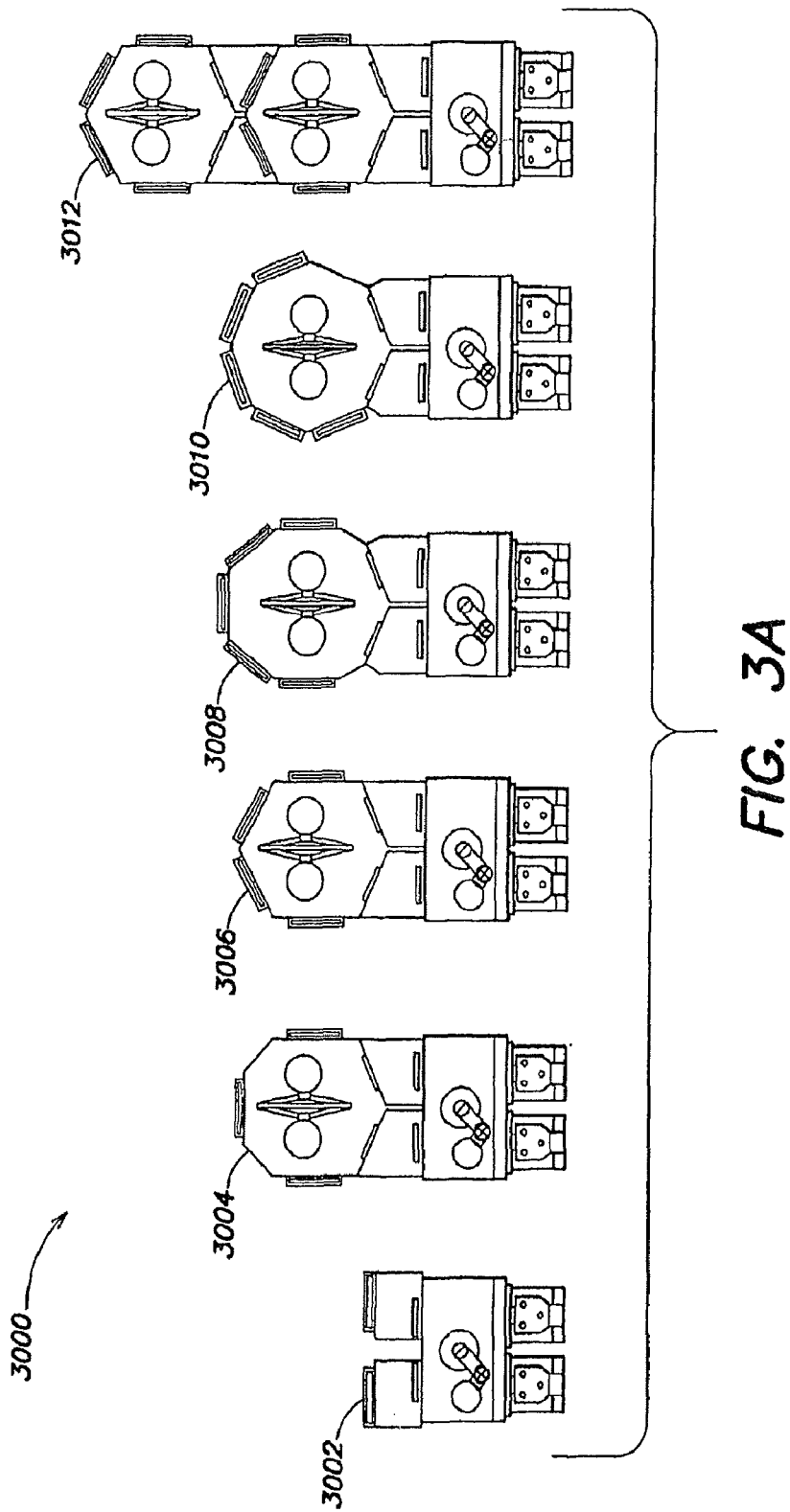
FIGS. 3A and 3B show a series of cluster-type systems for accommodating between two and six process modules.
Figure 3B:
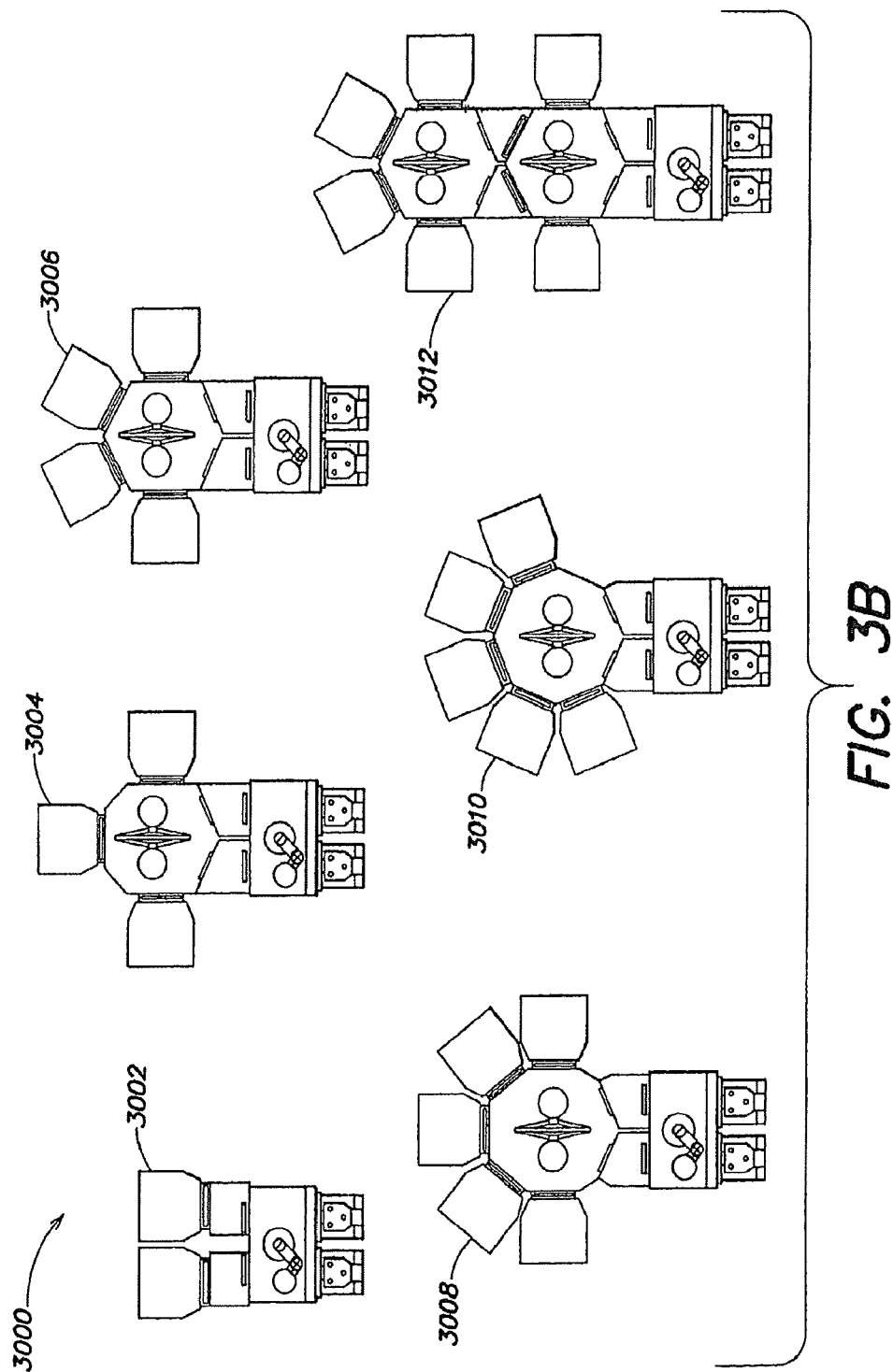

FIGS. 3A and 3B show cluster tool modules, atmospheric mini-environment handling chambers, vacuum handling chambers and other components 3000 from a flexible architecture system for a vacuum based manufacturing process. Different modules can be assembled together to facilitate manufacturing of a desired process technology. For example, a given chip may require chemical vapor deposition of different chemical constituents (e.g., Titanium Nitride, Tungsten, etc.) in different process modules, as well as etching in other process modules. The sequence of the processes in the different process modules produces a unique end product. Given the increasing complexity of semiconductor components, it is often desirable to have a flexible architecture that allows the manufacturer to add more process modules. However, the cluster tools described above are space-limited; therefore, it may be impossible to add more process modules, meaning that in order to complete a more complex semiconductor wafer it may be necessary to move manufacturing to a second cluster tool. As seen in FIG. 3A and FIG. 3B, cluster tools can include configurations with two 3002, three 3004, four 3006, five 3008, 3010 or six 3012 process modules with staged vacuum isolation. Other components can be supplied in connection with the equipment.

Figure 4:
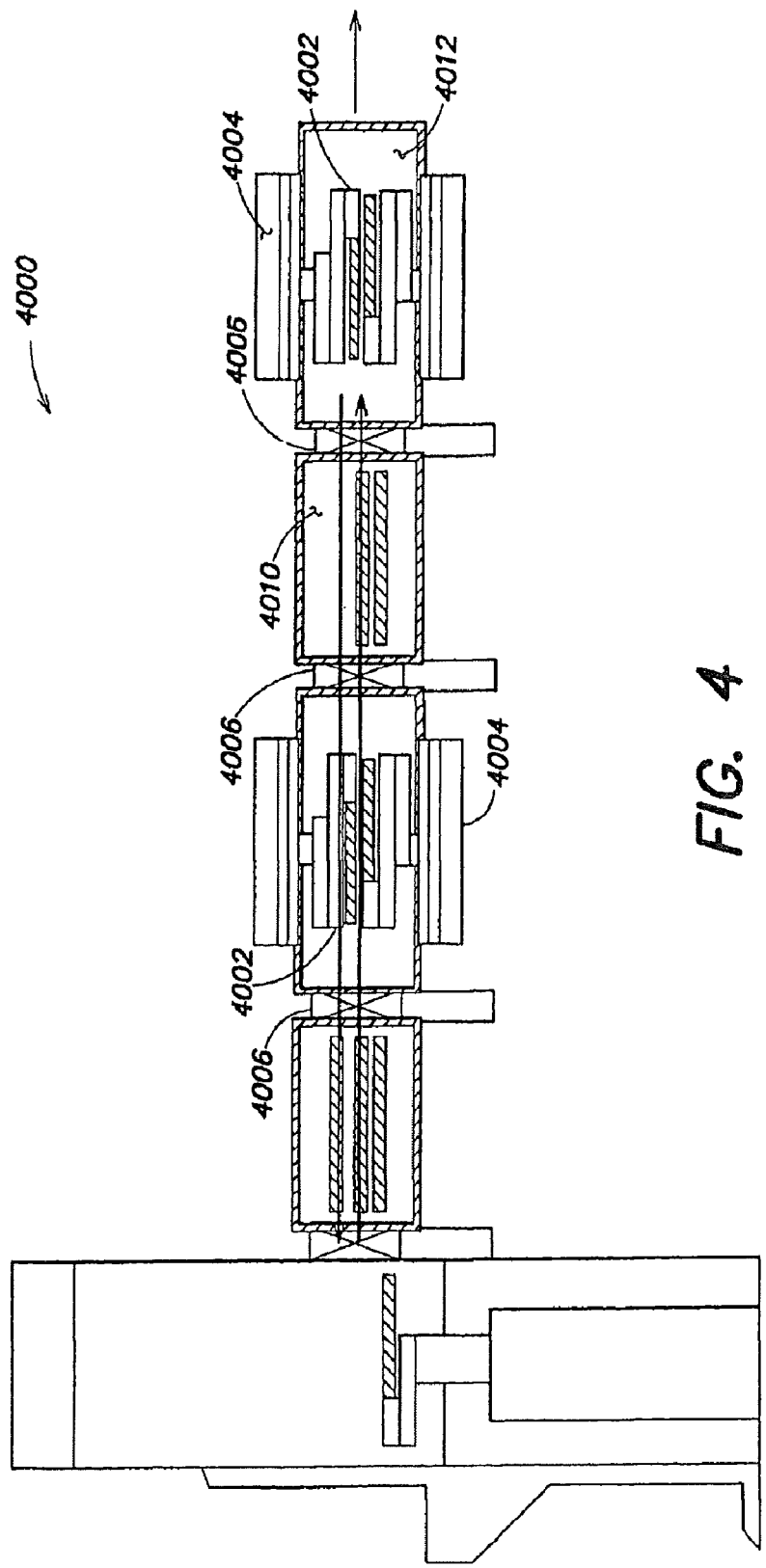
FIG. 4 shows high-level components of a linear processing architecture for handling items in a manufacturing process.

FIG. 4 shows high-level components of a linear processing architecture 4000 for handling items in a manufacturing process. The architecture uses two or more stationary robots 4002 arranged in a linear fashion. The robots 4002 can be either mounted in the bottom of the system or hang down from the chamber lid or both at the same time. The linear system uses a vacuum chamber 4012 around the robot. The system could be comprised of multiple connected vacuum chambers 4012, each with a vacuum chamber 4012 containing its own robot arranged in a linear fashion. In embodiments, a single controller could be set up to handle one or more sections of the architecture. In embodiments vacuum chambers 4012 sections are extensible; that is, a manufacturer can easily add additional sections/chambers 4012 and thus add process capacity, much more easily than with cluster architectures. Because each section uses independent robot drives 4004 and arms 4002, the throughput may stay high when additional sections and thus robots are added. By contrast, in cluster tools, when the manufacturer adds process chambers 2002, the system increases the load for the single robot, even if that robot is equipped with a dual arm, eventually the speed of the robot can become the limiting factor. In embodiments, systems address this problem by adding additional robot arms 4002 into a single drive. Other manufacturers have used a 4-axis robot with two completely independent arms such as a dual SCARA or dual Frog-leg robots. The linear system disclosed herein may not be limited by robot capacity, since each section 4012 contains a robot, so each section 4012 is able to transport a much larger volume of material than with cluster tools.

In embodiments the components of the system can be controlled by a software controller, which in embodiments may be a central controller that controls each of the components. In embodiments the components form a linkable handling system under control of the software, where the software controls each robot to hand off a material to another robot, or into a buffer for picking up by the next robot. In embodiments the software control system may recognize the addition of a new component, such as a process module or robot, when that component is plugged into the system, such as recognizing the component over a network, such as a USB, Ethernet, firewire, Bluetooth, 802.11a, 802.11a, 802.11g or other network. In such embodiments, as soon as the next robot, process module, or other component is plugged in a software scheduler for the flow of a material to be handled, such as a wafer, can be reconfigured automatically so that the materials can be routed over the new link in the system. In embodiments the software scheduler is based on a neural net, or it can be a rule-based scheduler. In embodiments process modules can make themselves known over such a network, so that the software controller knows what new process modules, robots, or other components have been connected. When a new process module is plugged into an empty facet, the system can recognize it and allow it to be scheduled into the flow of material handling.

In embodiments the software system may include an interface that permits the user to run a simulation of the system. The interface may allow a user to view the linking and configuration of various links, robotic arms and other components, to optimize configuration (such as by moving the flow of materials through various components, moving process modules, moving robots, or the like), and to determine what configuration to purchase from a supplier. In embodiments the interface may be a web interface.

The methods and system disclosed herein can use optional buffer stations 4010 between robot drives. Robots could hand off to each other directly, but that is technically more difficult to optimize, and would occupy two robots, because they would both have to be available at the same time to do a handoff, which is more restrictive than if they can deposit to a dummy location 4010 in-between them where the other robot can pick up when it is ready. The buffer 4010 also allows higher throughput, because the system does not have to wait for both robots to become available. Furthermore, the buffers 4010 may also offer a good opportunity to perform some small processing steps on the wafer such as heating, cooling, aligning, inspection, metrology, testing or cleaning.

In embodiments, the methods and systems disclosed herein use optional vacuum isolation valves 4006 between robot areas/segments 4012. Each segment 4012 can be fully isolated from any other segment 4012. If a robot handles ultra clean and sensitive materials (e.g., wafers) in its segment 4012, then isolating that segment 4012 from the rest of the system may prevent cross-contamination from the dirtier segment 4012 to the clean segment 4012. Also the manufacturer can now operate segments 4012 at different pressures. The manufacturer can have stepped vacuum levels where the vacuum gets better and better further into the machine. The big advantage of using vacuum isolation valves 4006 between segments 4012 may be that handling of atomically clean wafers (created after cleaning steps and needing to be transported between process modules without contamination from the environment) can be done without out-gassing from materials or wafers in other parts of the system entering the isolated chamber segment 4012.

In embodiments, vacuum isolation between robots is possible, as is material buffering between robots, such as using a buffer module 4010, a mini-process module or an inspection module 4010.

Figure 5:
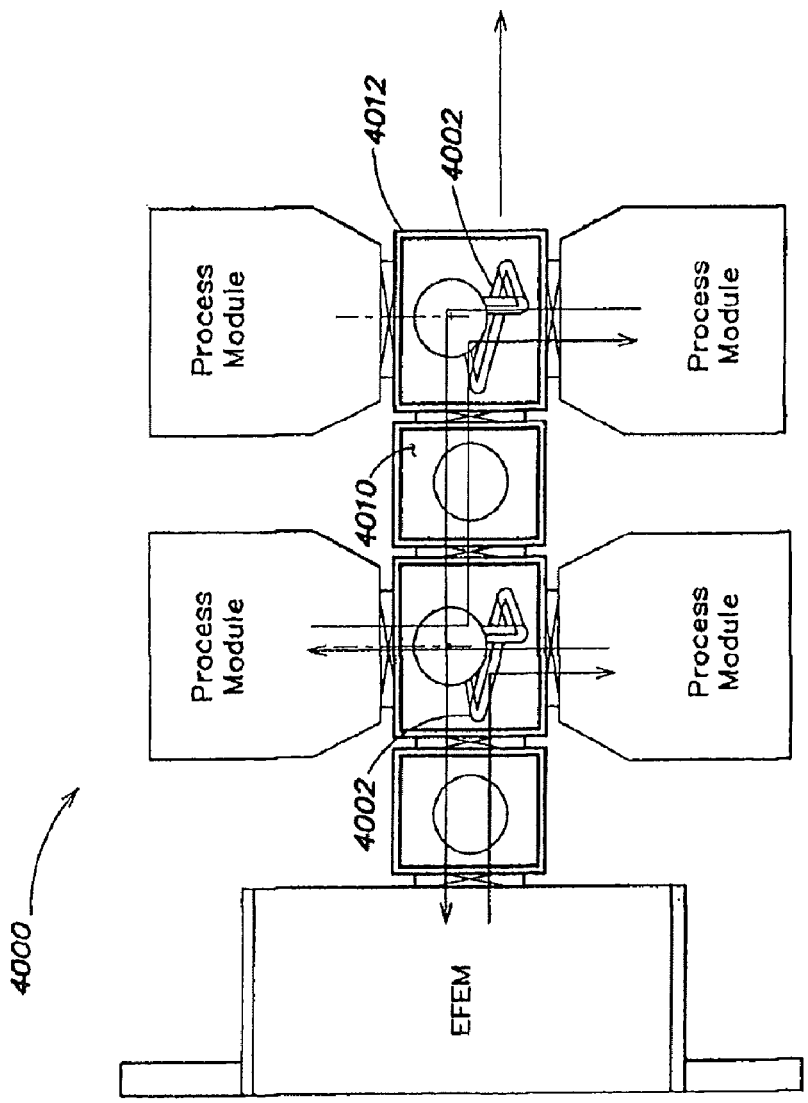
FIG. 5 shows a top view of a linear processing system, such as one with an architecture similar to that of FIG. 4.

FIG. 5 shows a top view of a linear processing system 4000, such as one with a linear architecture similar to that of FIG. 4.

Different forms of robots can be used in semiconductor manufacturing equipment, whether a cluster tool or a linear processing machine such as disclosed in connection with FIGS. 4 and 5.

Figures 6A, 6B:
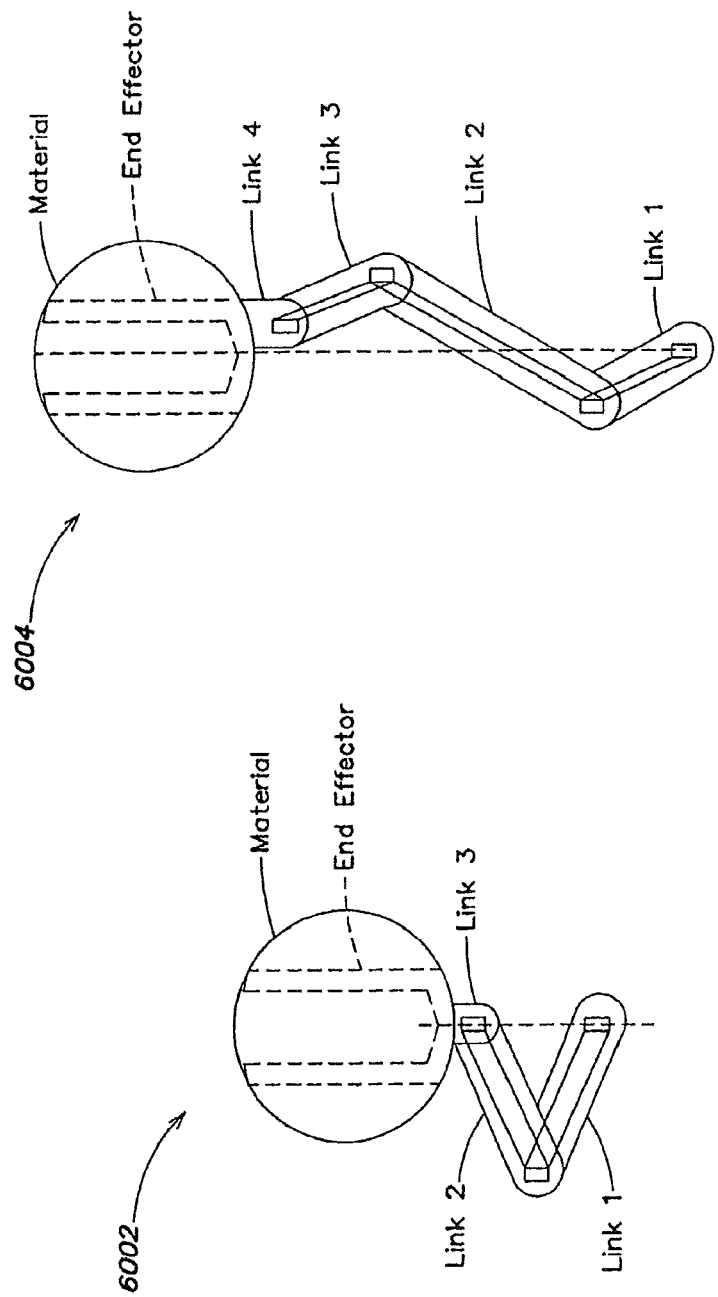
FIG. 6 shows a 3-link SCARA arm and a 4-link SCARA arm.

FIG. 6 shows a 3-link SCARA arm 6002 and a 4-link SCARA arm 6004. The 3-link or 4-link arms 6002, 6004 are driven by a robot drive. The 3-link arm 6002 is commonly used in industry. When the 3-link SCARA arm 6002 is used, the system is not optimized in that the reach-to-containment ratio is not very good. Thus, the vacuum chambers need to be bigger, and since costs rise dramatically with the size of the vacuum chamber, having a 3-link SCARA arm 6002 can increase the cost of the system. Also the overall footprint of the system becomes bigger with the 3-link SCARA arm 6002. Moreover, the reach of a 3-link SCARA arm 6002 is less than that of a 4-link arm 6004. In some cases a manufacturer may wish to achieve a large, deep handoff into a process module, and the 4-link arm 6004 reaches much farther beyond its containment ratio. This has advantages in some non-SEMI-standard process modules. It also has advantages when a manufacturer wants to cover large distances between segments.

The 4-link arm 6004 is advantageous in that it folds in a much smaller containment ratio than a 3-link SCARA arm 6002, but it reaches a lot further than a conventional 3-link SCARA 6002 for the same containment diameter. In combination with the ability to have a second drive and second 4-link arm 6004 mounted on the top of the system, it may allow for a fast material swap in the process module. The 4-link SCARA arm 6004 may be mounted, for example, on top of a stationary drive as illustrated, or on top of a moving cart that provides the transmission of the rotary motion to actuate the arms and belts. In either case, the 4-link arm 6004, optionally together with a second 4-link arm 6004, may provide a compact, long-reach arm that can go through a small opening, without colliding with the edges of the opening.

Figure 7:
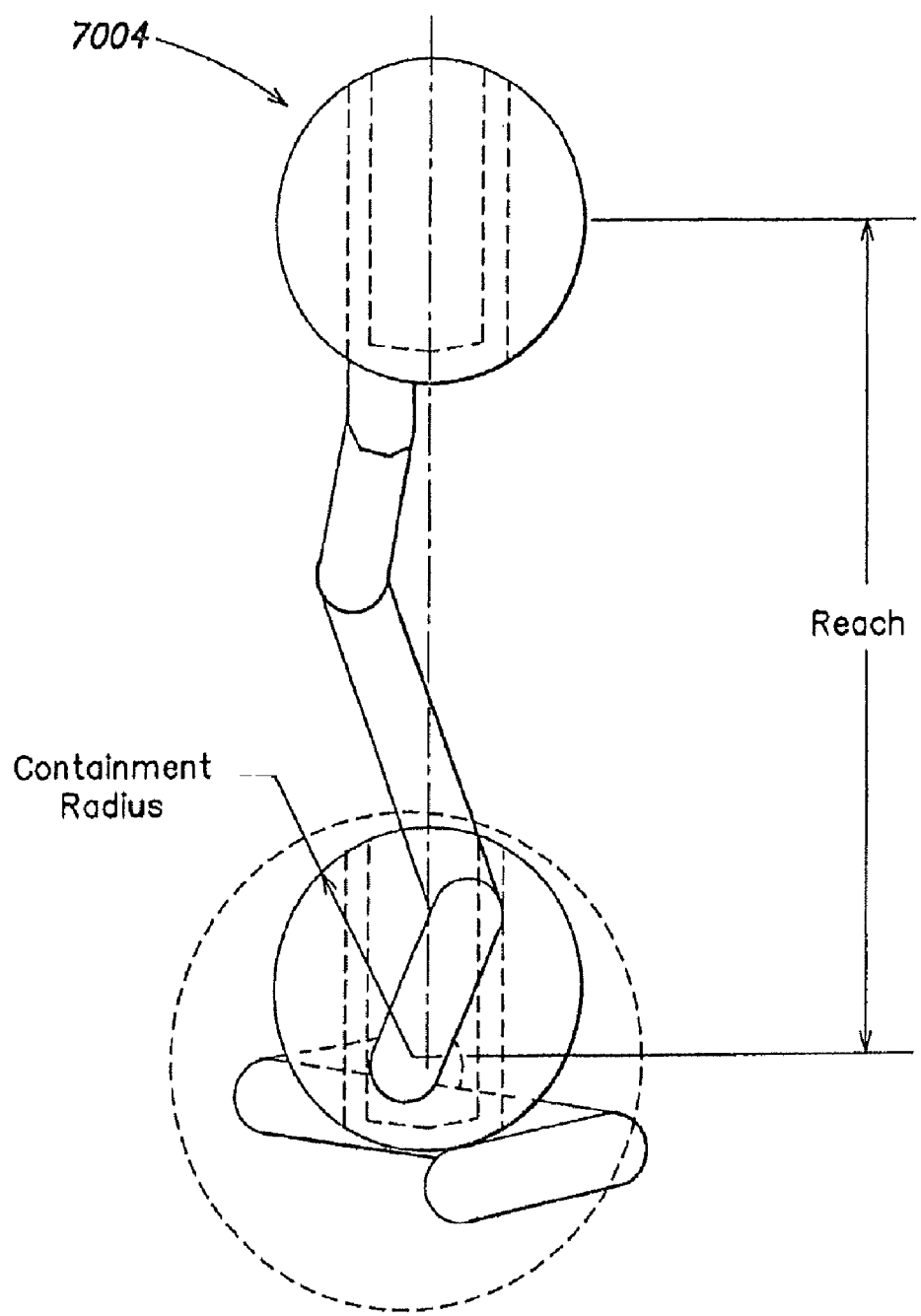
FIG. 7 shows reach and containment characteristics of a SCARA arm.

FIG. 7 shows reach and containment characteristics of a 4-link SCARA arm 7004. In embodiments, the 4-link SCARA arm 7004 link lengths are not constrained by the optimization of reach to containment ratio as in some other systems. Optimization of the reach to containment ratio may lead to a second arm member that is too long. When the arm reaches through a slot valve that is placed as close as practical to the minimum containment diameter, this second arm member may collide with the inside edges of the slot valve. Thus the second (and third) links may be dimensioned based on collision avoidance with a slot valve that the arm is designed to reach through. This results in very different ratios between L1, L2 and L3. The length of L2 may constrain the length of L3. An equation for optimum arm length may be a $4^{th}$ power equation amenable to iterative solutions.

Figure 8:
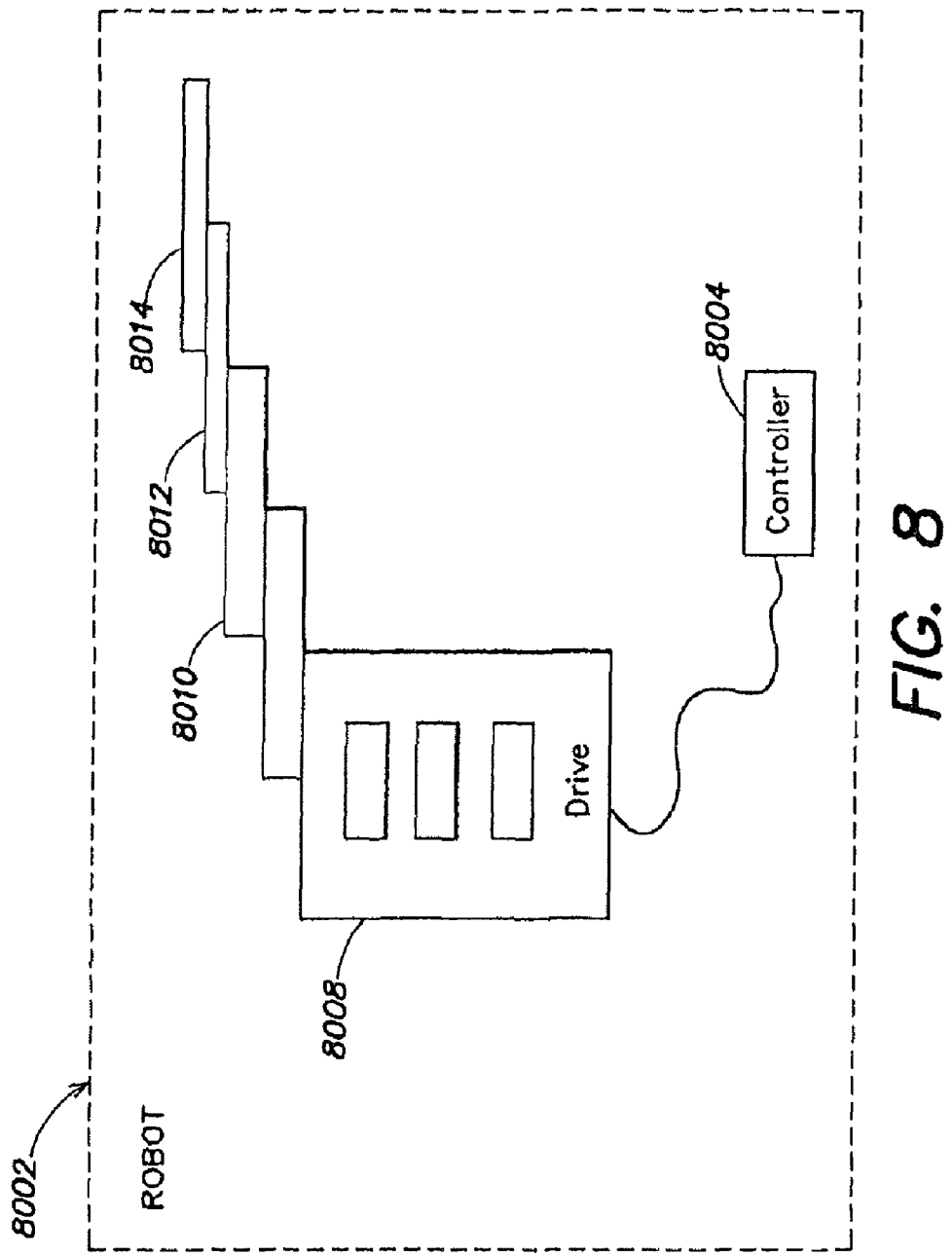
FIG. 8 shows high-level components for a robot system.

FIG. 8 shows high-level components for a robot system 8002, including a controller 8004, a drive/motor 8008, an arm 8010, an end effector 8012, and a material to be handled 8014.

Figure 9:
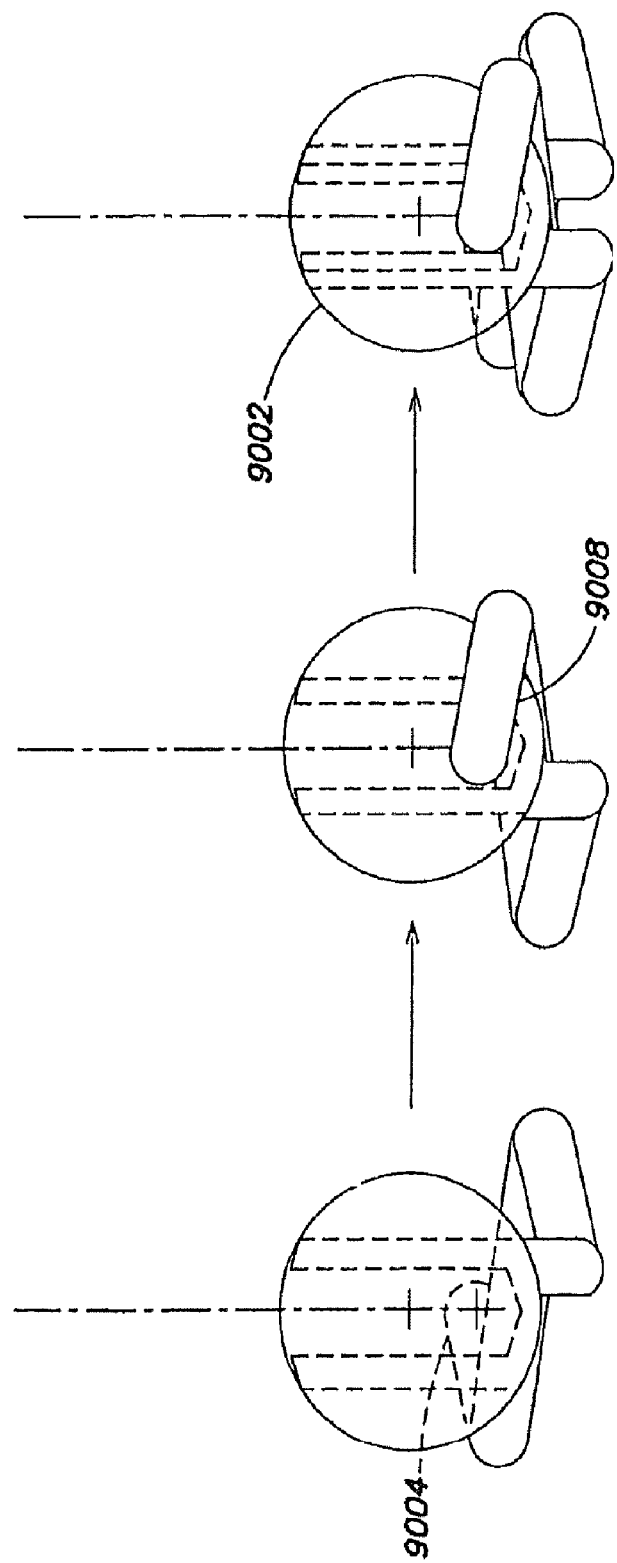
FIG. 9 shows components of a dual-arm architecture for a robotic arm system for use in a handling system.

FIG. 9 shows components of a dual-arm 9002 architecture for a robotic arm system for use in a handling system. One arm is mounted from the bottom 9004 and the other from the top 9008. In embodiments both are 4-link SCARA arms. Mounting the second arm on the top is advantageous. In some other systems arms have been connected to a drive that is mounted through the top of the chamber, but the lower and upper drives are conventionally mechanically coupled. In embodiments, there is no mechanical connection between the two drives in the linear system disclosed in connection with FIG. 4 and FIG. 5; instead, the coordination of the two arms (to prevent collisions) may be done in a software system or controller. The second (top) arm 9008 may optionally be included only if necessary for throughput reasons.

Another feature is that only two motors, just like a conventional SCARA arm, may be needed to drive the 4-link arm. Belts in the arm may maintain parallelism. Parallelism or other coordinated movements may also be achieved, for example, using parallel bars instead of belts. Generally, the use of only two motors may provide a substantial cost advantage. At the same time, three motors may provide a functional advantage in that the last (L4) link may be independently steered, however the additional belts, bearings, connections, shafts and motor may render the system much more expensive. In addition the extra belts may add significant thickness to the arm mechanism, making it difficult to pass the arm through a (SEMI standard) slot valve. Also, the use of fewer motors generally simplifies related control software.

Another feature of the 4-link SCARA arm disclosed herein is that the wrist may be offset from centerline. Since the ideal system has a top-mount 9008 as well as a bottom 9004 mount 4-link arm, the vertical arrangement of the arm members may be difficult to adhere to if the manufacturer also must comply with the SEMI standards. In a nutshell, these standards specify the size and reach requirements through a slot valve 4006 into a process module. They also specify the level above centerline on which a wafer has to be carried. Many existing process modules are compliant with this standard. In systems that are non-compliant, the slot valves 4006 are of very similar shape although the opening size might be slightly different as well as the definition of the transfer plane. The SEMI standard dimensional restrictions require a very compact packaging of the arms. Using an offset wrist allows the top 9008 and bottom 9004 arms to get closer together, making it easier for them to pass through the slot valve 4006. If the wrist is not offset, then the arms need to stay further apart vertically and wafer exchanges may take more time, because the drives need to move more in the vertical direction. The proposed design of the top arm does not require that there is a wrist offset, but a wrist offset may advantageously reduce the turn radius of the system, and allows for a better mechanical arm layout, so no interferences occur.

Figure 10:
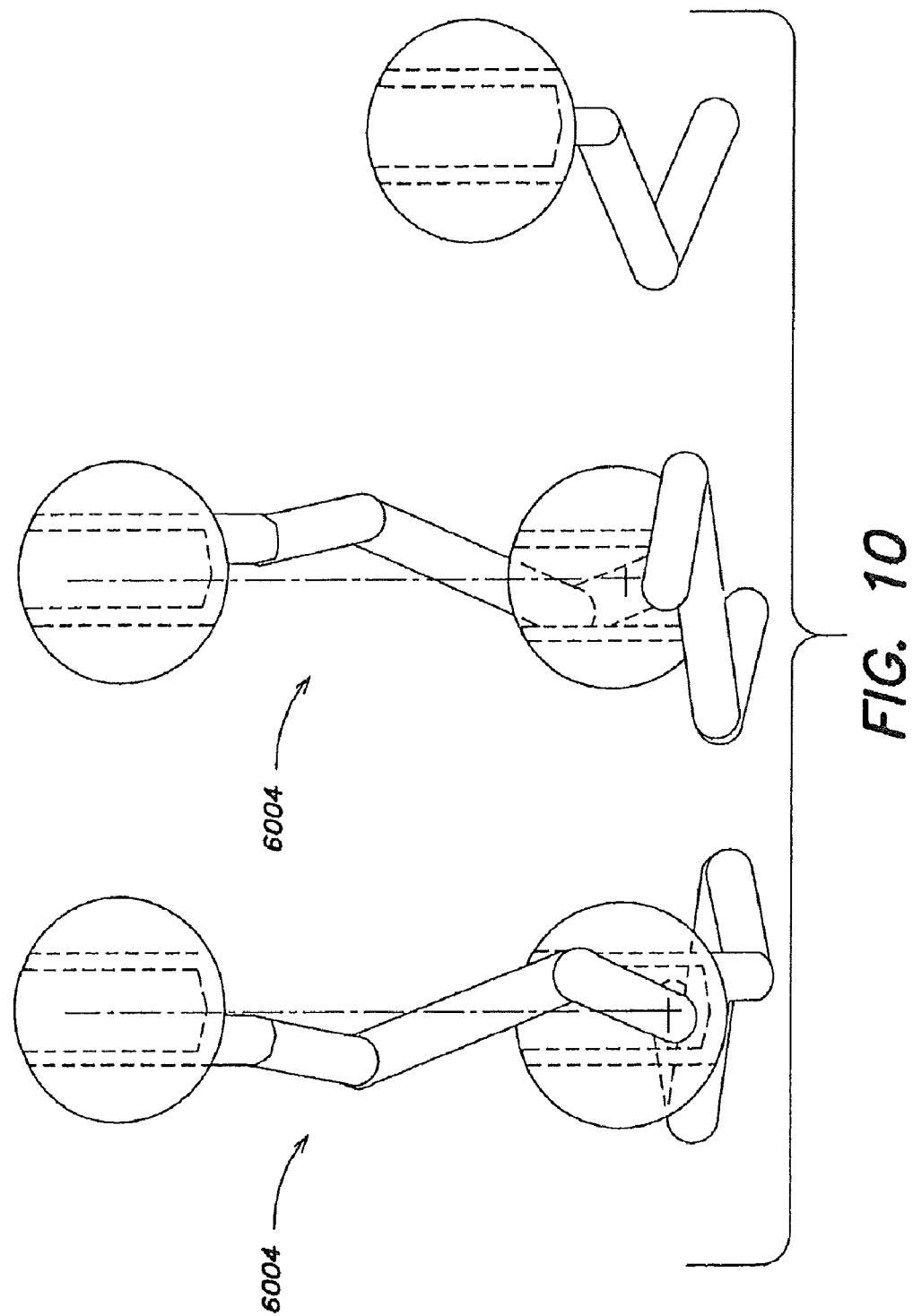
FIG. 10 shows reach and containment capabilities of a 4-link SCARA arm.

FIG. 10 shows reach and containment capabilities of a 4-link SCARA arm 6004.

Figure 11B:
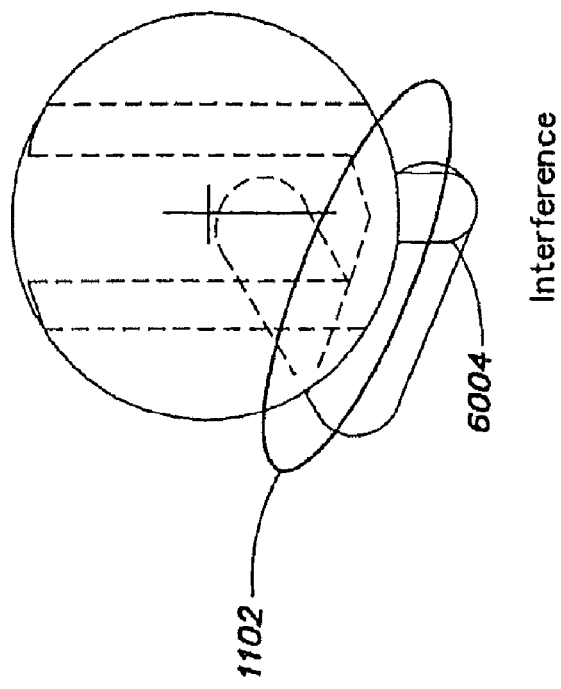
FIG. 11 shows interference characteristics of a 4-link SCARA arm.
Figure 11A:
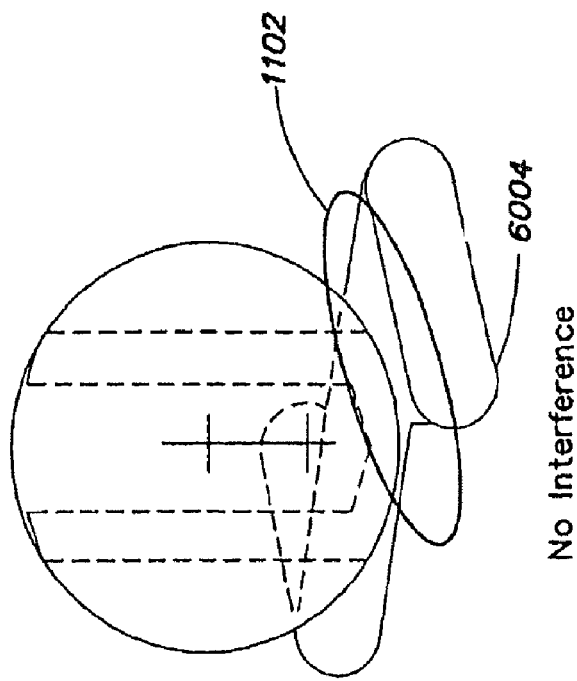

FIG. 11 shows interference characteristics 1102 of a 4-link SCARA arm 6004. The wrist offset may help to fold the arm in a smaller space than would otherwise be possible.

Figure 12:
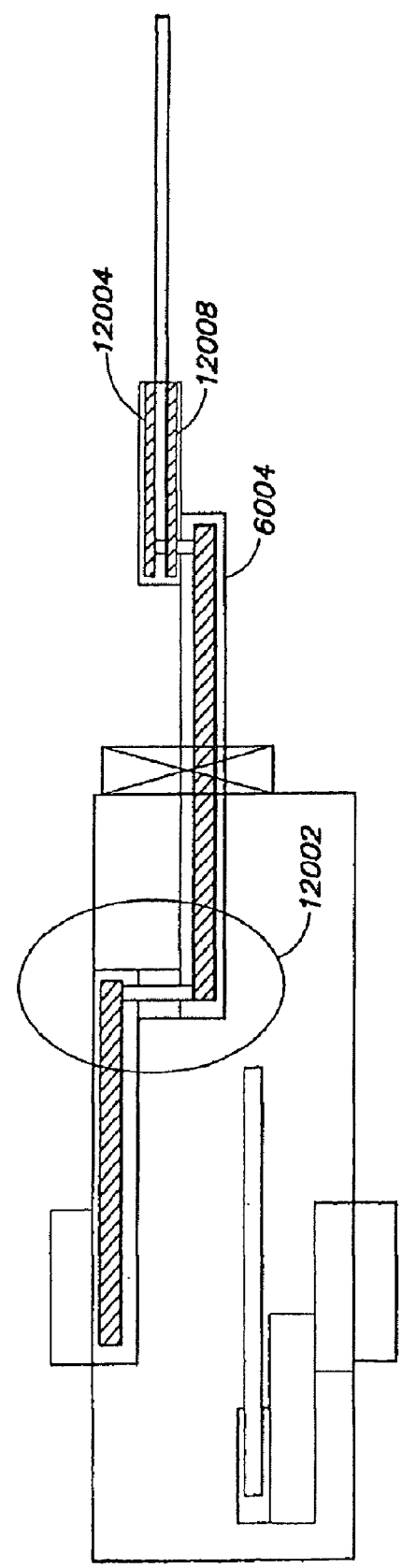
FIG. 12 shows a side view of a dual-arm set of 4-link SCARA arms using belts as the transmission mechanism.

FIG. 12 shows a side view of a dual-arm set of 4-link SCARA arms 6004. Because of the packaging constraints of particularly the top arm, it may be necessary to construct an arm that has some unique features. In embodiments, one link upon retracting partially enters a cutout in another arm link. Belts can be set in duplicate, rather than a single belt, so that one belt is above 12004 and one below 12008 the cutout. One solution, which is independent of the fact that this is a 4-link arm, is to make L2 significantly lower 12002, with a vertical gap to L1, so that L3 and L4 can fold inside. Lowering L2 12002 may allow L3 and L4 to reach the correct transfer plane and may allow a better containment ratio. Because of the transfer plane definition, the lowering of L2 12002 may be required.

FIG. 13 shows an embodiment in which a combination of belts and linkages is used. The transmission of motion through L1 13002 and L3 13006 may be accomplished by either a single belt or a dual belt arrangement. In contrast, the motion transmission in L2 13004 may be accomplished by a mechanical linkage (spline) 13010. The advantage of such an arrangement may be that enclosed joints can be used which reduces the vertical dimension of the arm assembly that may allow an arm to more easily pass through a SEMI standard slot valve.

Figure 14:
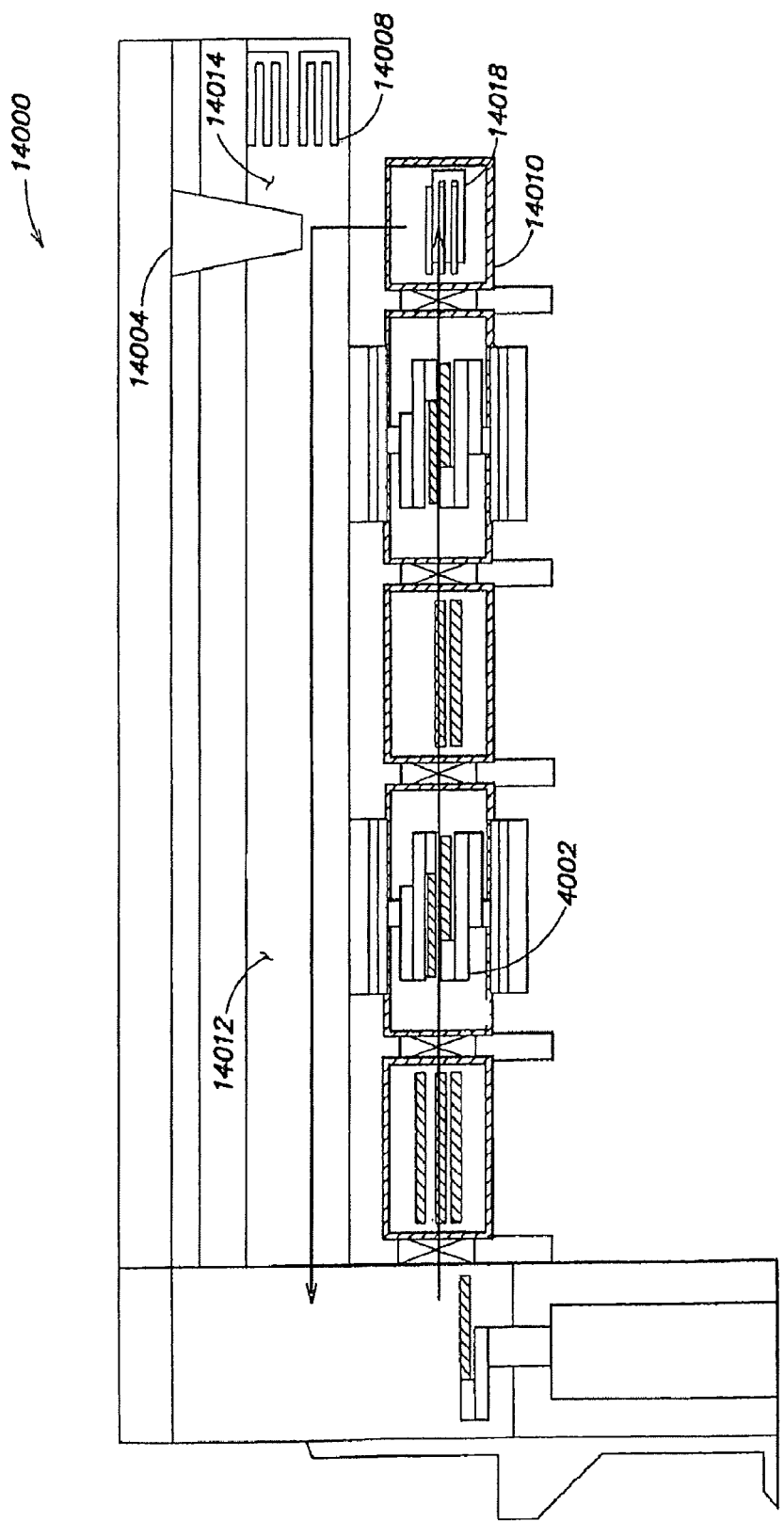
FIG. 14 shows an external return system for a handling system having a linear architecture.
Figure 14A:
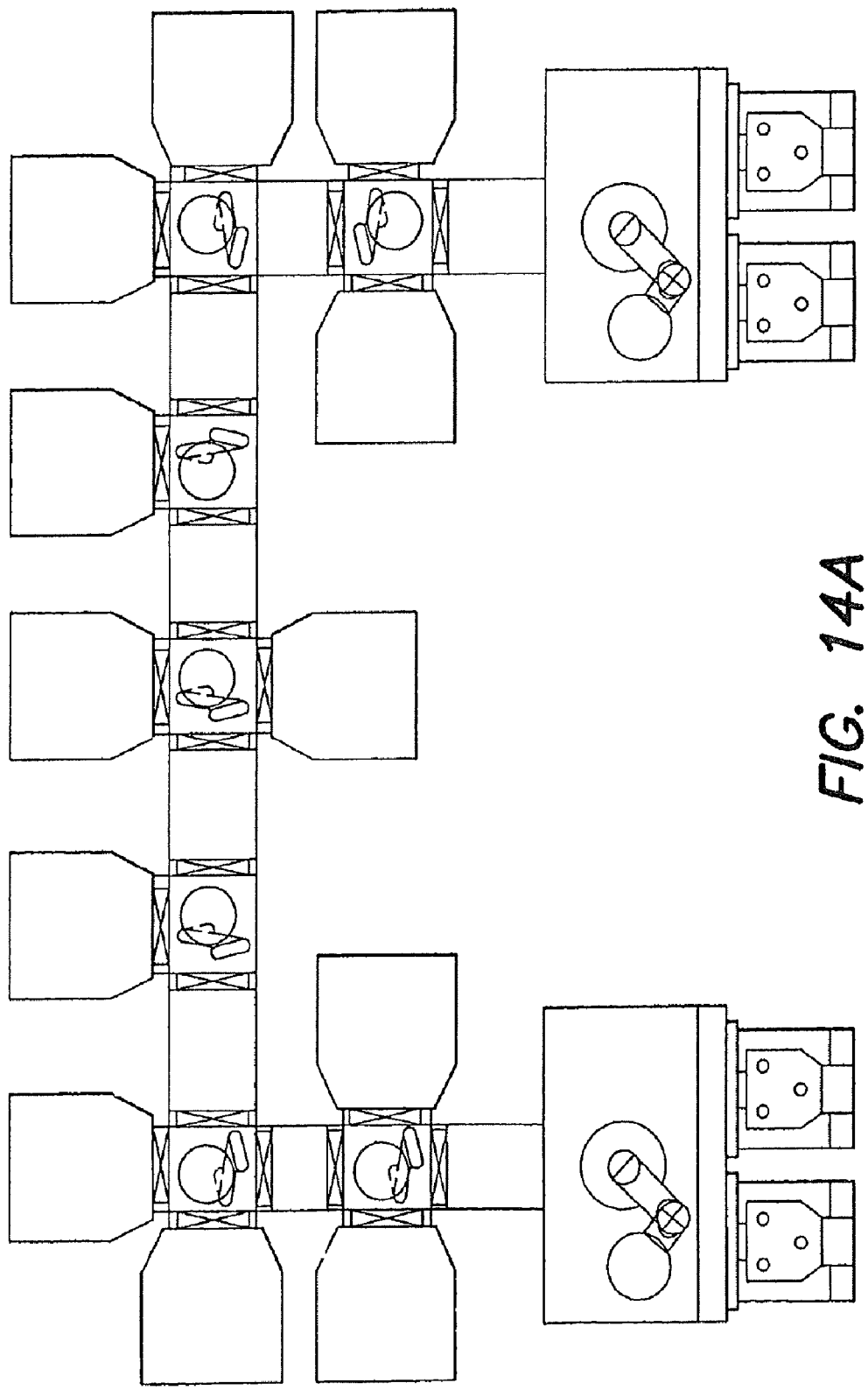
FIG. 14a shows a U-shaped configuration for a linear handling system.

FIG. 14 shows an external return system for a handling system having a linear architecture 14000. The return mechanism is optionally on the top of the linear vacuum chamber. On conventional vacuum handling systems, the return path is often through the same area as the entry path. This opens up the possibility of cross contamination, which occurs when clean wafers that are moving between process steps get contaminated by residuals entering the system from dirty wafers that are not yet cleaned. It also makes it necessary for the robot 4002 to handle materials going in as well as materials going out, and it makes it harder to control the vacuum environment. By exiting the vacuum system at the rear and moving the wafers on the top back to the front in an air tunnel 14012, there are some significant advantages: the air return may relatively cheap to implement; the air return may free up the vacuum robots 4002 because they do not have to handle materials going out; and the air return may keep clean finished materials out of the incoming areas, thereby lowering cross-contamination risks. Employing a small load lock 14010 in the rear may add some costs, and so may the air tunnel 14012, so in systems that are short and where vacuum levels and cross contamination are not so important, an air return may have less value, but in long systems with many integrated process steps the above-system air return could have significant benefits. The return system could also be a vacuum return, but that would be more expensive and more complicated to implement. It should be understood that while in some embodiments a load lock 14010 may be positioned at the end of a linear system, as depicted in FIG. 14, the load lock 14010 could be positioned elsewhere, such as in the middle of the system. In such an embodiment, a manufacturing item could enter or exit the system at such another point in the system, such as to exit the system into the air return. The advantage of a mid-system exit point may be that in case of a partial system failure, materials or wafers can be recovered. The advantage of a mid-system entry point may be that wafers can be inserted in multiple places in the system, allowing for a significantly more flexible process flow. In effect a mid system entry or exit position behaves like two machines connected together by the mid-system position, effectively eliminating an EFEM position. It should also be understood that while the embodiment of FIG. 14 and subsequent figures is a straight line system, the linear system could be curvilinear; that is, the system could have curves, a U- or V-shape, an S-shape, or a combination of those or any other curvilinear path, in whatever format the manufacturer desires, such as to fit the configuration of a fabrication facility. In each case the system optionally includes an entry point and an exit point that is down the line (although optionally not a straight line) from the entry point. Optionally the air return returns the item from the exit point to the entry point. Optionally the system can include more than one exit point. In each case the robotic arms described herein can assist in efficiently moving items down the line, without the problems of other linear systems. FIG. 14A shows an example of a U-shaped linear system.

Referring still to FIG. 14, an embodiment of the system uses a dual carrier mechanism 14008 so that wafers that are finished can quickly be returned to the front of the system, but also so that an empty carrier 14008 can be placed where a full one was just removed. In embodiments the air return will feature a carrier 14008 containing N wafers. N can be optimized depending on the throughput and cost requirements. In embodiments the air return mechanism may contain empty carriers 14008 so that when a full carrier 14018 is removed from the vacuum load lock 14010, a new empty carrier 14008 can immediately be placed and load lock 14010 can evacuated to receive more materials. In embodiments the air return mechanism may be able to move wafers to the front of the system. At the drop-off point a vertical lift 14004 may be employed to lower the carrier to a level where the EFEM (Equipment Front End Module) robot can reach. At the load lock point(s) the vertical lift 14004 can lower to pick an empty carrier 14008 from the load lock.

In embodiments the air return mechanism may feature a storage area 14014 for empty carriers 14008, probably located at the very end and behind the location of the load lock 14010. The reason for this is that when the load lock 14010 releases a carrier 14018, the gripper 14004 can grip the carrier 14018 and move it forward slightly. The gripper 14004 can then release the full carrier 14018, move all the way back and retrieve an empty carrier 14008, place it on the load lock 14010. At this point the load lock 14010 can evacuate. The gripper 14004 can now go back to the full carrier 14018 and move it all the way to the front of the system. Once the carrier 14018 has been emptied by the EFEM, it can be returned to the very back where it waits for the next cycle.

It is also possible to put the lift in the load lock rather than using the vertical motion in the gripper, but that would be more costly. It would also be slightly less flexible. A manufacturer may want a vertical movement of the carrier 14018 in a few places, and putting it in the gripper 14004 would be more economical because the manufacturer then only needs one vertical mechanism.

Figure 15:
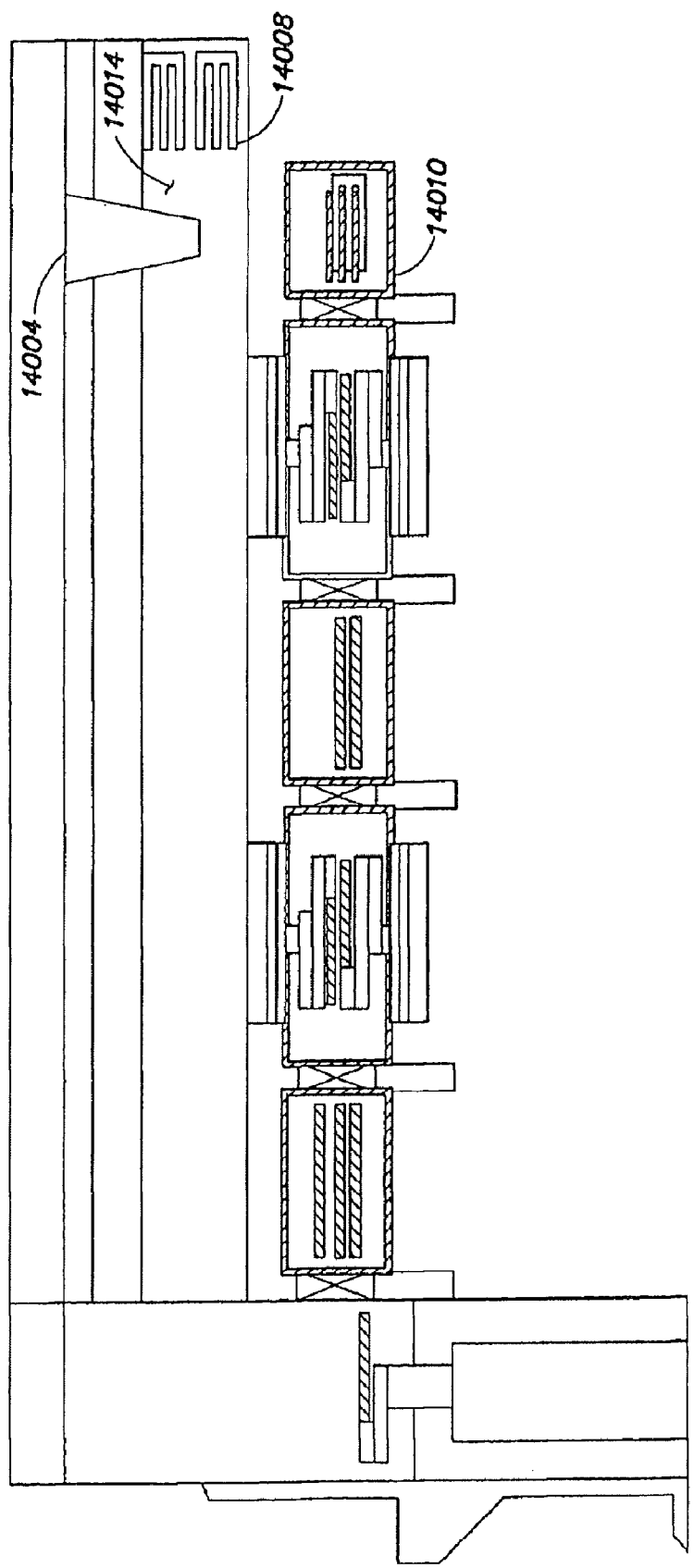
FIG. 15 shows certain details of an external return system for a handling system of FIG. 14.

FIG. 15 shows certain additional details of an external return system for a handling system of FIG. 14.

Figure 16:
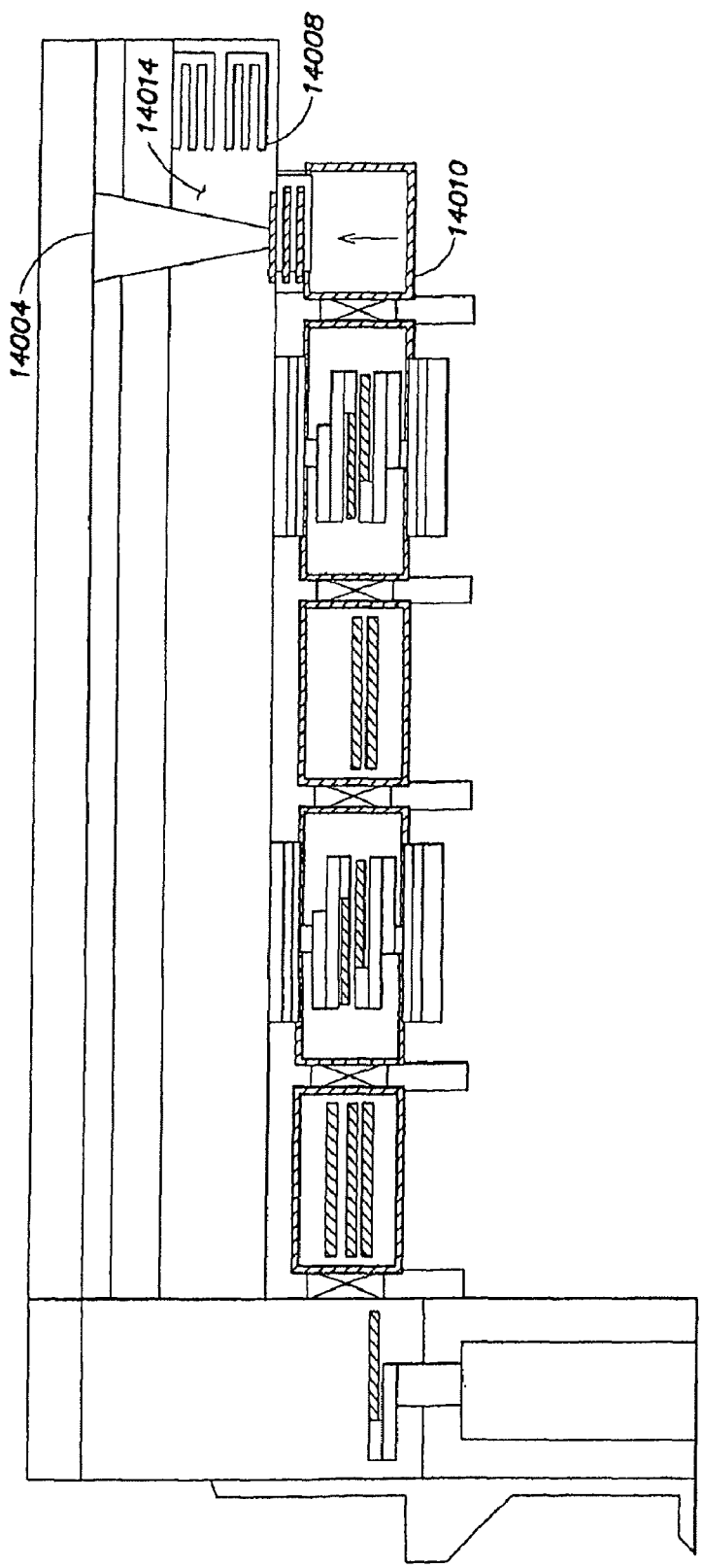
FIG. 16 shows additional details of an external return system for a handling system of FIG. 14.

FIG. 16 shows additional details of an external return system for a handling system of FIG. 14.

Figure 17:
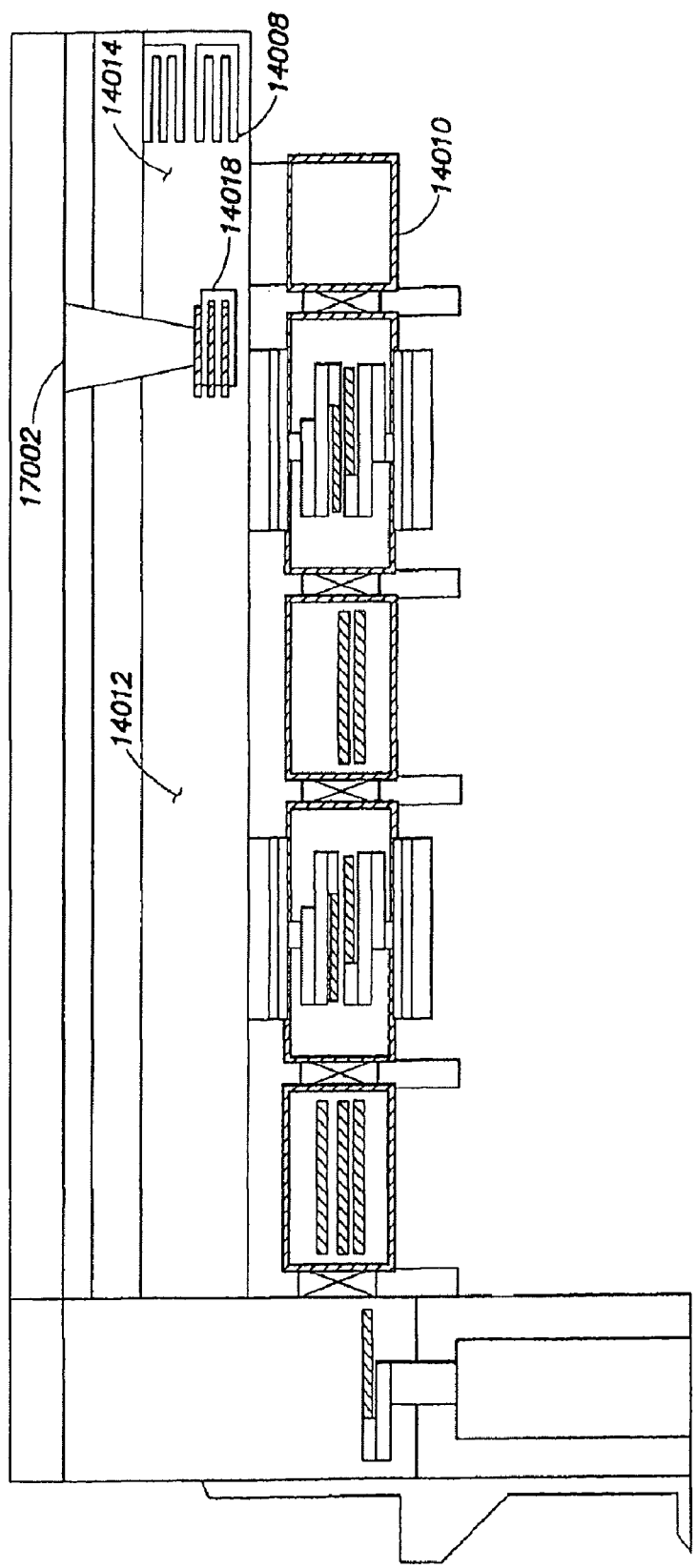
FIG. 17 shows movement of the output carrier in the return system of FIG. 14.

FIG. 17 shows movement of the output carrier 14018 in the return tunnel 14012 of FIG. 14.

Figure 18:
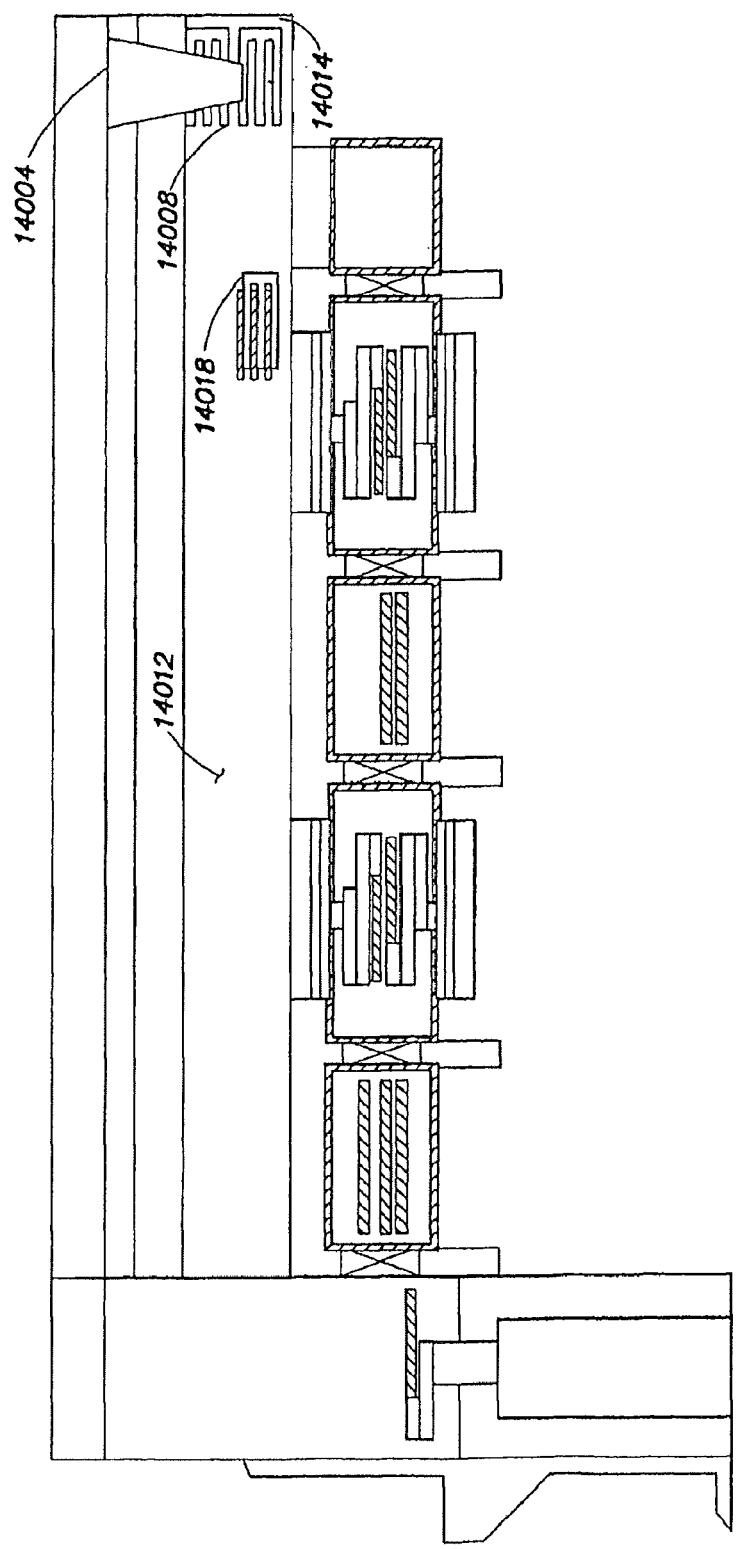
FIG. 18 shows handling of an empty carrier in the return system of FIG. 14.

FIG. 18 shows handling of an empty carrier 14008 in the return system 14012 of FIG. 14.

Figure 19:
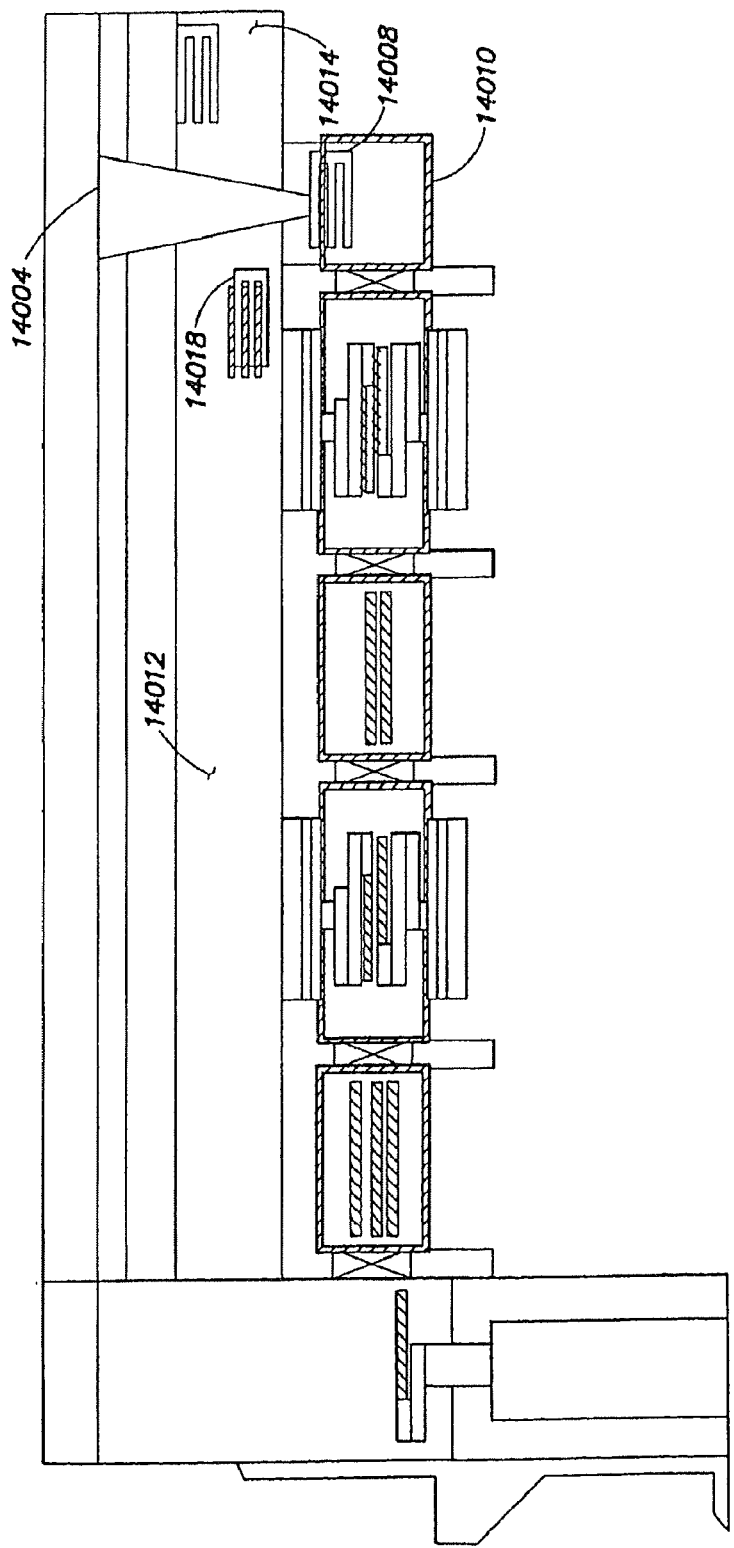
FIG. 19 shows movement of the empty carrier in the return system of FIG. 14 into a load lock position.

FIG. 19 shows movement of the empty carrier 14008 in the return tunnel 14012 of FIG. 14 into a load lock 14010 position.

Figure 20:
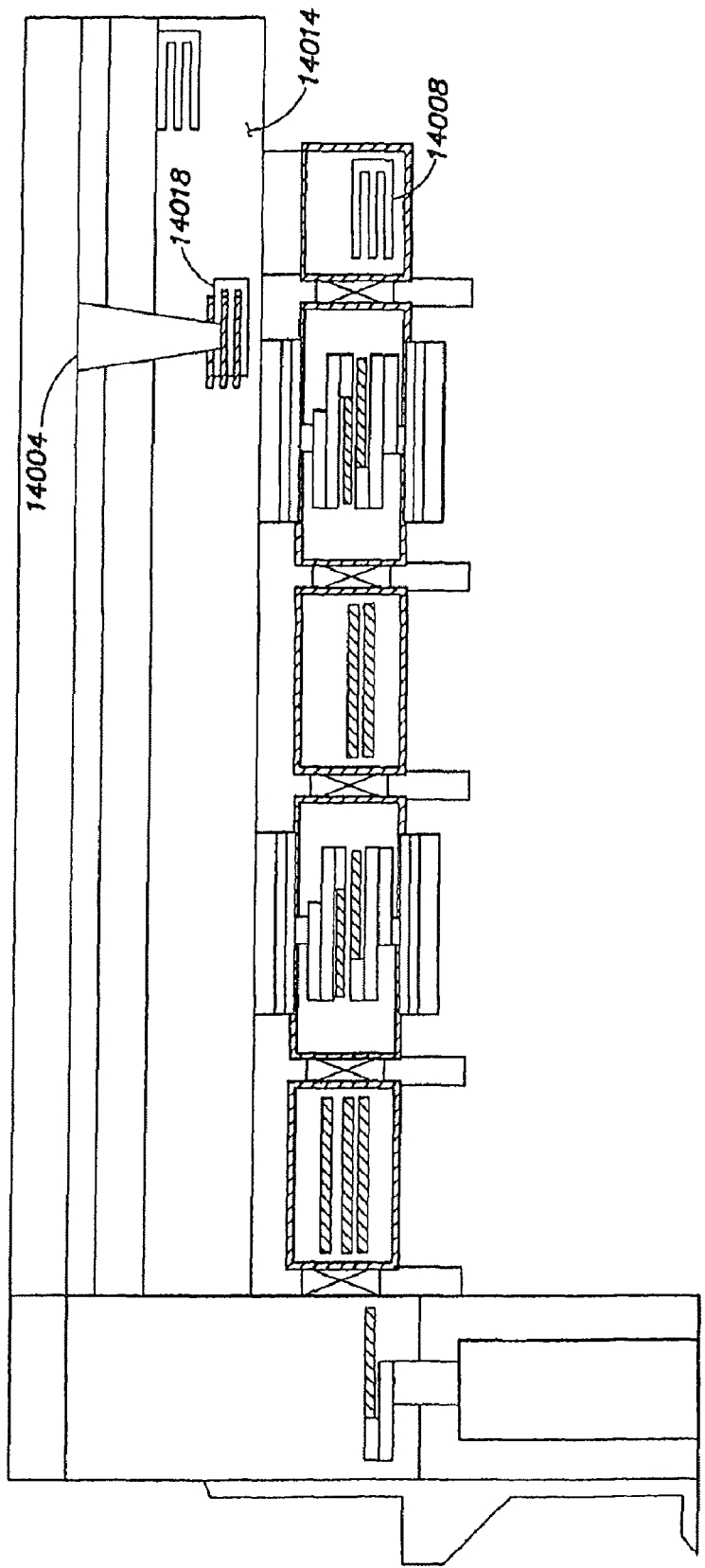
FIG. 20 shows the empty carrier lowered and evacuated and movement of the gripper in the return system of FIG. 14.

FIG. 20 shows the empty carrier 14008 lowered and evacuated and movement of the gripper 14004 in the return system of FIG. 14.

Figure 21:
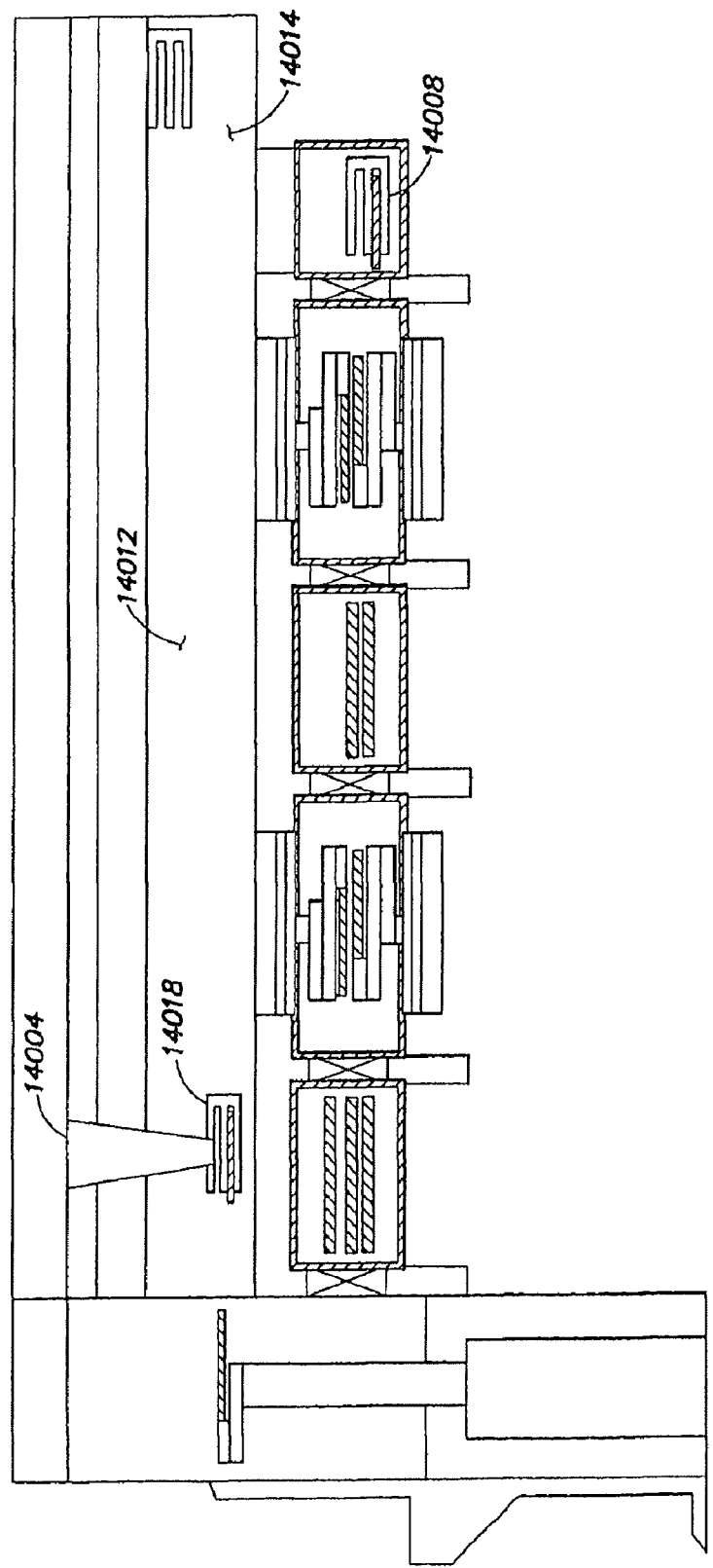
FIG. 21 shows an empty carrier receiving material as a full carrier is being emptied in the return system of FIG. 14.

FIG. 21 shows an empty carrier 14008 receiving material as a full carrier 14018 is being emptied in the return tunnel 14012 of FIG. 14.

Figure 22:
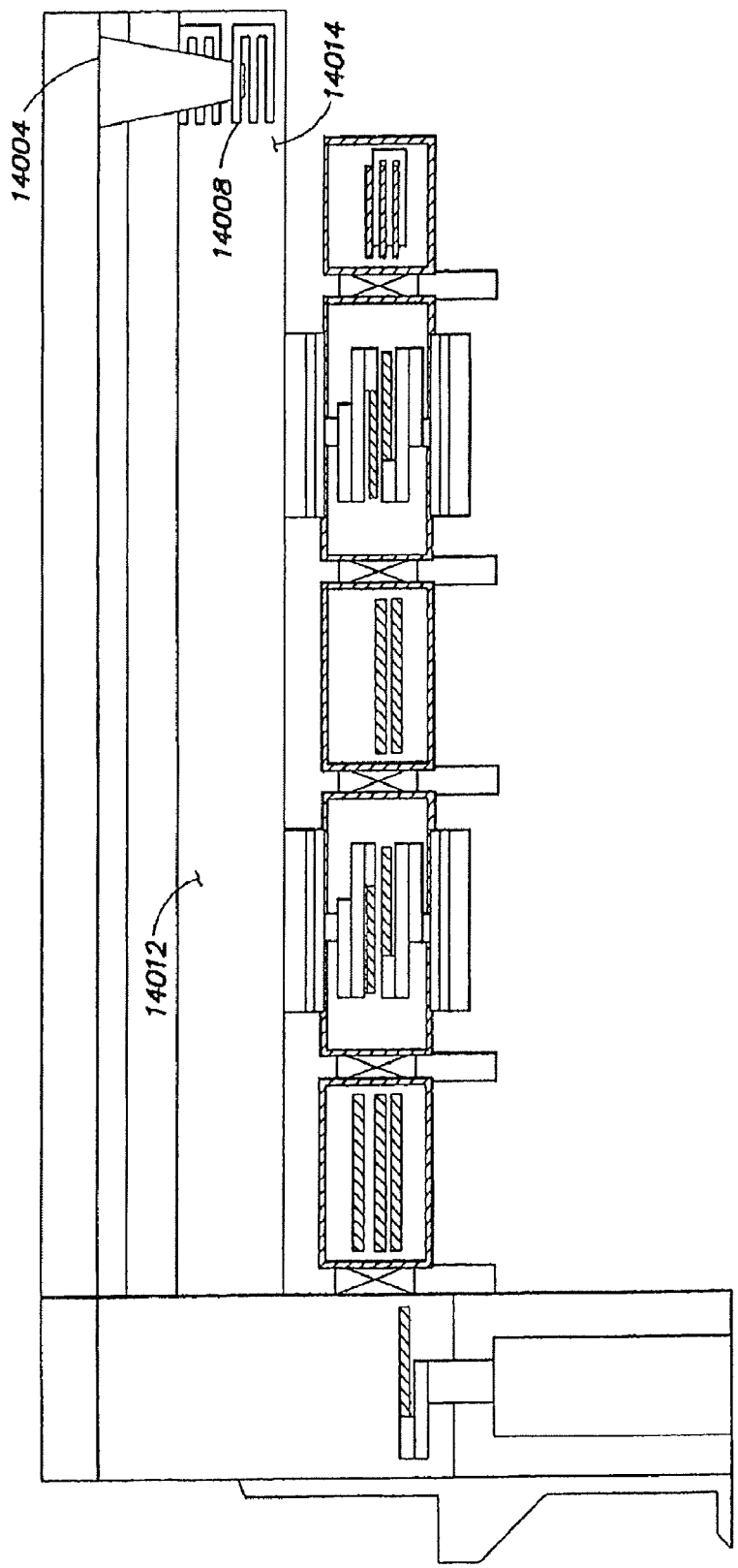
FIG. 22 shows an empty carrier brought to a holding position, starting a new return cycle in the return system of FIG. 14.

FIG. 22 shows an empty carrier 14008 brought to a holding position, starting a new return cycle in the return tunnel 14012 of FIG. 14.

Figure 23:
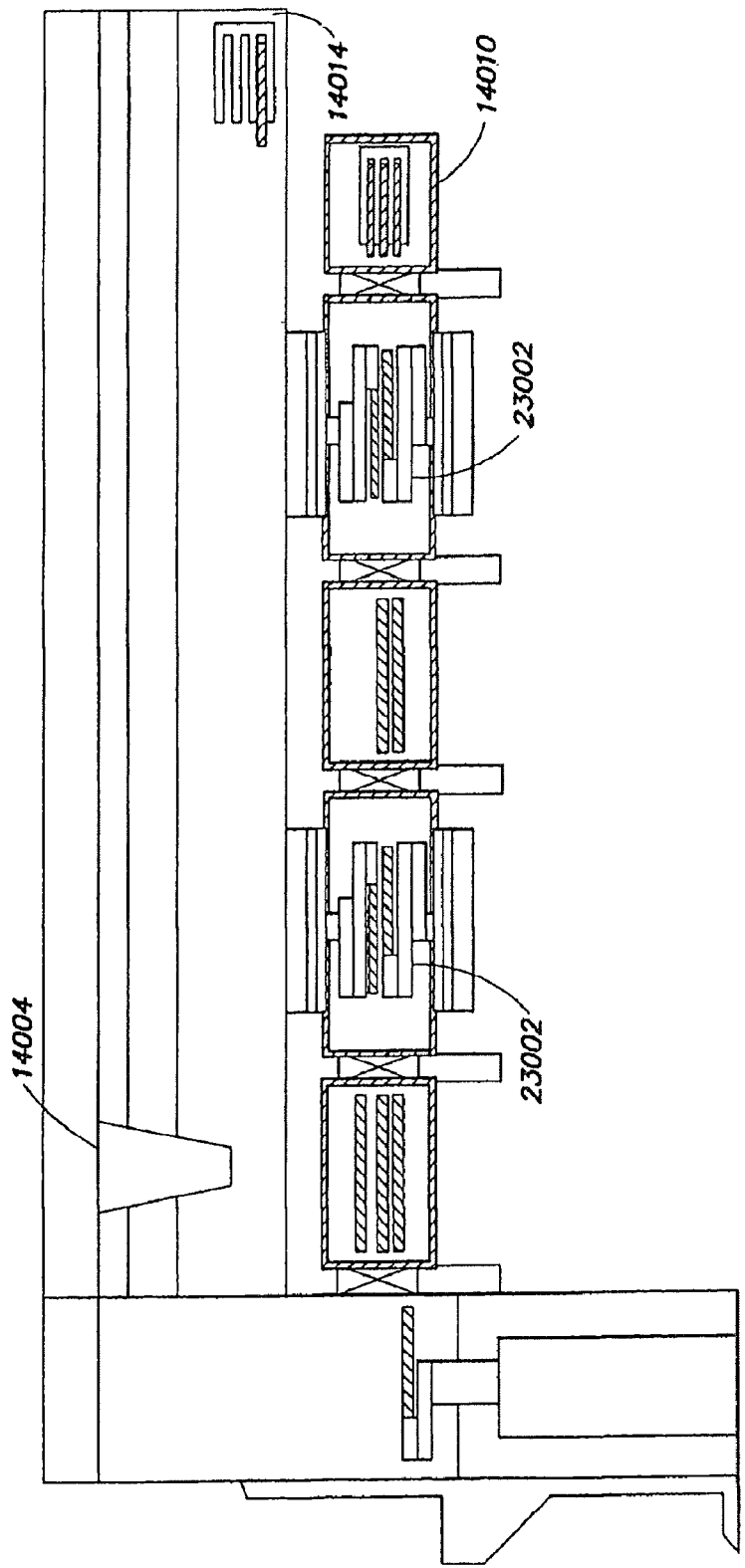
FIG. 23 shows an architecture for a handling facility for a manufacturing process, with a dual-arm robotic arm system and a return system in a linear architecture.

FIG. 23 shows an architecture for a handling facility for a manufacturing process, with a dual-arm robotic arm system 23002 and a return system in a linear architecture.

Figure 24:
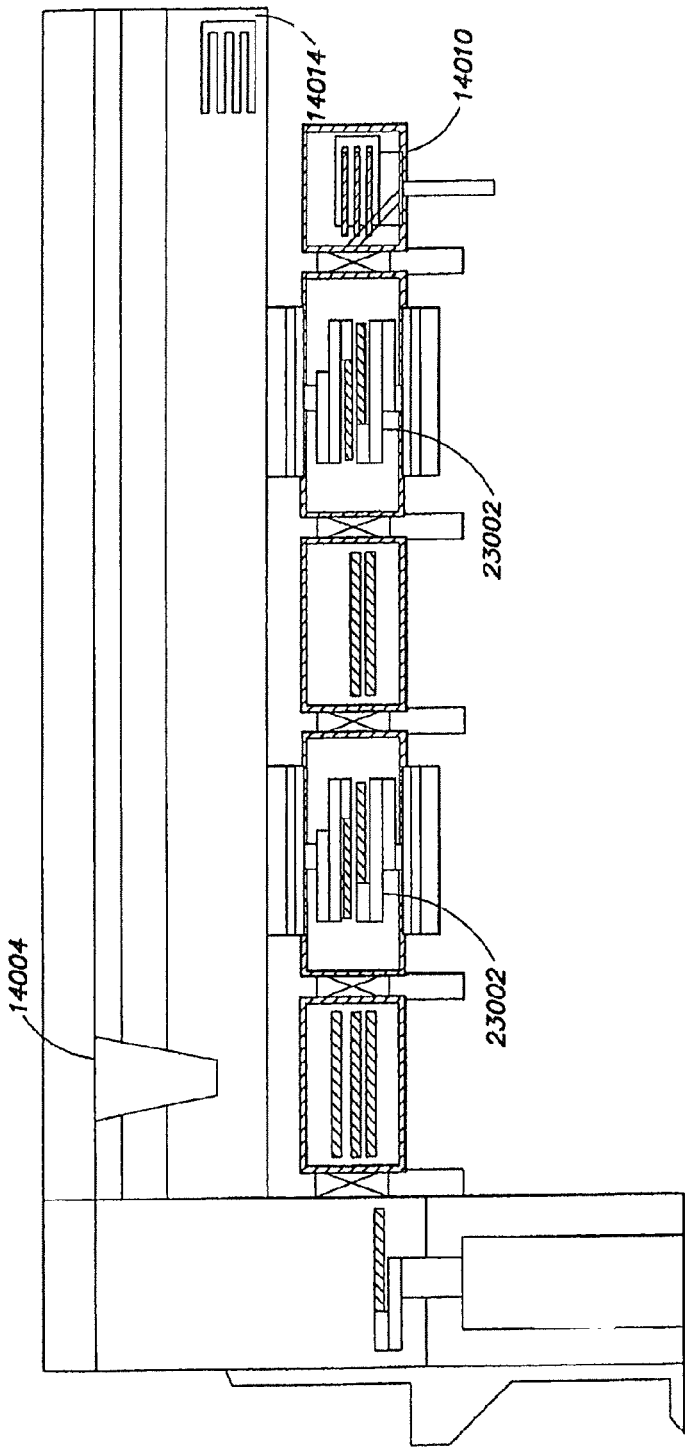
FIG. 24 shows an alternative embodiment of an overall system architecture for a handling method and system of the present invention.

FIG. 24 shows an alternative embodiment of an overall system architecture for a handling method and system of the present invention.

Figure 25B:
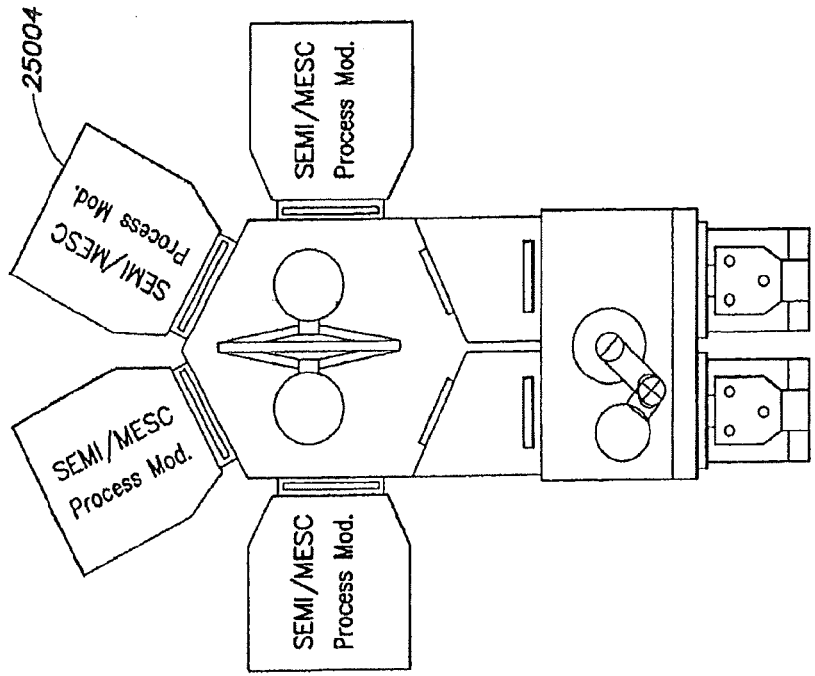
FIG. 25 shows a comparison of the footprint of a linear system as compared to a conventional cluster system.
Figure 25A:
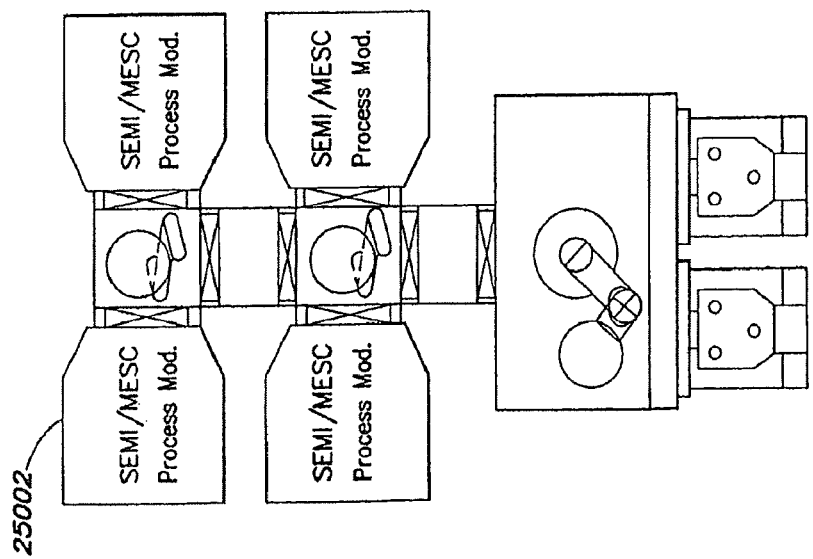

FIG. 25 shows a comparison of the footprint of a linear system 25002 as compared to a conventional cluster system 25004. Note that with the linear system 25002 the manufacturer can easily extend the machine with additional modules without affecting system throughput.

Figure 26:
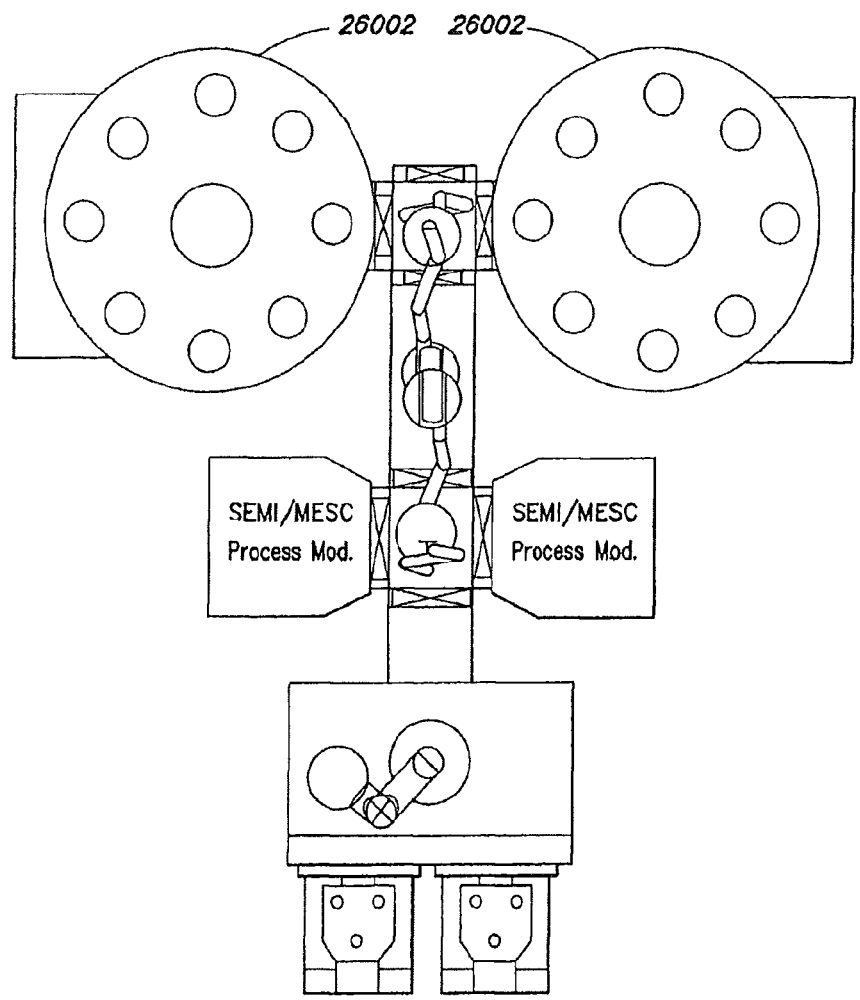
FIG. 26 shows a linear architecture deployed with oversized process modules in a handling system in accordance with embodiments of the invention.

FIG. 26 shows a linear architecture deployed with over-sized process modules 26002 in a handling system in accordance with embodiments of the invention.

Figure 27:
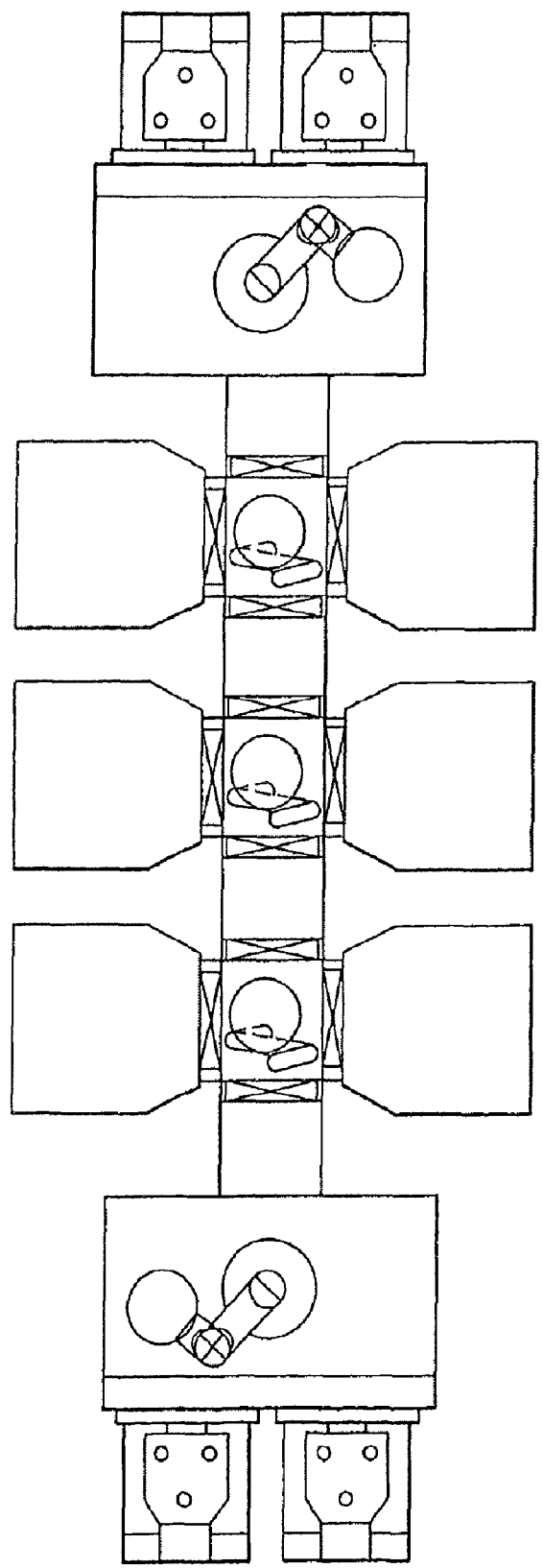
FIG. 27 shows a rear-exit architecture for a handling system in accordance with embodiments of the invention.

FIG. 27 shows a rear-exit architecture for a handling system in accordance with embodiments of the invention.

Figure 28:
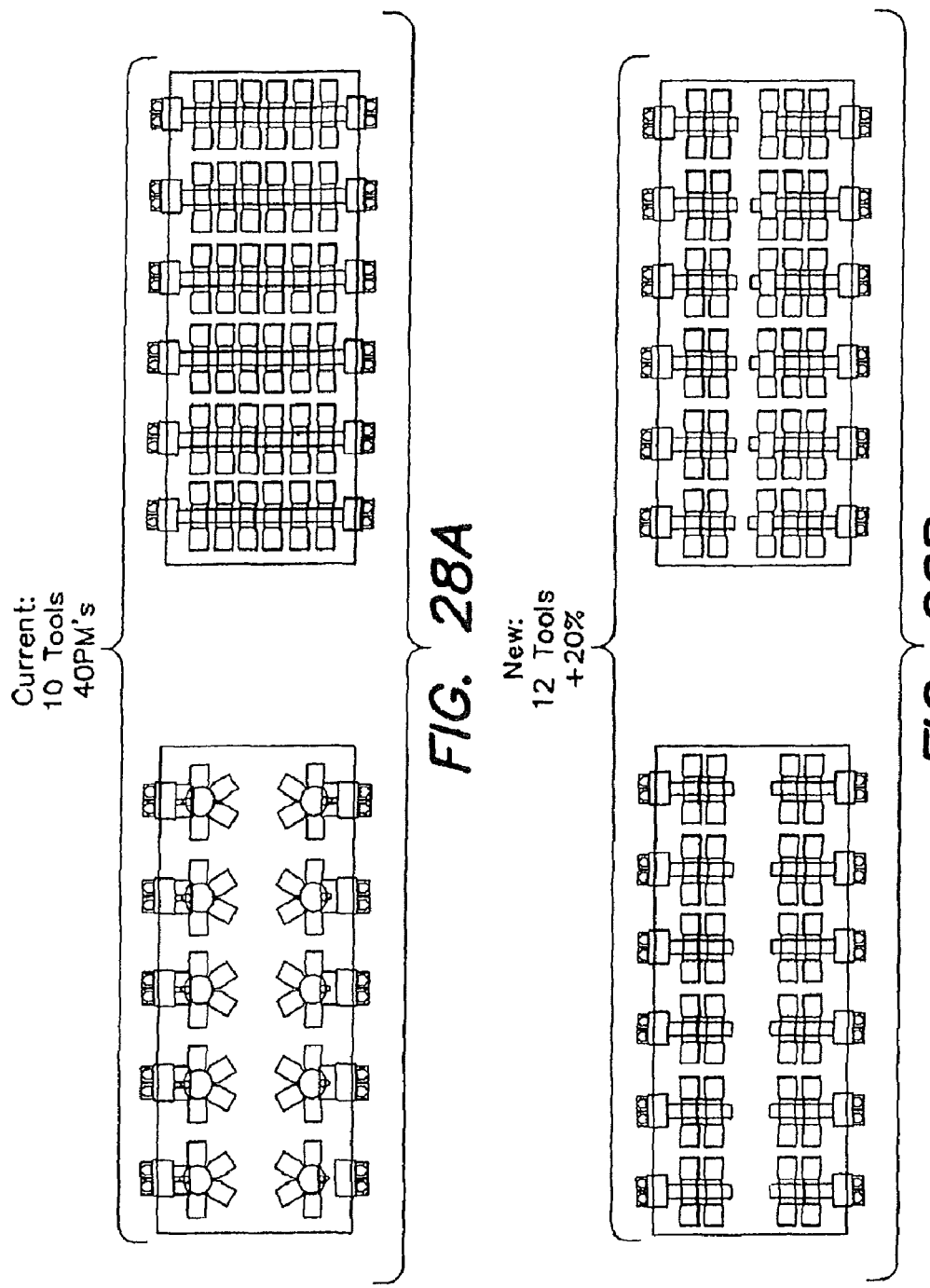
FIG. 28 shows a variety of layout possibilities for a fabrication facility employing linear handling systems in accordance with various embodiments of the invention.

FIG. 28 shows a variety of layout possibilities for a fabrication facility employing linear handling systems in accordance with various embodiments of the invention.

Figure 29:
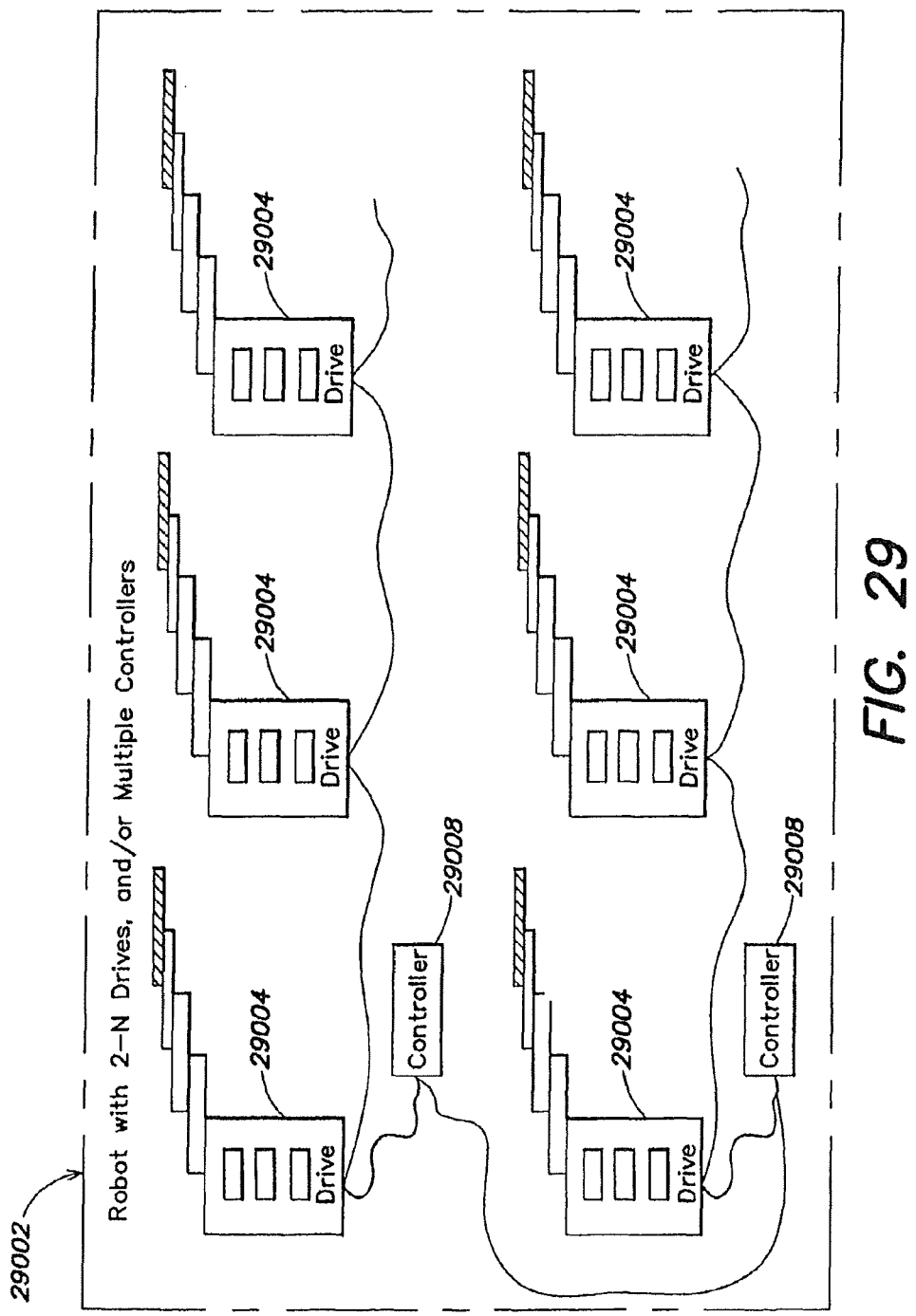
FIG. 29 shows an embodiment of the invention wherein a robot may include multiple drives and/or multiple controllers.

FIG. 29 shows an embodiment of the invention wherein a robot 29002 may include multiple drives 29004 and/or multiple controllers 29008. In embodiments a controller 29008 may control multiple drives 29004 as well as other peripheral devices such as slot valves, vacuum gauges, thus a robot 29002 may be a controller 29008 with multiple drives 29004 or multiple controllers 29008 with multiple drives 29004.

Figure 30:
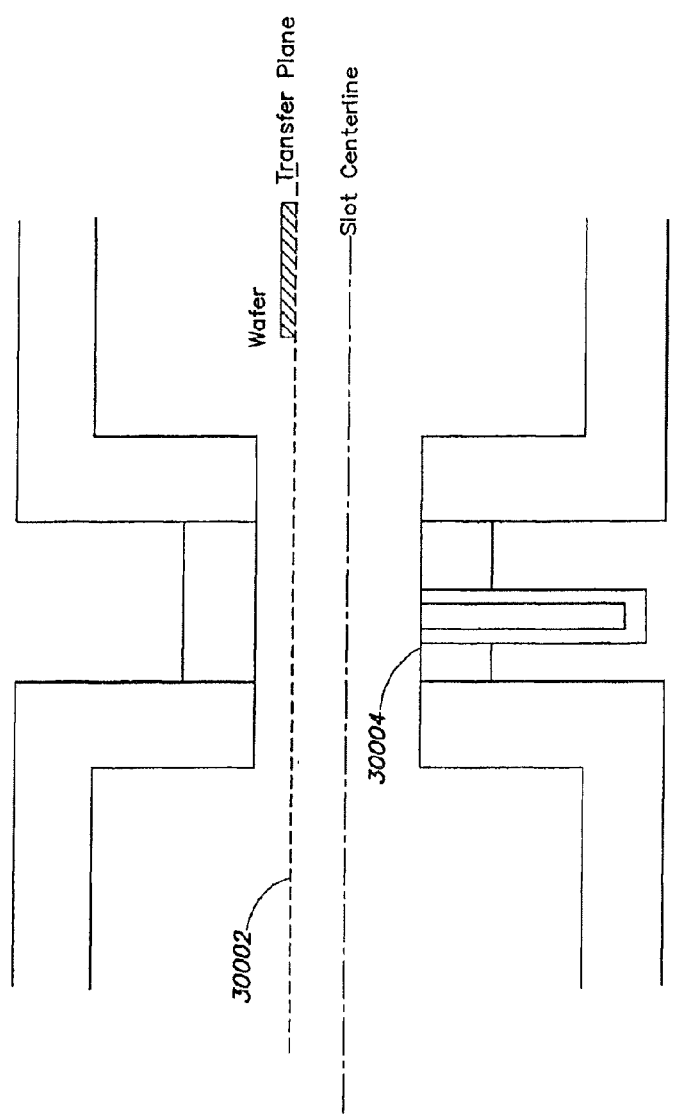
FIG. 30 shows transfer plane and slot valve characteristics relevant to embodiments of the invention.

FIG. 30 shows transfer plane 30002 and slot valve 30004 characteristics relevant to embodiments of the invention.

Figure 31:
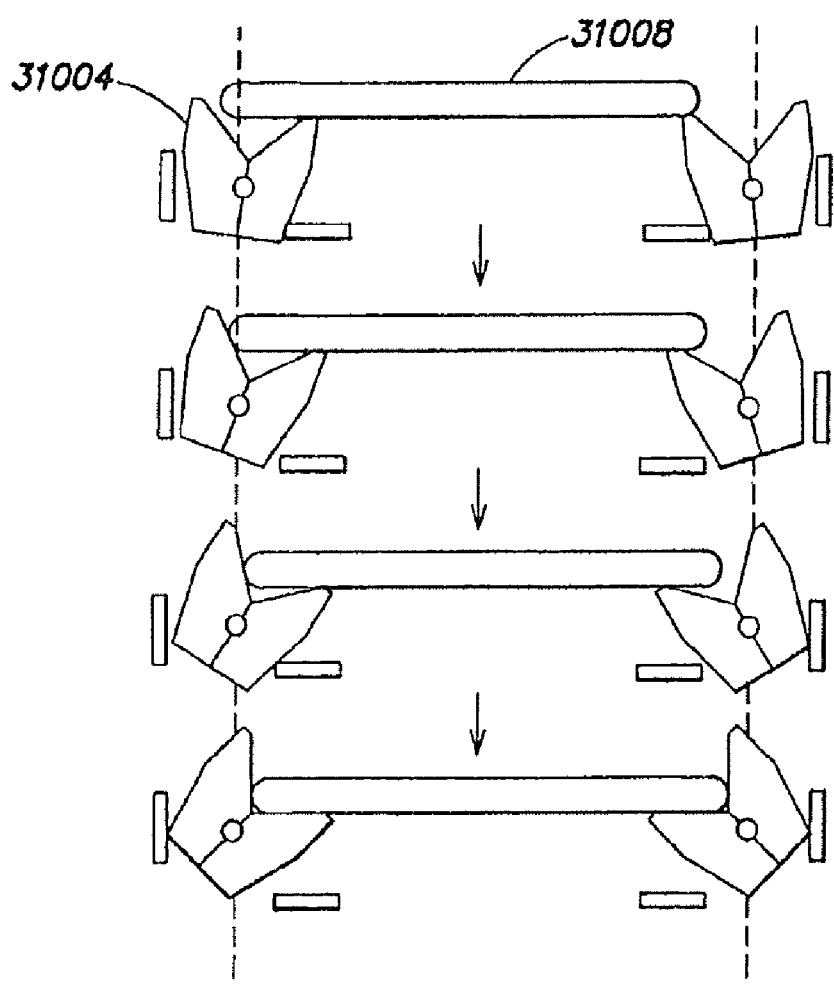
FIG. 31 shows a tumble gripper for centering wafers.
Figure 32:
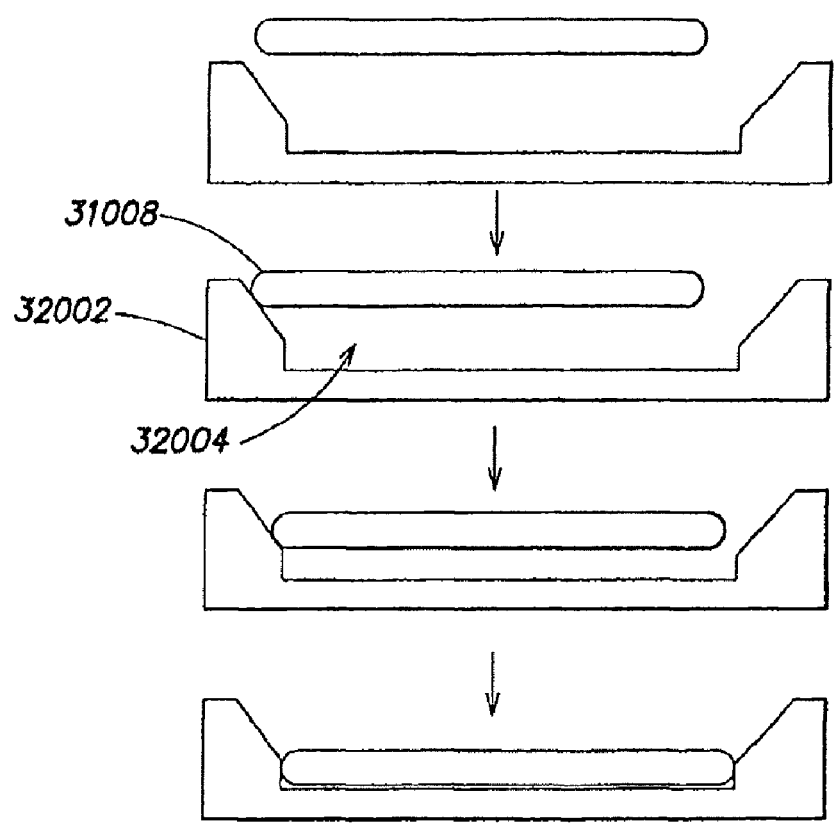
FIG. 32 shows a passive sliding ramp for centering wafers.

FIG. 31 shows a tumble gripper 31002 for centering wafers. The advantage of the tumble gripper 31002 over the passive centering gripper 32002 in FIG. 32 is that there is less relative motion between the tumblers 31004 and the backside of the wafer 31008. The tumblers 31004 may gently nudge the wafer 31008 to be centered on the end effector, supporting it on both sides as it moves down. In certain manufacturing processes it may be desirable to center wafers 31008, such as in a vacuum environment. The tumble gripper 31004 may allow the handling of very fragile wafers 31008, such as when employing an end effector at the end of a robotic arm, because it supports both ends of the wafer during handling.

FIG. 32 shows a passively centering end effector 32002 for holding wafers 31008. The wafer 31008 is typically slightly off-center when the end effector lifts (or the wafer 31008 is lowered). This results in the wafer 31008 sliding down the ramp and dropping into the cutout 32004. This can result in the wafer 31008 abruptly falling or moving, which in turn can create particles.

The methods and systems disclosed herein offer many advantages in the handling of materials or items during manufacturing processes. Among other things, vacuum isolation between robots may be possible, as well as material buffering between robots. A manufacturer can return finished wafers over the top of the system without going through vacuum, which can be a very substantial advantage, requiring only half the necessary handling steps, eliminating cross contamination between finished and unfinished materials and remaining compatible with existing clean room designs. When a manufacturer has relatively dirty wafers entering the system, the manufacturer may want to isolate them from the rest of the machine while they are being cleaned, which is usually the first step in the process. It may be advantageous to keep finished or partially finished materials away from the cleaning portion of the machine.

Other advantages may be provided by the methods and systems disclosed herein. The dual arms (top mounted and bottom mounted) may work in coordinated fashion, allowing very fast material exchanges. Regardless of the exact arm design (3-link, 4-link or other), mounting an arm in the lid that is not mechanically connected to the arm in the bottom can be advantageous. The link lengths of the 4-link SCARA arm provided herein can be quite advantageous, as unlike conventional arms they are determined by the mechanical limits of slot valves and chamber radius. The 4-link SCARA arms disclosed herein are also advantageous in that they can use two motors for the links, along with a Z motor, rather than three motors plus the Z motor.

A linear vacuum system where materials exit in the rear may offer substantial benefits. Another implementation may be to have both the entry system and exit system installed through two opposing walls.

The 4-link SCARA arm disclosed herein may also allow link L3 to swing into and over link L2 for the top robot drive. This may not be easily done with the 3-link SCARA, nor with existing versions of 4-link SCARA arms, because they have the wrong link lengths.

The gripper for carriers and the multiple carrier locations in the linear system may also offer substantial benefits in materials handling in a linear manufacturing architecture. Including vertical movement in the gripper and/or in the rear load lock may offer benefits as well.

While the invention has been described in connection with certain preferred embodiments, one of ordinary skill in the art will recognize other embodiments that are encompassed herein.

Figure 33:
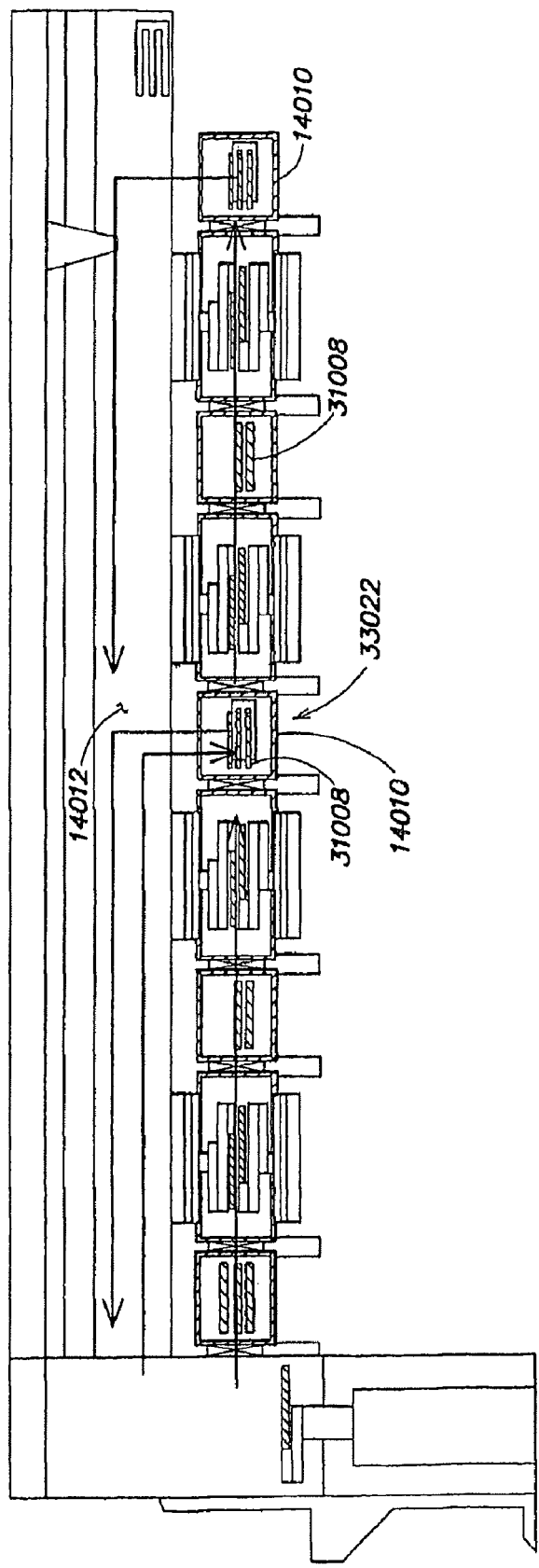
FIG. 33 illustrates a fabrication facility including a mid-entry facility.

FIG. 33 illustrates a fabrication facility including a mid-entry point 33022. In an embodiment, the fabrication facility may include a load lock mid-stream 33002 where wafers 31008 can be taken out or entered. There can be significant advantages to such a system, including providing a processing facility that provides dual processing capabilities (e.g. connecting two machines behind each other, but only need to use one EFEM). In an embodiment, the air return system 14012 can also take new wafers 31008 to the midpoint 33022 and enter wafers 31008 there.

FIG. 34 illustrates several top views of a fabrication facility with mid-entry points 33002. The figure also illustrates how the combination of a mid-entry point effectively functions to eliminate one of the EFEMs 34002.

Figure 35:
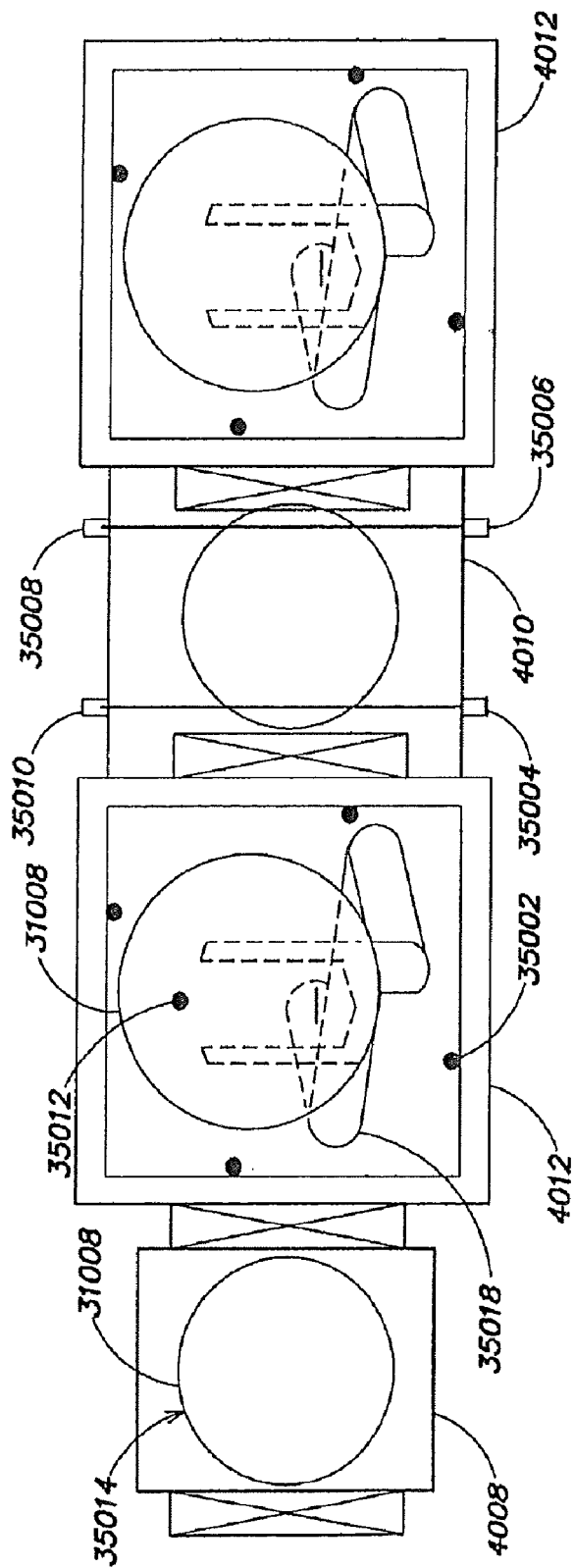
FIG. 35 illustrates a fabrication facility including the placement of optical sensors for detection of robotic arm position and materials in accordance with embodiments of the invention.

FIG. 35 illustrates a fabrication facility including a series of sensors 35002. In many fabrication facilities such sensors 35002 are commonly used to detect whether a material 35014 is still present on a robotic arm 35018. Such sensors 35002 may be commonly placed at each vacuum chamber 4012 entry and exit point. Such sensors 35002 may consist of a vertical optical beam, either employing an emitter and detector, or employing a combination emitter/detector and a reflector. In a vacuum handling facility, the training of robotic stations is commonly accomplished by a skilled operator who views the position of the robot arm and materials and adjusts the robot position to ensure that the material 35014 is deposited in the correct location. However, frequently these positions are very difficult to observe, and parallax and other optical problems present significant obstacles in properly training a robotic system. Hence a training procedure can consume many hours of equipment downtime.

Several automated training applications have been developed, but they may involve running the robotic arm into a physical obstacle such as a wall or edge. This approach has significant downsides to it: physically touching the robot to an obstacle risks damage to either the robot or the obstacle, for example many robot end effectors are constructed using ceramic materials that are brittle, but that are able to withstand very high wafer temperatures. Similarly, inside many process modules there objects that are very fragile and easily damaged. Furthermore, it may not be possible to employ these auto-training procedures with certain materials, such as a wafer 31008 present on the robot end effector. Moreover, the determination of vertical position is more difficult because upward or downward force on the arm caused by running into an obstacle is much more difficult to detect.

In the systems described herein, a series of sensors 35002-35010 may include horizontal sensors 35004-35010 and vertical sensors 35002. This combination of sensors 35002-35010 may allow detection, for example through optical beam breaking, of either a robotic end effector, arm, or a handled object. The vertical sensor 35002 may be placed slightly outside the area of the wafer 31008 when the robotic arm 35018 is in a retracted position. The vertical sensor 35002 may also, or instead, be placed in a location such as a point 35012 within the wafer that is centered in front of the entrance opening and covered by the wafer when the robot is fully retracted. In this position the sensor may be able to tell the robotic controller that it has successfully picked up a wafer 31008 from a peripheral module.

Horizontal sensors 35004-35010 may also be advantageously employed. In vacuum cluster tools, horizontal sensors 35004-35010 are sometimes impractical due to the large diameter of the vacuum chamber, which may make alignment of the horizontal sensors 35004-35010 more complicated. In the systems described above, the chamber size may be reduced significantly, thus may make it practical to include one or more horizontal sensors 35004-35010.

Figure 36:
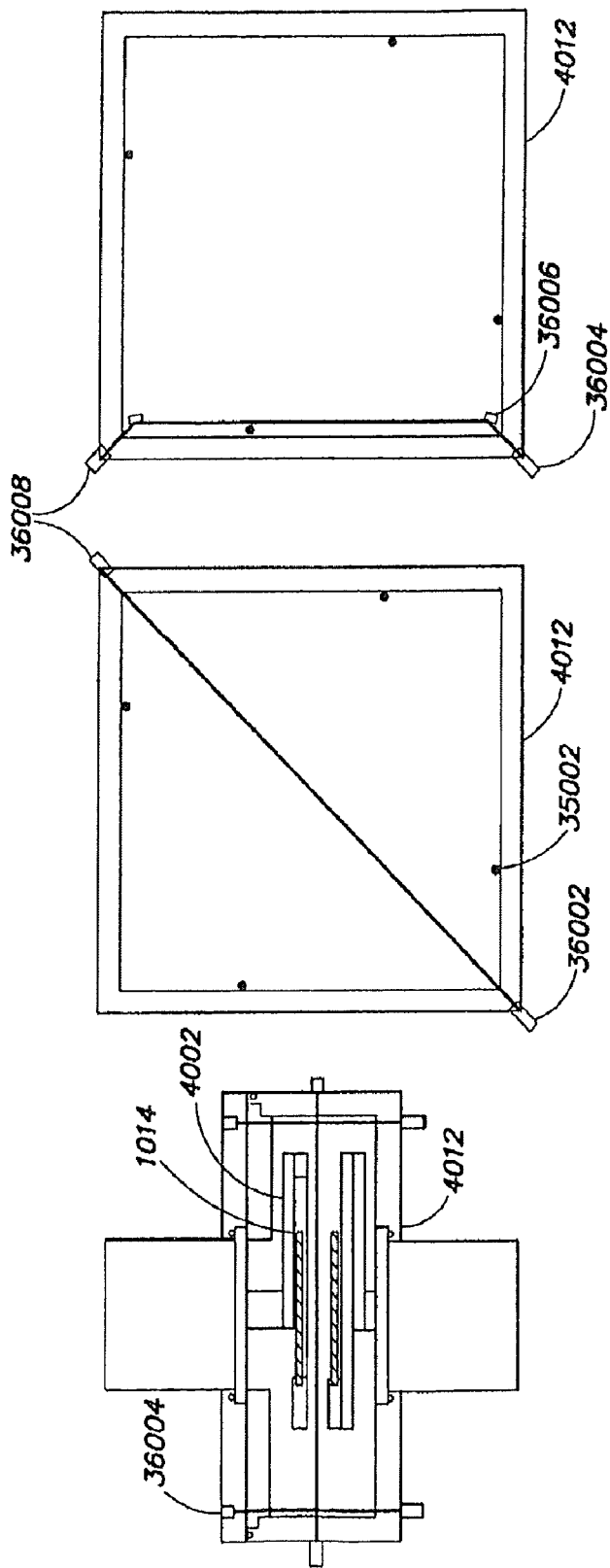
FIG. 36 illustrates a fabrication facility in a cross-sectional side view showing optical beam paths and alternatives beam paths.

FIG. 36 illustrates other possible locations of the horizontal sensors 35004-35010 and vertical sensors 35002, such as straight across the chamber (36002 and 36008) and/or through mirrors 36006 placed inside the vacuum system.

Figure 37:
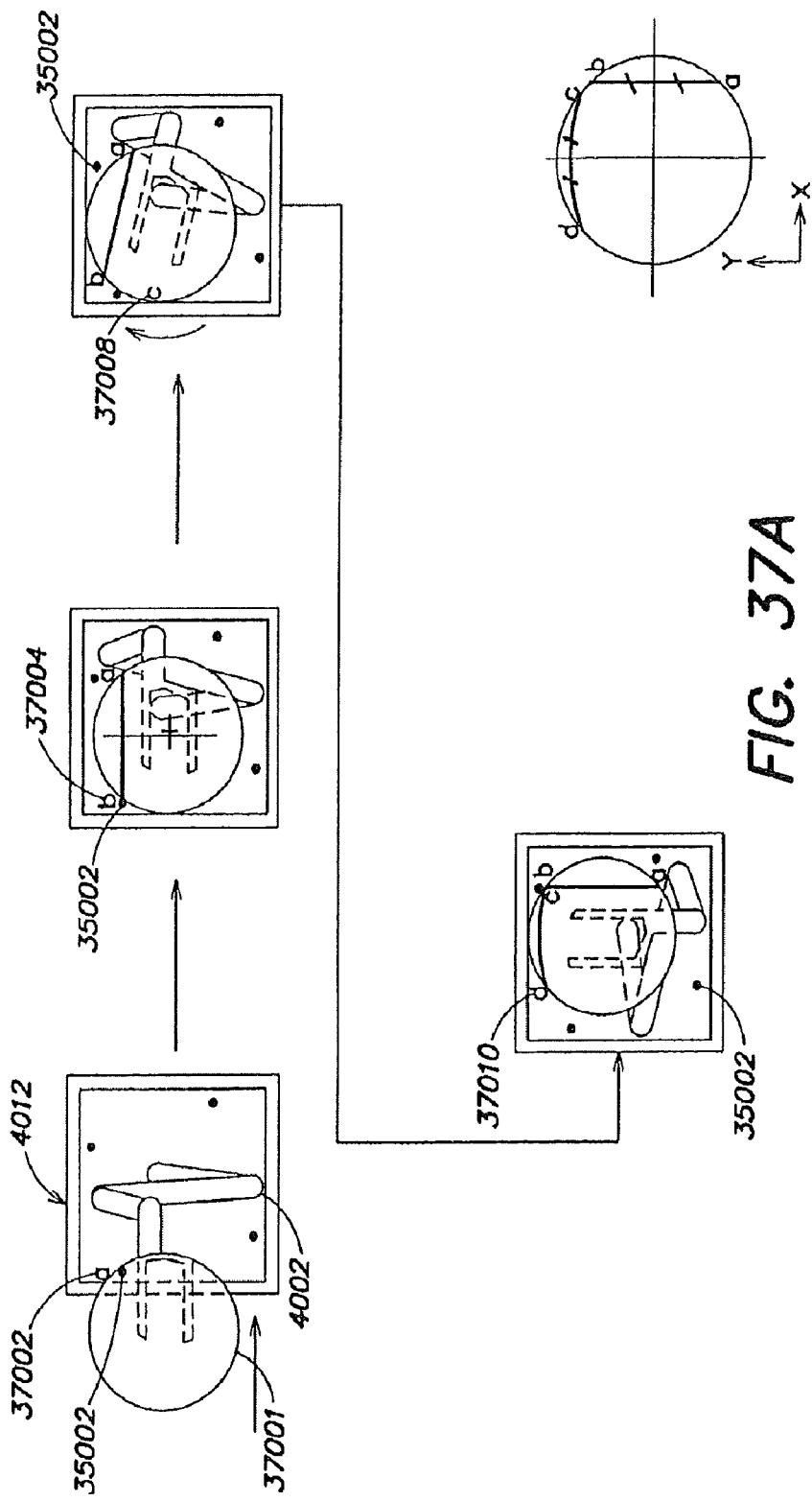
FIG. 37 illustrates how optical sensors can be used to determine the center of the material handled by a robotic arm.

FIG. 37 illustrates a possible advantage of placing the sensor 35002 slightly outside the wafer 37001 radius when the robot arm is fully retracted. During a retract motion the sensor 35002 detects the leading edge of the wafer 37001 at point "a" 37002 and the trailing edge at point "b" 37004. These results may indicate that the wafer 37001 was successfully retrieved, but by tying the sensor 35002 signal to the encoders, resolvers or other position elements present in the robotic drive, one can also calculate if the wafer 37001 is centered with respect to the end effector. The midpoint of the line segment "a-b" 37002 37004 should correspond to the center of the end effector because of the circular geometry of a wafer 37001. If the wafer 37001 slips on the end effector, inconsistent length measurements may reveal the slippage.

Additionally, during a subsequent rotation and movement, a second line segment "c-d" 37008 37010 may be detected when the wafer 37001 edges pass through the sensor. Again, the midpoint between "c" 37008 and "d" 37010 should coincide with the center of the end effector, and may permit a measurement or confirmation of wafer centering.

The above method may allow the robot to detect the wafer 37001 as well as determine if the wafer 37001 is off-set from the expected location on the end effector.

The combination of horizontal and vertical sensors 35002-35010 may allow the system to be taught very rapidly using non-contact methods: the robotic arm and end effectors may be detected optically without the need for mechanical contact. Furthermore, the optical beams can be used during real-time wafer 37001 handling to verify that wafers 37001 are in the correct position during every wafer 37001 handling move.

Figure 38:
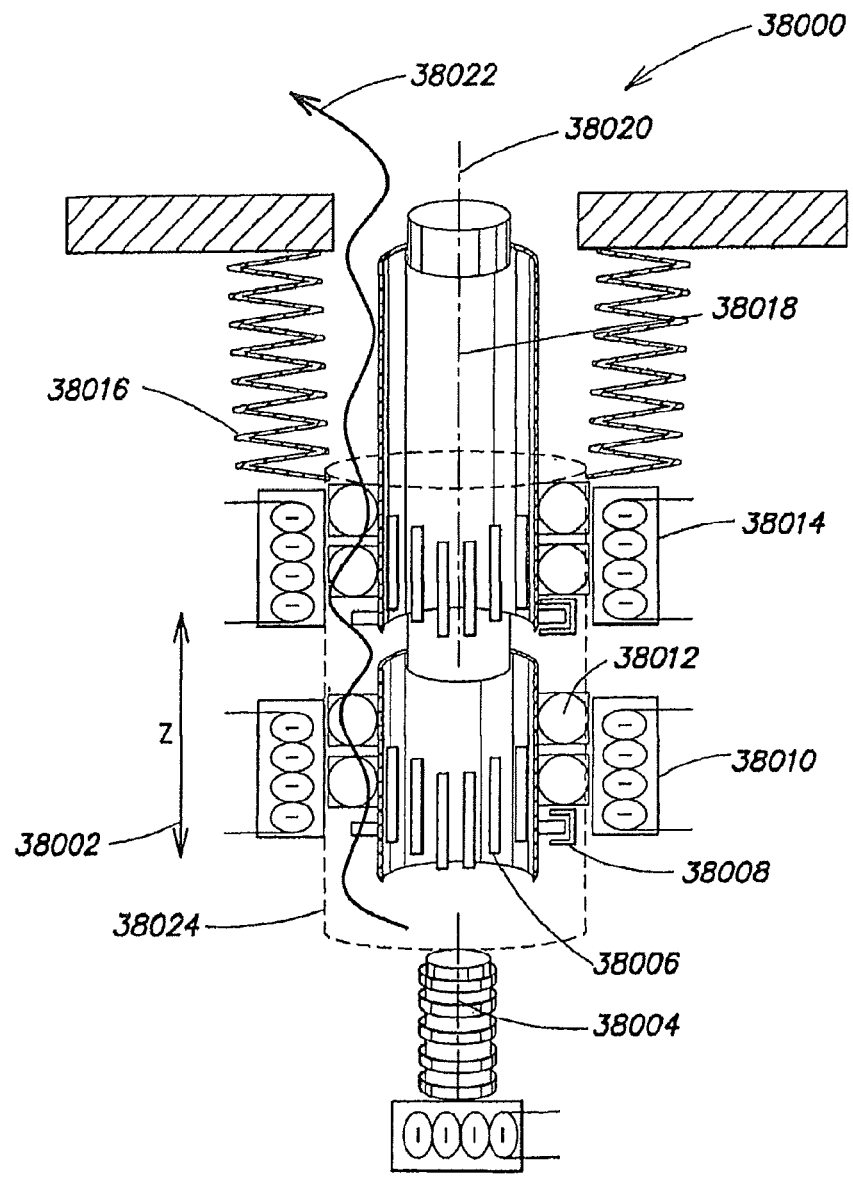
FIG. 38 shows a conventional 3-axis robotic vacuum drive architecture

FIG. 38 illustrates a conventional vacuum drive with two rotary axes 38020 and 38018 and a vertical (Z) axis 38004. A bellows 38016 may allow for the vertical Z-axis 38002 motion. A thin metal cylinder 38024 affixed to the bottom of the bellows 18016 may provide a vacuum barrier between the rotor and the stator of the motors 38010 and 38014. This arrangement may require in-vacuum placement of many components: electrical wires and feedthroughs, encoders, signal LEDs and pick-ups 38008, bearings 38012, and magnets 38006. Magnets 38006, bearings 38012, wires and connectors, and encoders can be susceptible to residual processing gasses present in the vacuum environment. Furthermore, it may be difficult to remove gasses trapped in the bottom of the cylinder 38024, as the gasses may have to follow a convoluted path 38022 when evacuated.

Figure 39:
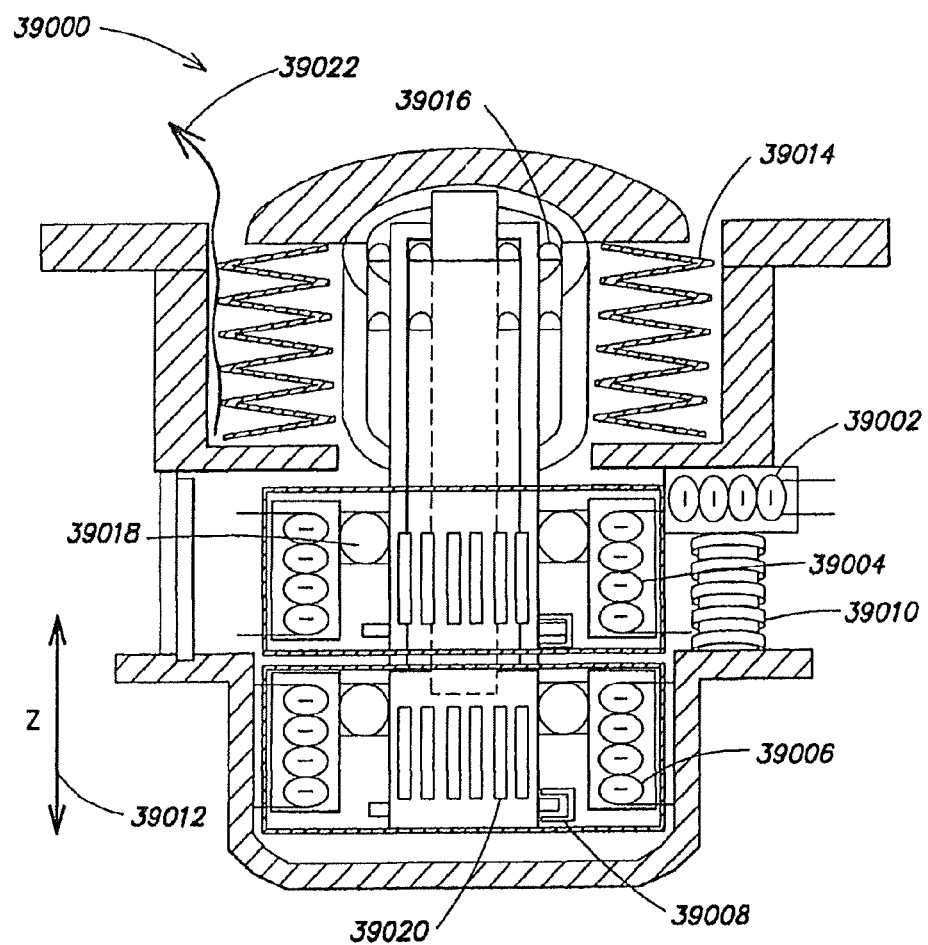
FIG. 39 shows a novel 3-axis robotic vacuum drive architecture in accordance with embodiments of the invention.

FIG. 39 illustrates a vacuum robot drive that may be used with the systems described herein. The rotary drive forces may be provided by two motor cartridges 39004 and 39006. Each cartridge may have an integral encoder 39008, bearings 39018 and magnets 39020. Some or all of these components may be positioned outside the vacuum envelope. A concentric dual-shaft rotary seal unit 39016 may provide vacuum isolation for the rotary motion using, for example, lip-seals or ferrofluidic seals. This approach may reduce the number of components inside the vacuum system. It may also permit servicing of the motors 39004, 39006 and encoders 39008 without breaking vacuum, thereby increasing serviceability of the drive unit.

Figure 40A:
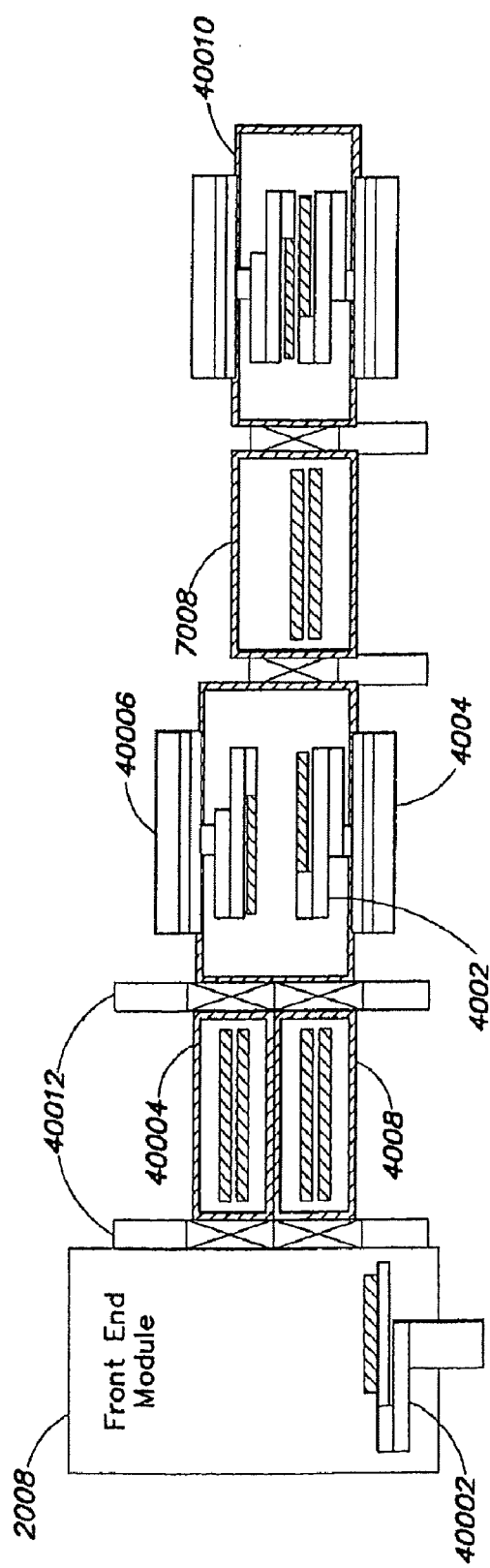
FIG. 40A illustrates a vertically arranged load lock assembly in accordance with embodiments of the invention.

FIG. 40 shows a stacked vacuum load lock 4008, 40004 for entering materials into a vacuum environment. One limiting factor on bringing wafers 31008 into a vacuum system is the speed with which the load lock can be evacuated to high vacuum. If the load lock is pumped too fast, condensation may occur in the air in the load lock chamber, resulting in precipitation of nuclei on the wafer 31008 surfaces, which can result in particles and can cause defects or poor device performance. Cluster tools may employ two load locks side by side, each of which is alternately evacuated. The pumping speed of each load lock can thus be slower, resulting in improved performance of the system. With two load locks 4008 40004 in a vertical stack, the equipment footprint stays very small, but retains the benefit of slower pumping speed. In embodiments, the load lock 40004 can be added as an option. In embodiments the robotic arms 4004 and 40006 can each access either one of the two load locks 4008 40004. In embodiments the remaining handoff module 7008 could be a single level handoff module.

Figure 40B:
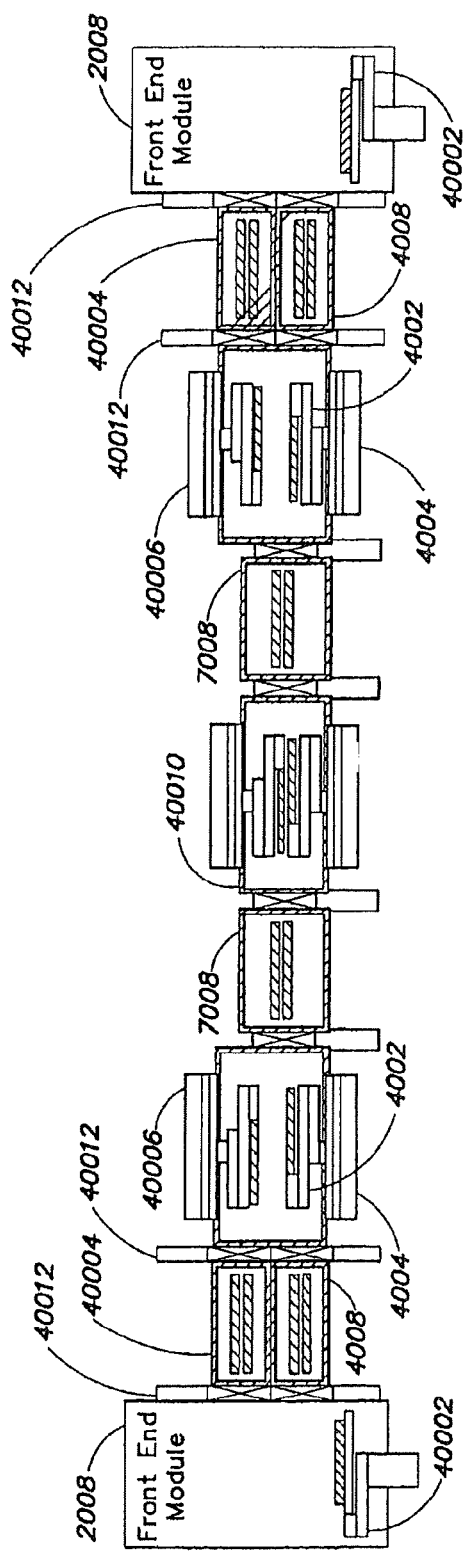
FIG. 40B illustrates a vertically arranged load lock assembly at both sides of a wafer fabrication facility in accordance with embodiments of the invention.

FIG. 40B shows another load lock layout. In this figure wafers 31008 can be entered and can exit at two levels on either side of the system, but follow a shared level in the rest of the system.

Figure 41:
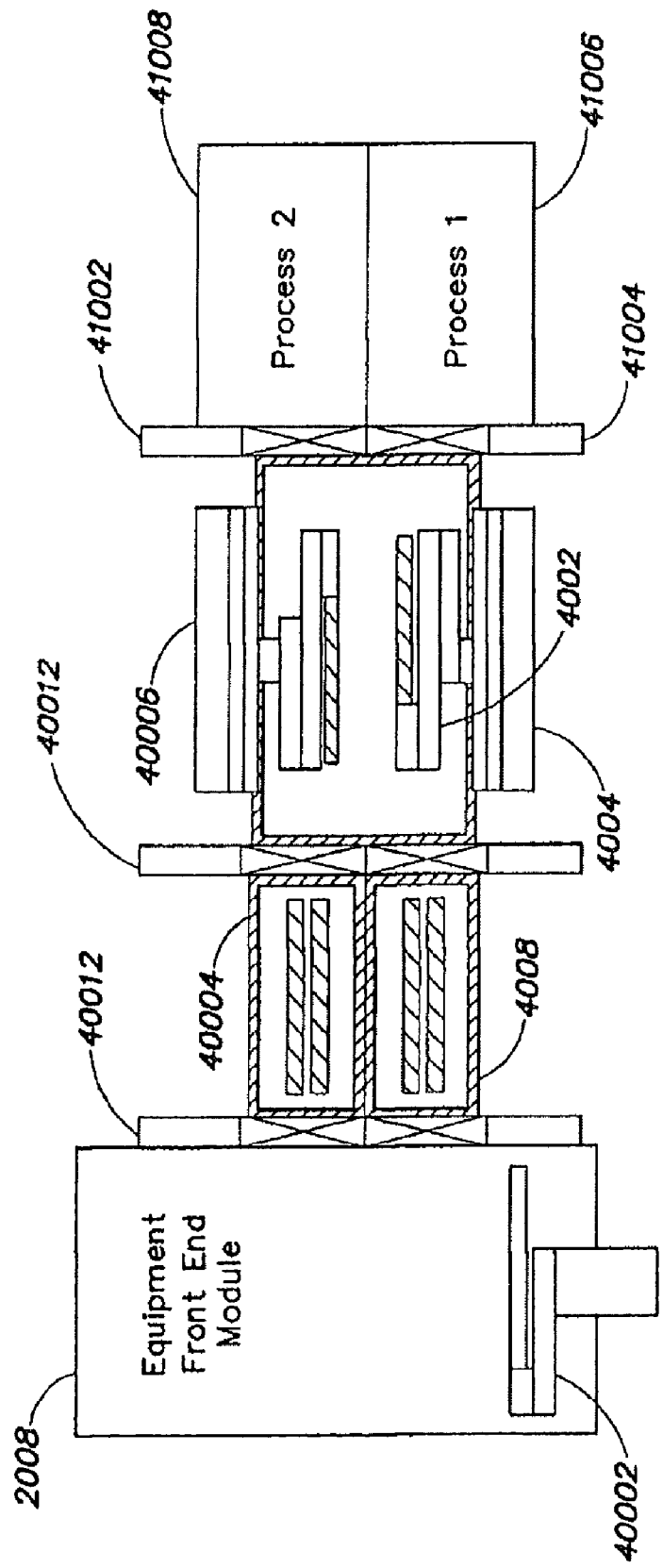
FIG. 41 shows a vertically arranged load lock and vertically stacked process modules in accordance with embodiments of the invention.

FIG. 41 details how the previous concept of stacked load locks 4008 40004 can be also implemented throughout a process by stacking two process modules 41006, 41008. Although such modules would not be compliant with the SEMI standard, such an architecture may offer significant benefits in equipment footprint and throughput.

Figure 42:
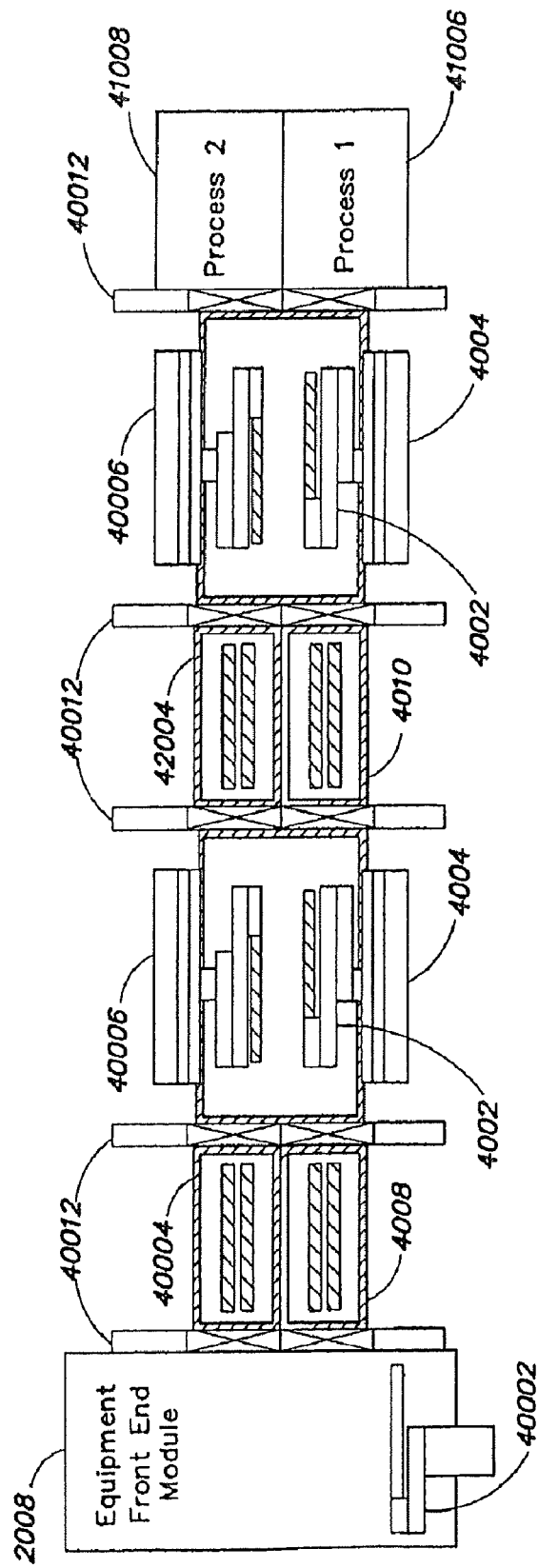
FIG. 42 shows a linearly arranged, two-level handling architecture with vertically stacked process modules in a cross-sectional side view in accordance with embodiments of the invention.

FIG. 42 shows a system with two handling levels 4008, 40004, 4010, 42004: wafers may be independently transported between modules using either the top link 40006 or the bottom link 4004. Optionally, each handling level may have two load locks to provide the advantage of reduced evacuation speed noted above. Thus a system with four input load locks, two handling levels, and optionally four output load locks, is also contemplated by description provided herein, as are systems with additional load lock and handling levels.

Figure 43:
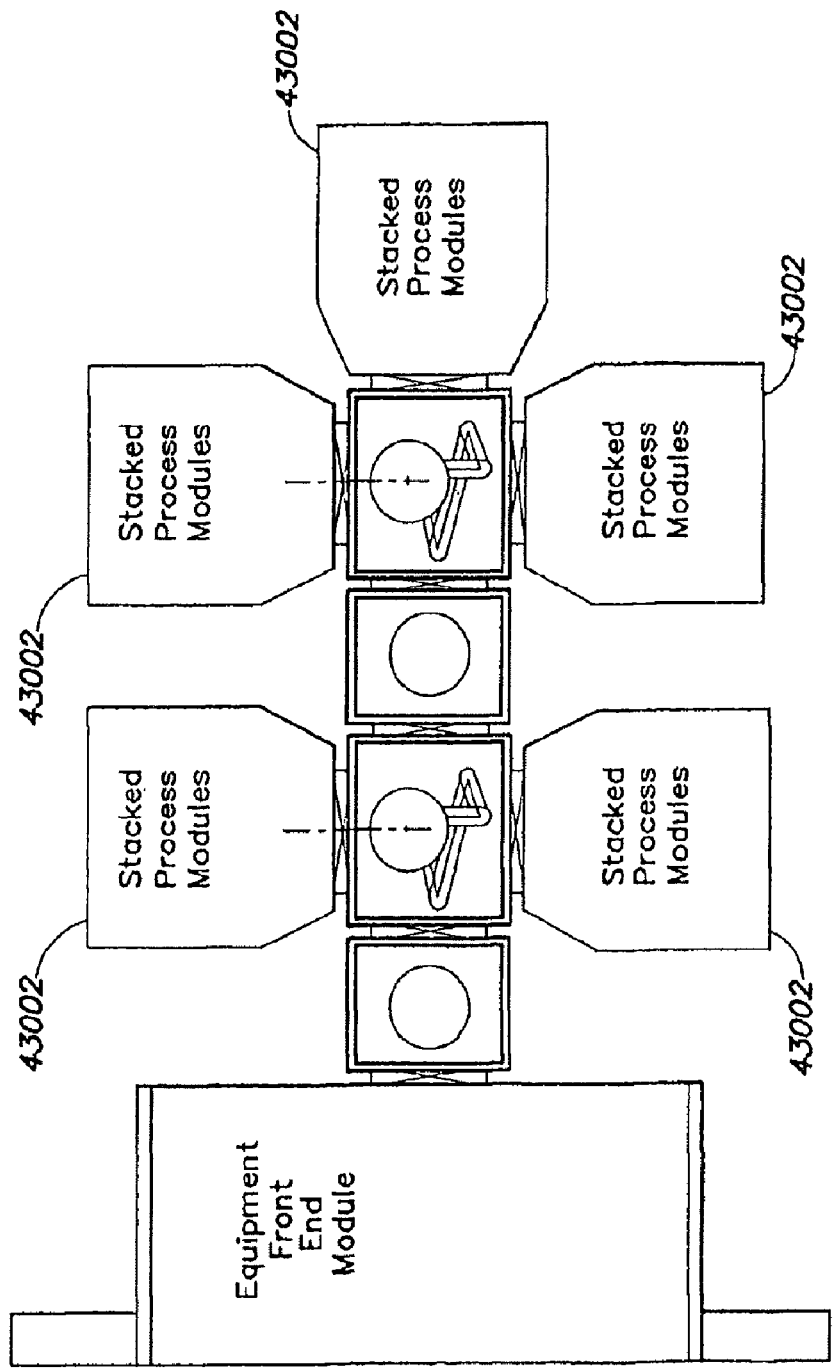
FIG. 43 shows the handling layout of FIG. 42 in a top view.

FIG. 43 shows a top view of the system of FIG. 42.

Figure 44:
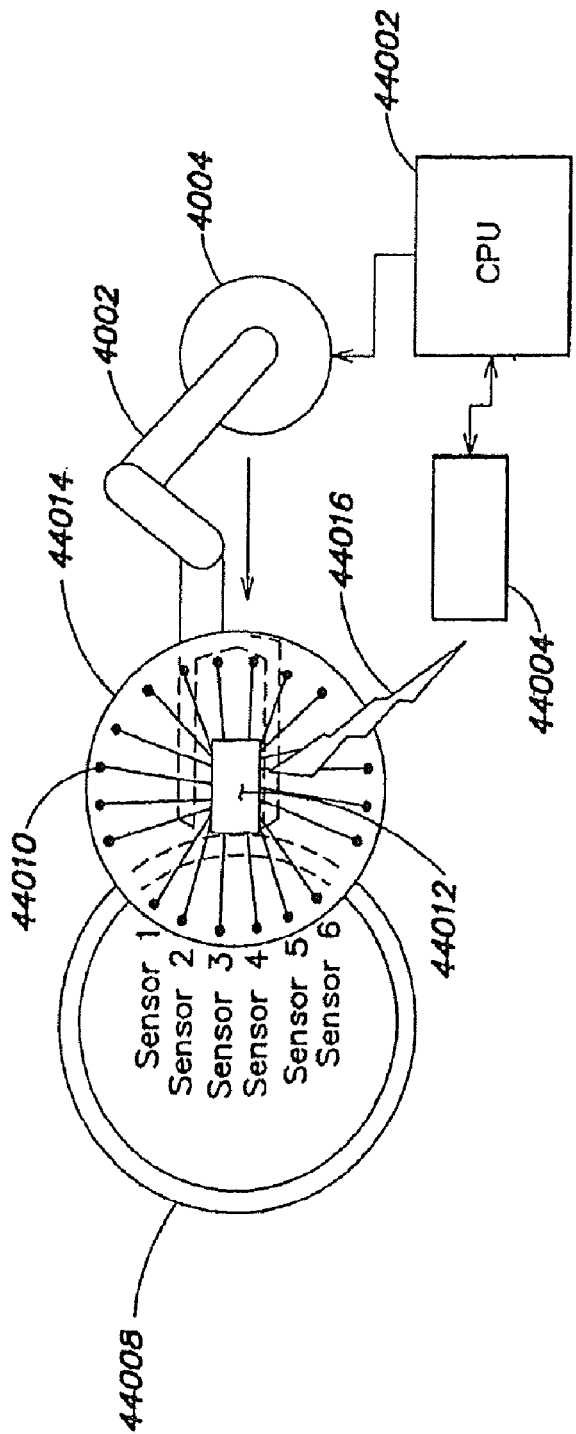
FIG. 44 shows an instrumented object on a robotic arm with sensors to detect proximity of the object to a target, in accordance with embodiments of the invention.

FIG. 44 depicts a special instrumented object 44014, such as a wafer. One or more sensors 44010 may be integrated into the object 44014, and may be able to detect environmental factors around the object 44014. The sensors 44010 may include proximity sensors such as capacitive, optical or magnetic proximity sensors. The sensors 44010 may be connected to an amplifier/transmitter 44012, which may use battery power to transmit radio frequency or other sensor signals, such as signals conforming to the 802.11b standard, to a receiver 44004.

In many instances it may be difficult or impossible to put instrumentation on an object 44014 used to train a robot, because the wires that are needed to power and communicate to the instruments and sensors interfere with proper robotic motion or with the environment that the robot moves through. By employing a wireless connection to the object, the problem of attached wires to the object may be resolved.

The object 44014 can be equipped with numerous sensors of different types and in different geometrically advantageous patterns. In the present example, the sensors 1 through 6 (44010) are laid out in a radius equal to the radius of the target object 44008. In embodiments these sensors are proximity sensors. By comparing the transient signals from the sensors 44010, for example sensor 1 and sensor 6, it can be determined if the object 44014 is approaching a target 44008 at the correct orientation. If the target 44008 is not approached correctly, one of the two sensors 44010 may show a premature trigger. By monitoring multiple sensors 44010, the system may determine if the object 44010 is properly centered above the target 44008 before affecting a handoff. The sensors 44010 can be arranged in any pattern according to, for example, efficiency of signal analysis or any other constraints. Radio frequency signals also advantageously operate in a vacuum environment.

Figure 45:
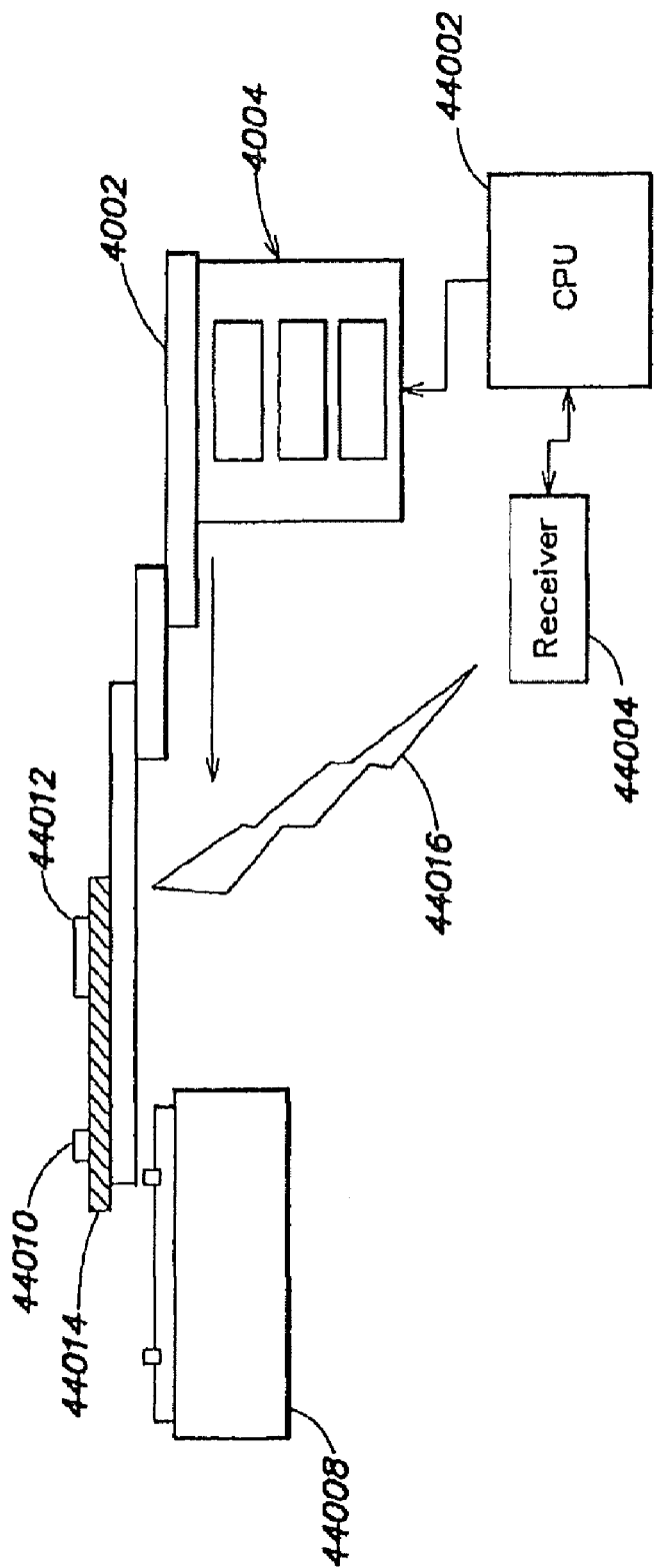
FIG. 45 illustrates how the movement of sensors over a target can allow the robotic arm to detect its position relative to the obstacle.

FIG. 45 shows the system of FIG. 44 in a side orientation illustrating the non-contact nature of orienting the instrumented object 44014 to a target 44008. The sensors 44010 may include other sensors for measuring properties of the target 44008, such as temperature.

Figure 46:
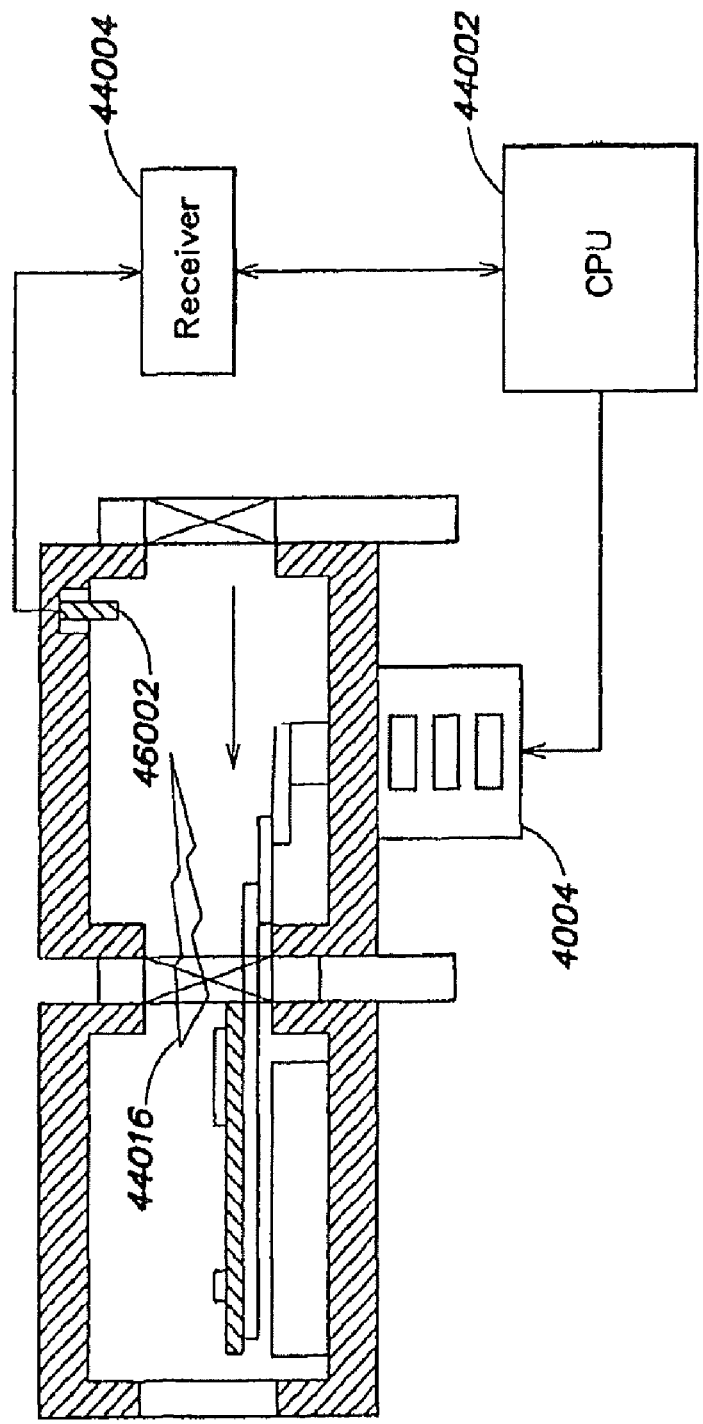
FIG. 46 shows how an instrumented object can use radio frequency communications in a vacuum environment to communicate position to a central controller.

FIG. 46 depicts radio frequency communication with one or more sensors. A radio frequency sensor signal 44016 may be transmitted to an antenna 46002 within a vacuum. Appropriate selection of wavelengths may improve signal propagation with a fully metallic vacuum enclosure. The use of sensors in wireless communication with an external receiver and controller may provide significant advantages. For example, this technique may reduce the time required for operations such as finding the center of a target, and information from the sensor(s) may be employed to provide visual feedback to an operator, or to automate certain operations using a robotic arm. Furthermore, the use of one or more sensors may permit measurements within the chamber that would otherwise require release of the vacuum to open and physically inspect the chamber. This may avoid costly or time consuming steps in conditioning the interior of the chamber, such as depressurization and baking (to drive out moisture or water vapor).

Figure 47:
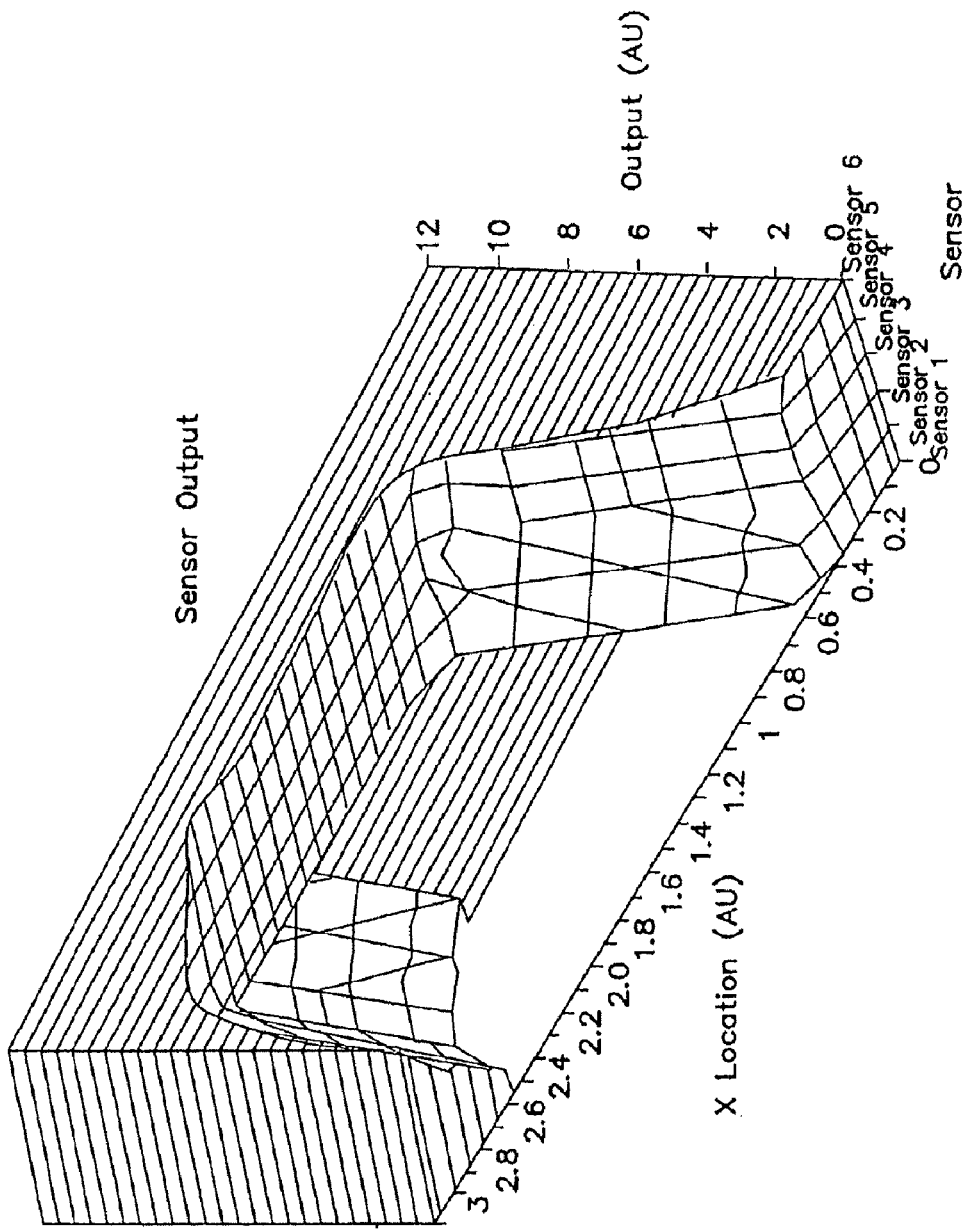
FIG. 47 illustrates the output of a series of sensors as a function of position.

FIG. 47 illustrates the output from multiple sensors 44010 as a function of the robot movement. When the robot moves over the target 44008 the motion may result in the sensors providing information about, for example, distance to the target 44008 if the sensors are proximity sensors. The signals can be individually or collectively analyzed to determine a location for the target 44008 relative to the sensors. Location or shape may be resolved in difference directions by moving the sensor(s) in two different directions and monitoring sensor signals, without physically contacting the target 44008.

Figure 48:
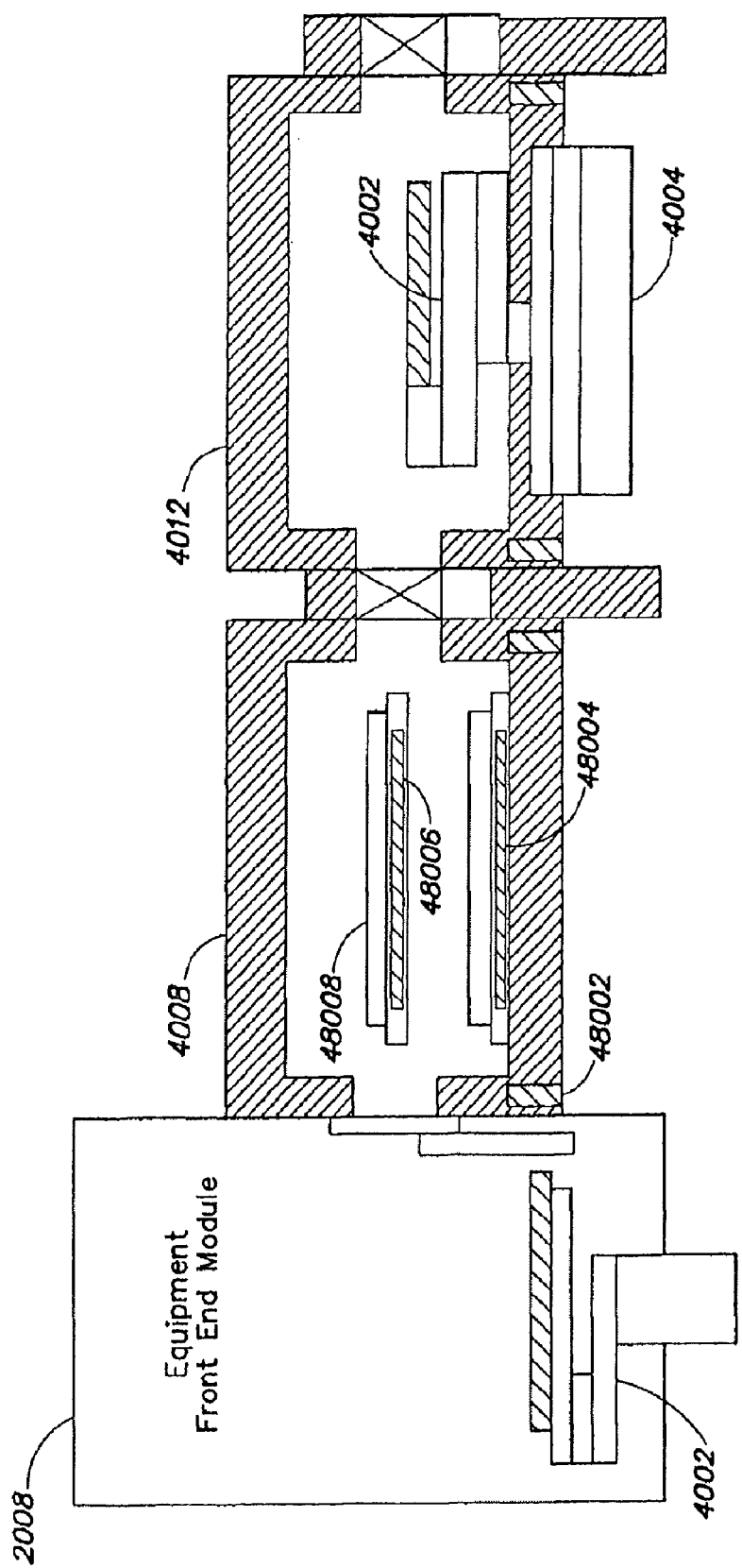
FIG. 48 illustrates how heating elements can be placed in a load lock for thermal treatment of objects in accordance with embodiments of the invention.

FIG. 48 depicts a technique for inserting and removing wafers 48008 from a vacuum system. One or more heating elements, such as a set of heating elements 48002, 48004, and 48006 may be employed, individually or in combination, to heat a chamber 4008 and a substrate material 48008 to an elevated temperature of 50° C. to 400° C. or more. This increase in starting temperature may mitigate condensation that would otherwise occur as pressure decreases in the chamber, and may allow for a more rapid pump down sequence to create a vacuum. When heated wafers 48008 are moved to the load lock 4008 by the robotic arm 4002, they may be significantly warmer than shelves 48004, 48006, such that shelves 48004, 48006 may cool the wafers on contact. A heating power supply may regulate heat provided to the shelves 48004 48006 to maintain a desired temperature for the shelves and/or wafers. A suitable material selection for the shelves 48004, 48006 may result in the system reacting quickly to heating power changes, resulting in the possibility of different temperature settings for different conditions, for example a higher temperature setting during pump-down of the chamber 4008 and a lower setting during venting of chamber 4008.

Preheating the wafers 48008 may reduce condensation and particles while reducing process time. At the same time, the wafers 48008 may be too hot when exiting the system, such that they present a safety hazard, or melt handling and support materials such as plastic. Internal temperatures of about 80 to 100° C. degrees, and external temperatures of about 50° C. degrees or less may, for example, meet these general concerns.

FIG. 49 illustrates a robotic end effector 49002. The robotic end effector 49002 may be tapered so that it has a non-uniform thickness through one or more axes. For example, the robotic end effector 49002 may have a taper when viewed from the side or from the top. The taper may mitigate resonant vibrations along the effector 49002. At the same time, a relatively narrow cross-sectional profile (when viewed from the side) may permit easier maneuvering between wafers. The side-view taper may be achieved by grinding or machining, or by a casting process of the effector 49002 with a taper. Materials such as Aluminum Silicon Carbide (AlSiC 9) may be advantageously cast into this shape to avoid subsequent machining or other finishing steps. A casting process offers the additional advantage that the wafer support materials 49004 can be cast into the mold during the casting process, thereby reducing the number of components that require physical assembly.

As shown in FIG. 50, similar techniques may be applied to robotic arm segments 50002 and 50004. The same dampening effect may be achieved to attenuate resonant vibrations in the arm segments 50002 50004 as described above. The tapered shape may be achieved using a variety of known processes, and may allow more rapid movement and more precise control over a resulting robotic arm segment.

FIG. 51 shows a dual independent SCARA arm employing five motors 51014. Each lower arm 51002 and 51008 can be independently actuated by the motors 51014. The arms are connected at the distal end to upper arms 51004 and 51010. The configuration gives a relatively small retract radius, but a somewhat limited extension.

FIG. 52 shows a dual dependent SCARA arm employing 4 motors 52010. The links 52002 and 52004 may be common to the end effectors 52006 and 52008. The motors 52010 may control the end effectors 52006 and 52008 in such a way that during an extension motion of the lower arm 52002, the desired end effector, (say 52008) may be extended into the processing modules, whereas the inactive end effector (say 52006) may be pointed away from the processing module.

Figures 53A, 53B:
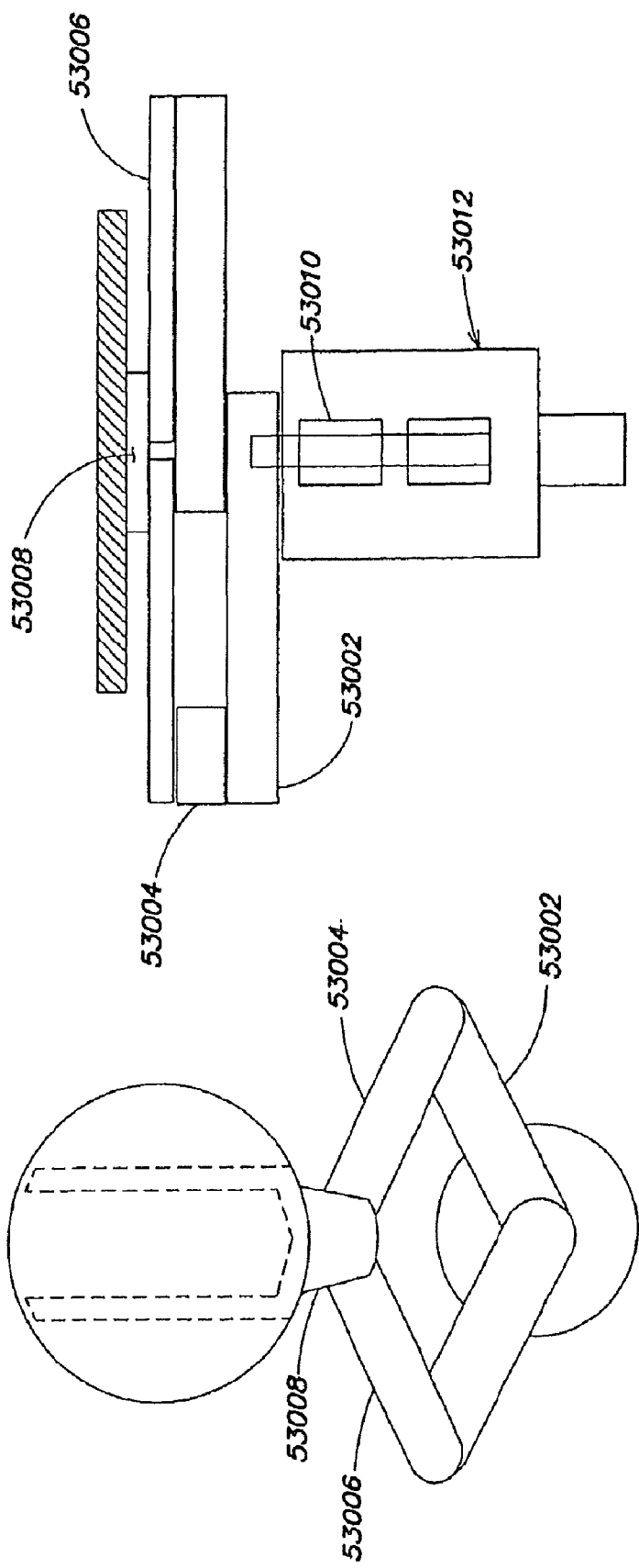
FIG. 53 illustrates a frog-leg style robotic arm.

FIG. 53 shows a frog-leg style robotic arm. The arm can be used in connection with various embodiments described herein, such as to enable passing of workpieces, such as semiconductor wafers, from arm-to-arm in a series of such arms, such as to move workpieces among semiconductor process modules.

FIG. 54 shows a dual frog-leg arm that can be employed in a planar robotic system, such as one of the linear, arm-to-arm systems described in this disclosure.

Figure 55A:
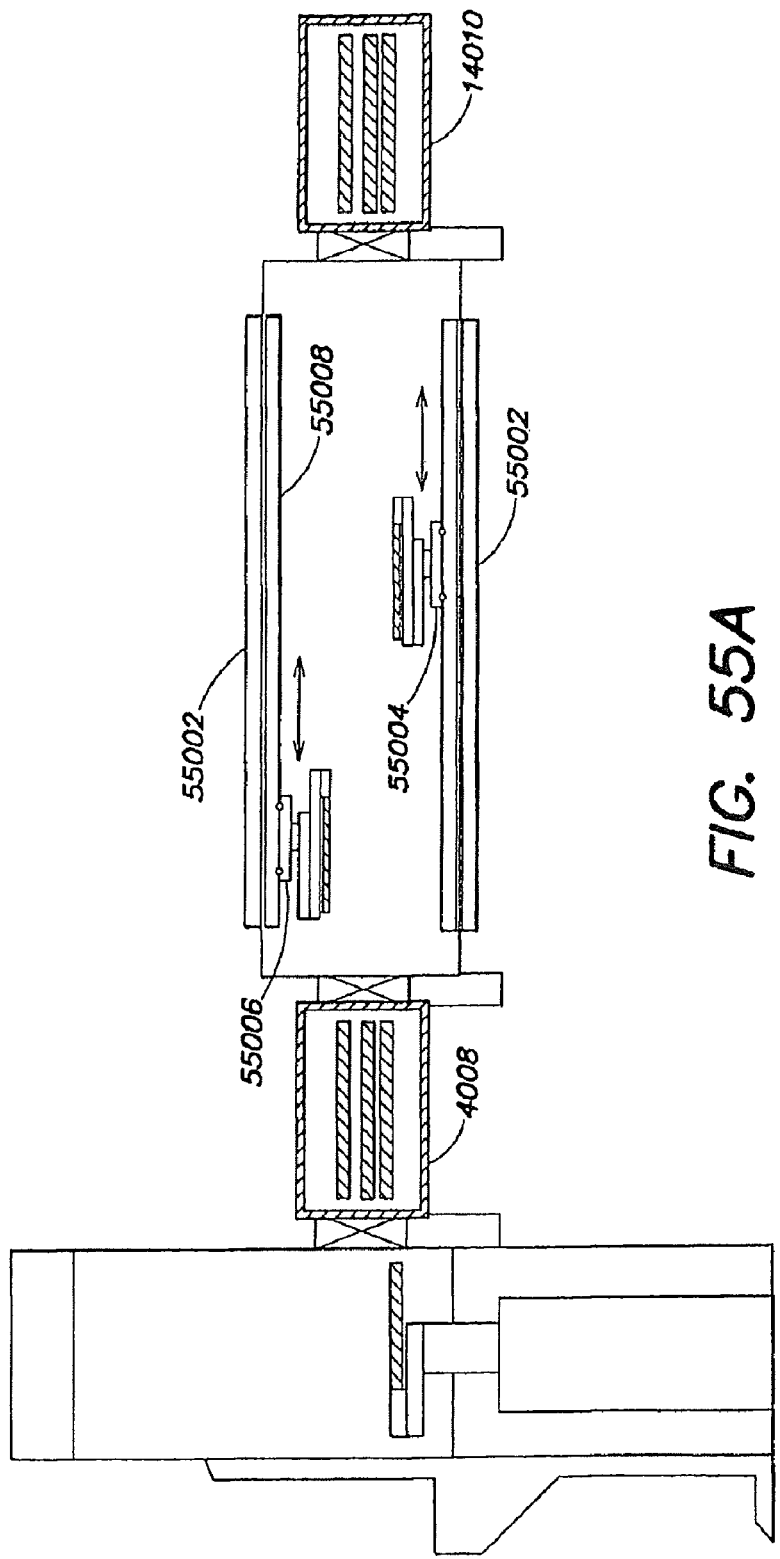
FIG. 55A illustrates a 4-Link SCARA arm mounted on a moveable cart, as well as a 4-Link SCARA arm mounted on an inverted moveable cart.

FIG. 55A illustrates a 4-Link SCARA arm as described in this disclosure mounted to a cart 55004. Such a cart may move in a linear fashion by a guide rail or magnetic levitation track 55008 and driven by a motor 55002 internal or external to the system. The 4-Link SCARA arm has the advantage that it fold into a smaller retract radius than a 3-Link SCARA arm, while achieving a larger extension into a peripheral module such as a process module all the while avoiding a collision with the opening that the arm has to reach through. An inverted cart 55006 could be used to pass substrates over the cart 55004.

Figure 55B:
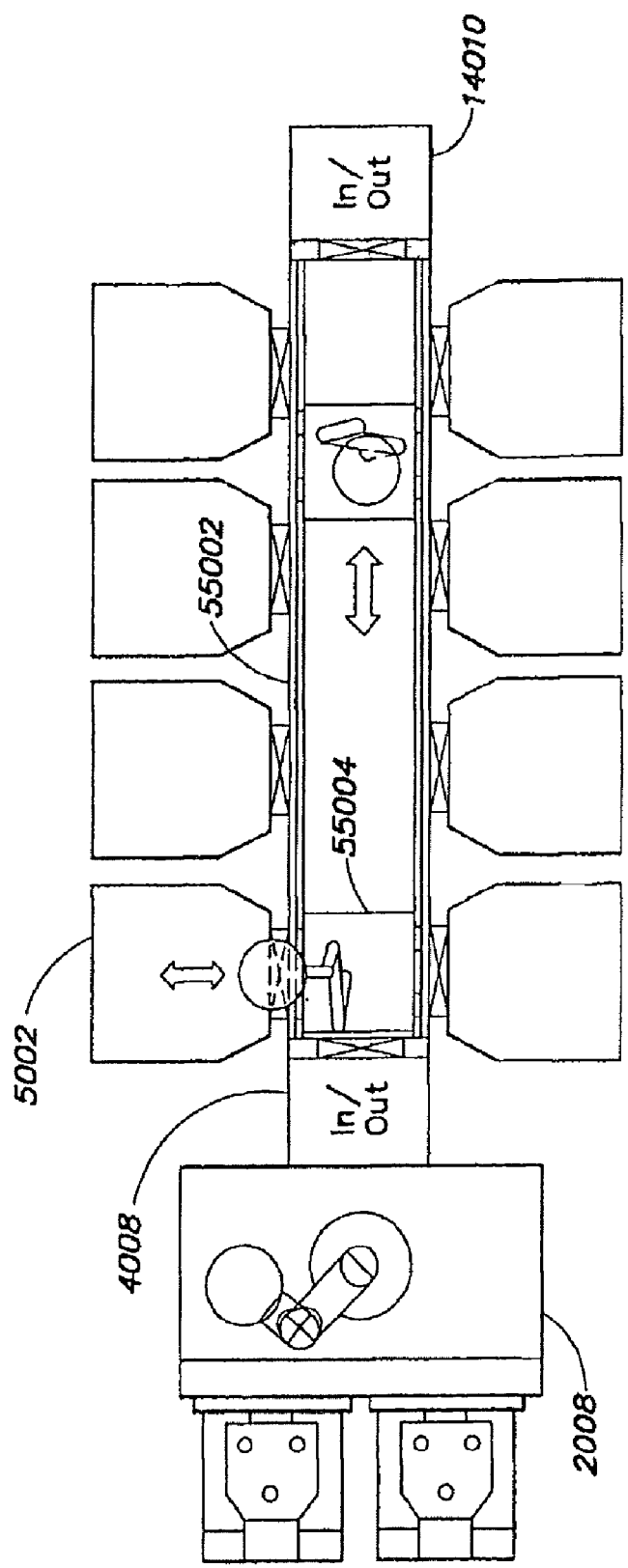
FIG. 55B illustrates a top view of FIG. 55A.

FIG. 55B shows a top view of the system described in FIG. 55A.

Figure 56:
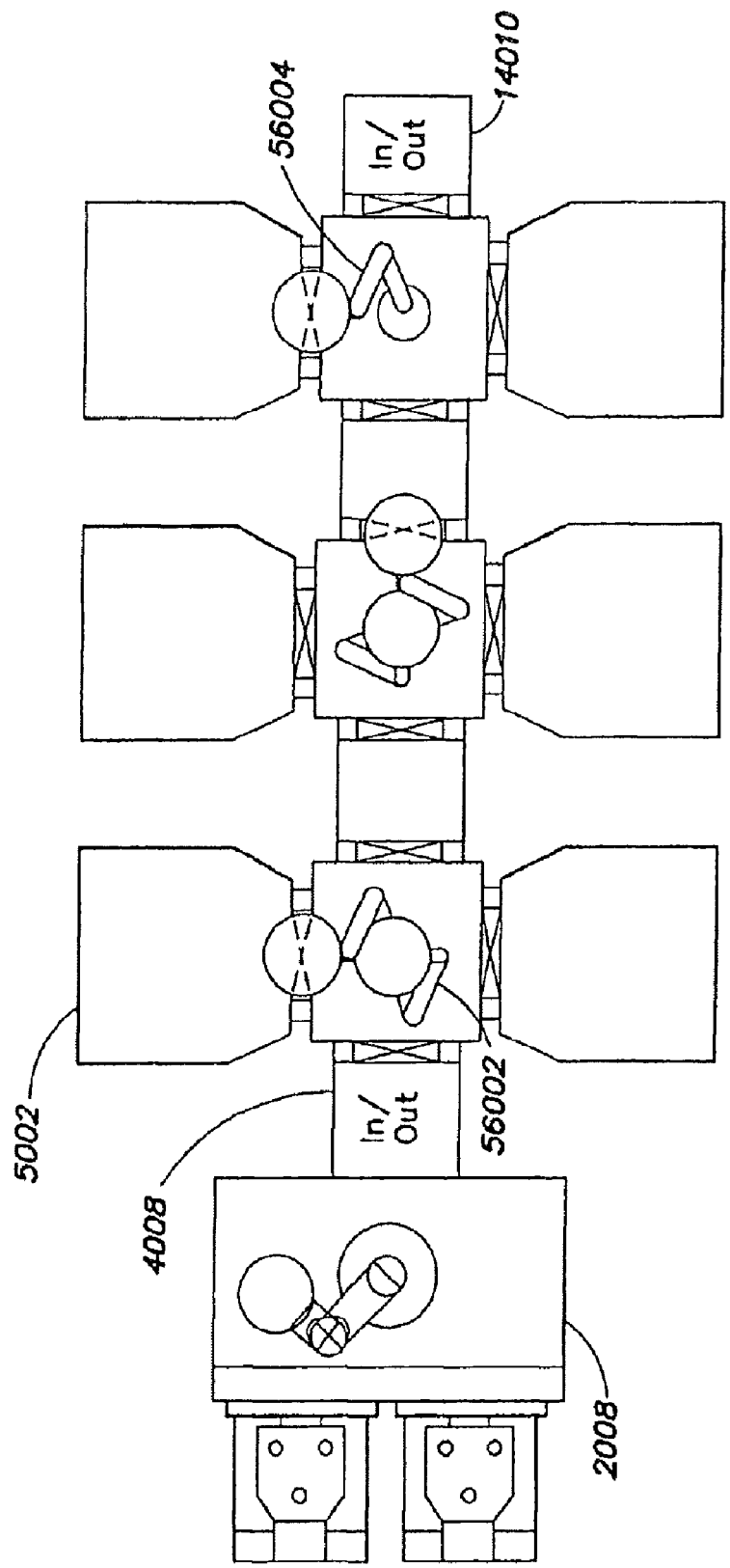
FIG. 56 illustrates using a 3-Link single or dual SCARA arm robotic system to pass wafers along a substantially a linear axis.

FIG. 56 illustrates a linear system described in this disclosure using a combination of dual independent and single SCARA robotic arms. Such a system may not be as compact as a system employing a 4-Link SCARA arm robotic system.

Figure 57:
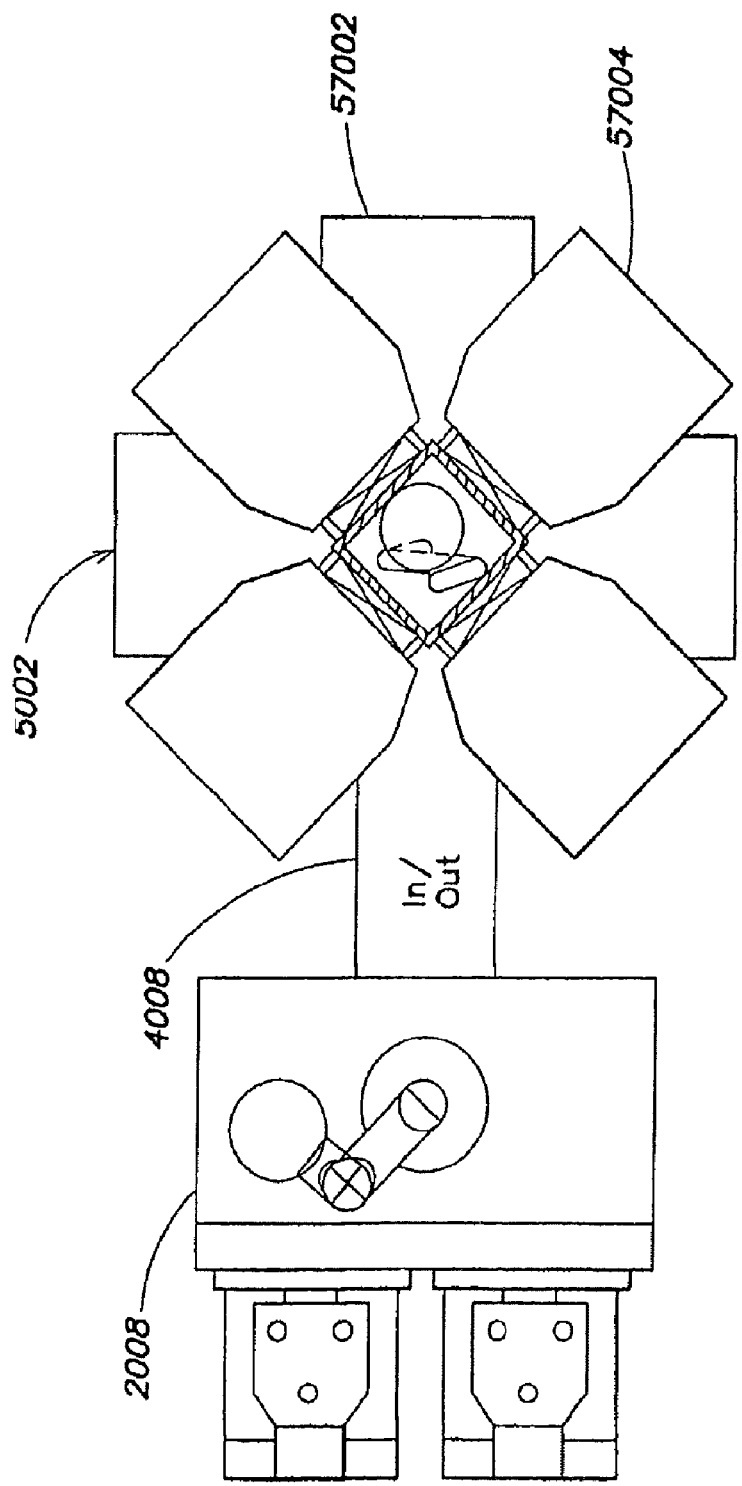
FIG. 57 illustrates a 2-level vacuum robotic system where the top and bottom process modules are accessible by means of a vertical axis in the robotic arms.

FIG. 57 demonstrates a vertically stacked handling system employing a 4-Link SCARA robotic arm, where the arm can reach any and all of the peripheral process modules 5002. By rotating the process modules in the top level 57004 by approximately 45 degrees and mounting the top level components to the bottom level chambers 57002, the top and bottom of each of the process modules may remain exposed for service access as well as for mounting components such as pumps, electrodes, gas lines and the like. The proposed layout may allow for the combination of seven process modules 5002 in a very compact space.

Figure 58A:
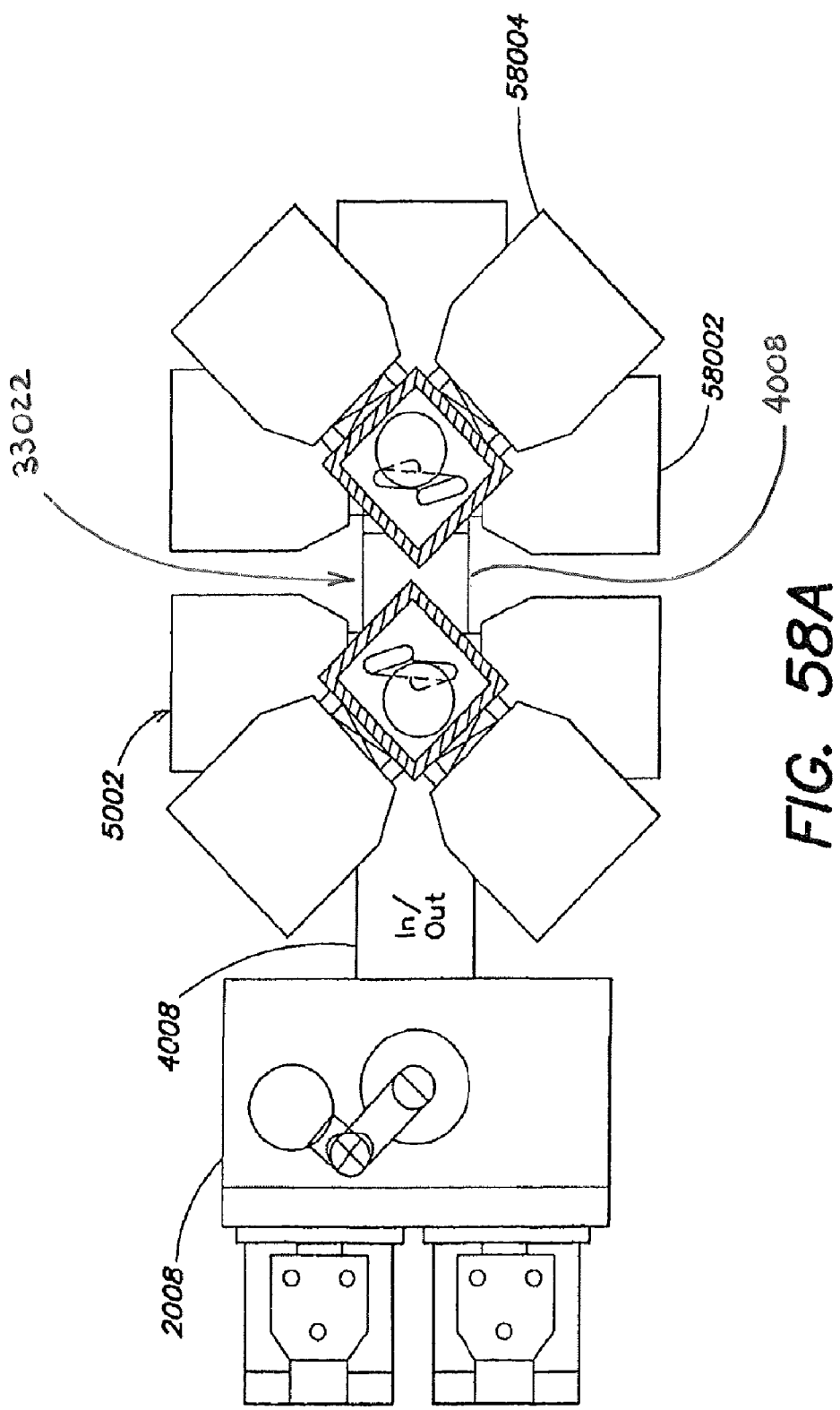
FIG. 58A shows a two level processing facility where substrates are passed along a substantially linear axis on one of the two levels.

FIG. 58A illustrates a variation of FIG. 57, where the bottom level 58002 of the system consists of a plurality of robotic systems as described in this disclosure and the top level system 58004 employs process modules 5002 oriented at a 45 degree angle to the main system axis. The proposed layout allows for the combination of nine process modules 5002 in a very compact space.

Figure 58B:
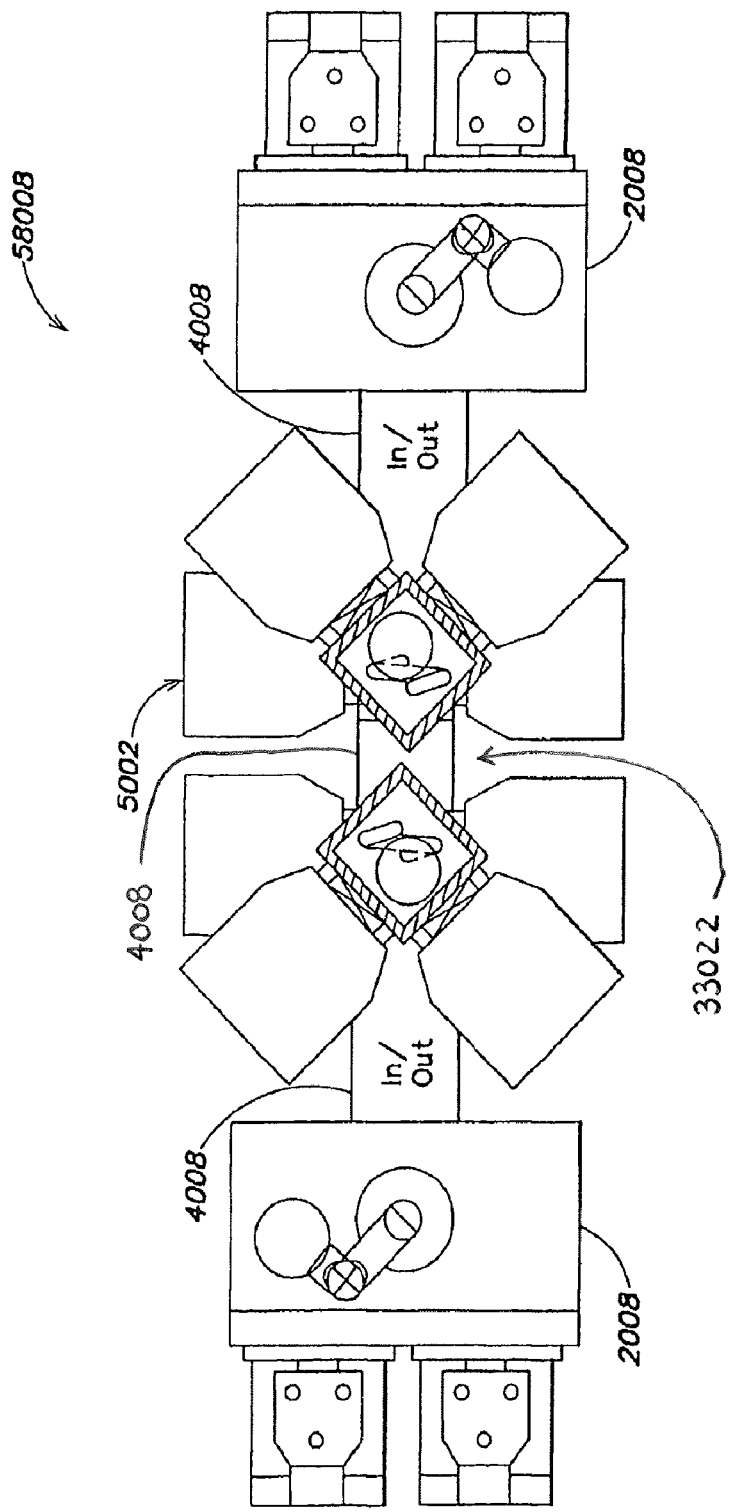
FIG. 58B illustrates a variation of FIG. 58a where substrates are removed from the rear of the system.

FIG. 58B illustrates a variation of FIG. 58A with the use of a rear-exit load lock facility to remove substrates such as semiconductor wafers from the system.

Figure 59A:
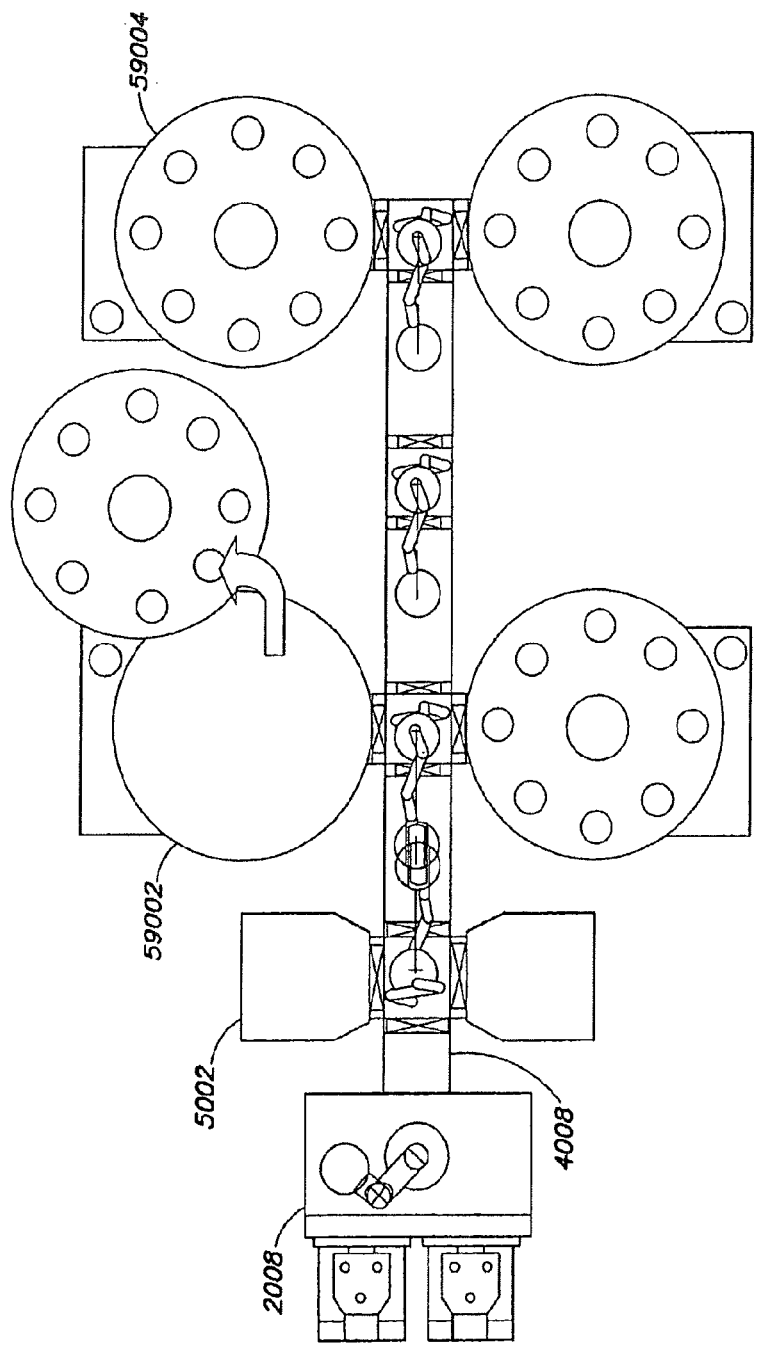
FIG. 59A shows a manufacturing facility which accommodates very large processing modules in a substantially linear axis. Service space is made available to allow for access to the interior of the process modules.

FIG. 59A shows a linear handling system accommodating large substrate processing modules 59004 while still allowing for service access 59002, and simultaneously still providing locations for two standard sized process module 5002.

Figure 59B:
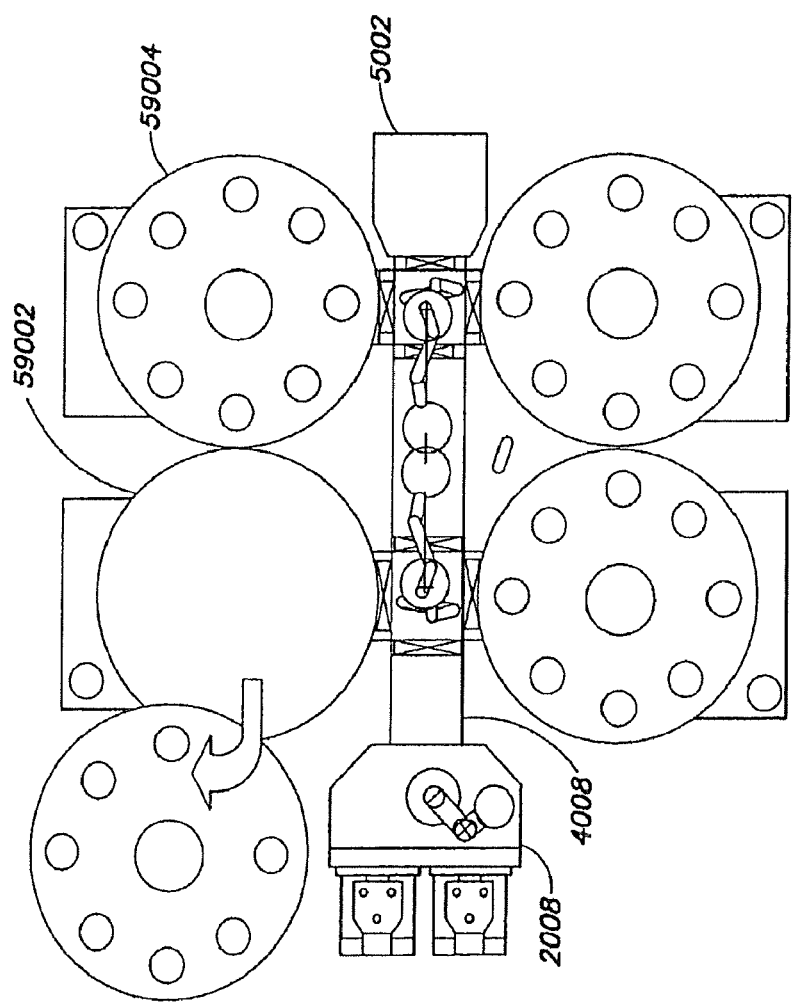
FIG. 59B illustrates a more compact layout for 4 large process modules and one small process module.

FIG. 59B demonstrates a system layout accommodating four large process modules 59004 and a standard sized process module 59002 while still allowing service access to the interior of process modules 59002.

FIG. 60 shows a dual frog robot with arms substantially on the same side of the robotic drive component. The lower arms 60002 support two sets of upper arms 60004 which are mechanically coupled to the motor set 54010.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

What is claimed is:

1. A semiconductor manufacturing system adapted to handle a wafer, the semiconductor manufacturing system comprising:
   a plurality of vertically stacked loading stations;
   a shared vacuum environment coupled to the loading stations;
   one or more vertically stacked mid-entry stations coupled to the shared vacuum environment; and
   a plurality of process modules arranged in a linear system and sharing the shared vacuum environment, wherein the shared vacuum environment has a loading end and an exit end at opposite ends of the linear system, the plurality of process modules being vertically stacked process modules that are arranged in a 2-level configuration having a top level and a bottom level, the top level rotated substantially 45-degrees relative to the bottom level.

2. The system of claim 1 wherein the system includes a SCARA arm robotic component for passing materials between the process modules.

3. The system of claim 1 wherein the system includes a four-link SCARA robotic arm.

4. The system of claim 2 wherein the robotic arm passes materials from arm to arm among the process modules.

5. The system of claim 2 wherein the robotic arm moves in the vertical direction to service at least one of vertically stacked process modules.

6. The system of claim 1 wherein the system includes dual, vertically opposed robotic arms.

7. The system of claim 6 wherein the arms are four-link SCARA arms.

8. The system of claim 1 wherein one of the plurality of vertically stacked loading stations feeds a manufacturing process that includes one or more of the plurality of vertically stacked processing modules.

9. The system of claim 8 further comprising a controller configured to effect loading a second one of the plurality of vertically stacked loading stations while the one of the plurality of vertically stacked loading stations feeds the manufacturing process.

10. The system of claim 1 further comprising a controller configured to coordinate loading of the plurality of vertically stacked loading modules to minimize wait time.

11. The system of claim 1 wherein the plurality of vertically stacked processing modules are arranged to reduce a footprint for the system.

12. The system of claim 1 wherein at least one robot can access any one of the vertically stacked load stations.

13. The system of claim 1 further comprising a plurality of vertically stacked exit stations.

14. The system of claim 1 wherein at least one robotic component can access more than one vertically stacked process module.

15. The system of claim 1 wherein at least one robotic component can access more than one horizontally adjacent processing module.

16. The system of claim 1 further comprising at least one holding station between two horizontally adjacent processing modules.

17. The system of claim 1 wherein at least one robotic component can access more than one vertically stacked mid-entry station.

18. The system of claim 1 wherein a workpiece can move through a plurality of different paths of adjacent processing modules.

* * * * *